(12) United States Patent
Onuki

(10) Patent No.: US 10,032,492 B2
(45) Date of Patent: Jul. 24, 2018

(54) SEMICONDUCTOR DEVICE, DRIVER IC, COMPUTER AND ELECTRONIC DEVICE

(71) Applicant: Semiconductor Energy Laboratory Co., Ltd., Atsugi-shi, Kanagawa-ken (JP)

(72) Inventor: Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/455,226

(22) Filed: Mar. 10, 2017

(65) Prior Publication Data

US 2017/0270977 A1  Sep. 21, 2017

(30) Foreign Application Priority Data

Mar. 18, 2016 (JP) ................................. 2016-055307
Mar. 25, 2016 (JP) ................................. 2016-062369

(51) Int. Cl.

| | | |
|---|---|---|
| *G11C 7/02* | (2006.01) | |
| *G11C 7/06* | (2006.01) | |
| *G11C 8/10* | (2006.01) | |
| *G11C 11/4097* | (2006.01) | |
| G11C 11/408 | (2006.01) | |
| G11C 11/4091 | (2006.01) | |

(52) U.S. Cl.
CPC .............. *G11C 7/065* (2013.01); *G11C 8/10* (2013.01); *G11C 11/4097* (2013.01); *G11C 11/4087* (2013.01); *G11C 11/4091* (2013.01)

(58) Field of Classification Search
CPC ....... G11C 7/1042; G11C 8/12; G11C 11/005; G11C 11/401; G11C 11/403; G11C 11/404; G11C 11/405; G11C 16/10; G11C 16/26; G11C 29/50016; G11C 7/065
USPC ............ 365/149, 203, 184, 189.011, 189.05, 365/189.07, 222
See application file for complete search history.

(56) References Cited

U.S. PATENT DOCUMENTS

| | | |
|---|---|---|
| 2012/0120715 A1 | 5/2012 | Saito |
| 2012/0127781 A1 | 5/2012 | Saito |
| 2012/0195104 A1 | 8/2012 | Takemura |
| 2012/0294061 A1 | 11/2012 | Nagatsuka et al. |
| 2012/0314482 A1 | 12/2012 | Takemura |
| 2012/0314524 A1 | 12/2012 | Takemura |
| 2013/0100748 A1 | 4/2013 | Takemura |

(Continued)

FOREIGN PATENT DOCUMENTS

JP  2011-151383 A  8/2011

*Primary Examiner* — Thong Q Le
(74) *Attorney, Agent, or Firm* — Fish & Richardson P.C.

(57) ABSTRACT

A semiconductor device that is novel, is capable of high-speed operation, consumes low power, or occupies a small area is provided. The semiconductor device includes a memory portion, a control circuit, and a plurality of wirings. The memory portion includes a plurality of memory circuits. The memory circuit includes a memory cell. The memory cell is electrically connected to a wiring. A first signal that indicates the amount of data that are written to or read from the memory portion is supplied to the control circuit. The control circuit has the function of controlling the number of the wirings to which a second signal for selecting the memory cell is simultaneously supplied on the basis of the first signal.

19 Claims, 31 Drawing Sheets

(56) References Cited

U.S. PATENT DOCUMENTS

| | | |
|---|---|---|
| 2013/0114330 A1 | 5/2013 | Takemura |
| 2013/0155790 A1 | 6/2013 | Atsumi |
| 2014/0334218 A1 | 11/2014 | Saito |
| 2015/0023090 A1 | 1/2015 | Saito |
| 2015/0060978 A1 | 3/2015 | Aoki |
| 2015/0063005 A1 | 3/2015 | Takemura |
| 2015/0078066 A1 | 3/2015 | Takemura |
| 2015/0124547 A1 | 5/2015 | Takemura |
| 2015/0294710 A1 | 10/2015 | Onuki |
| 2015/0294991 A1 | 10/2015 | Ishizu |
| 2015/0325282 A1 | 11/2015 | Kato et al. |
| 2016/0027782 A1 | 1/2016 | Saito |
| 2016/0173096 A1 | 6/2016 | Inoue et al. |
| 2016/0173097 A1 | 6/2016 | Inoue et al. |
| 2016/0178409 A1* | 6/2016 | Tsutsui .............. H02J 1/00 702/189 |
| 2016/0233866 A1 | 8/2016 | Ishizu et al. |
| 2016/0284711 A1 | 9/2016 | Takemura |
| 2016/0336059 A1 | 11/2016 | Matsuzaki |
| 2017/0040048 A1 | 2/2017 | Onuki |
| 2017/0213833 A1 | 7/2017 | Godo et al. |

\* cited by examiner

FIG. 23A
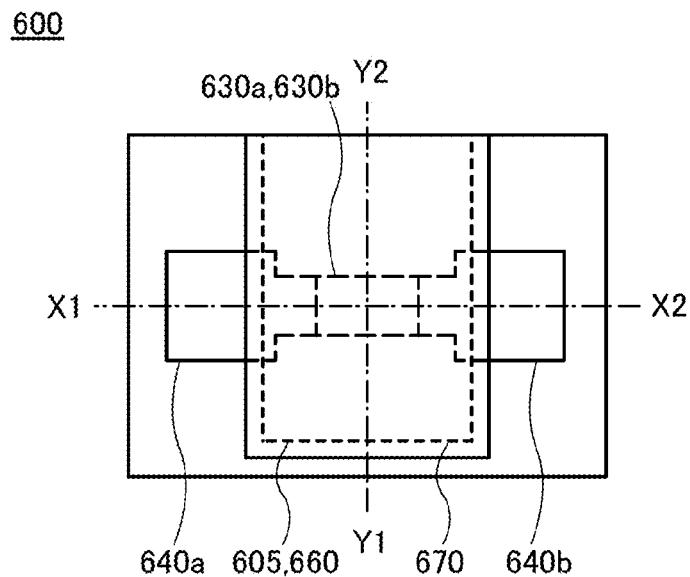
FIG. 23B
FIG. 23C
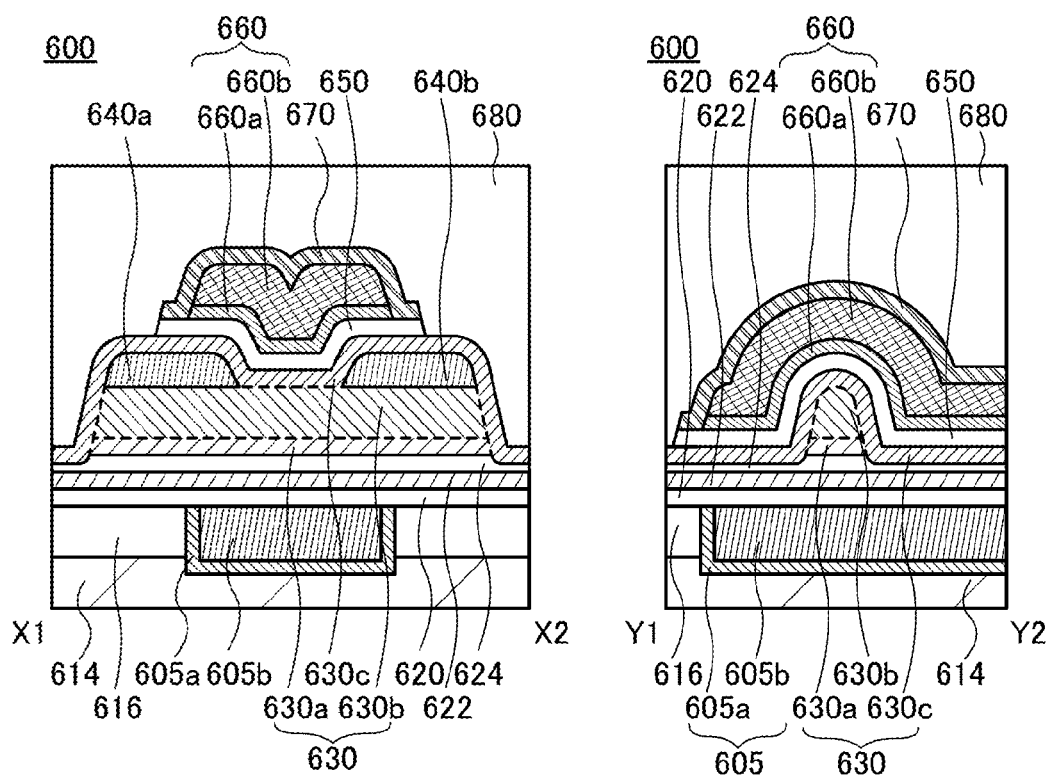

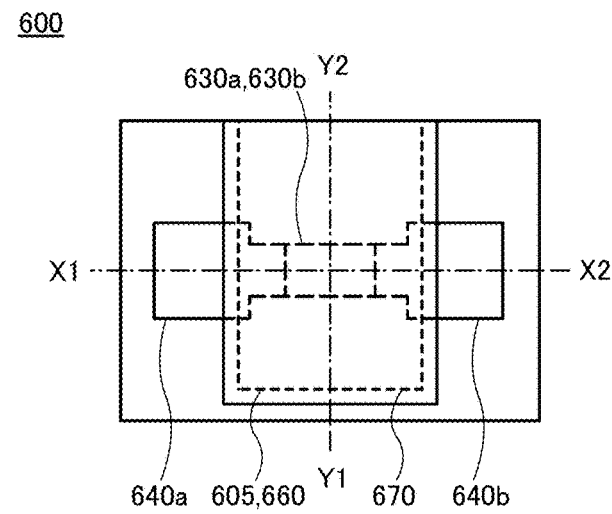
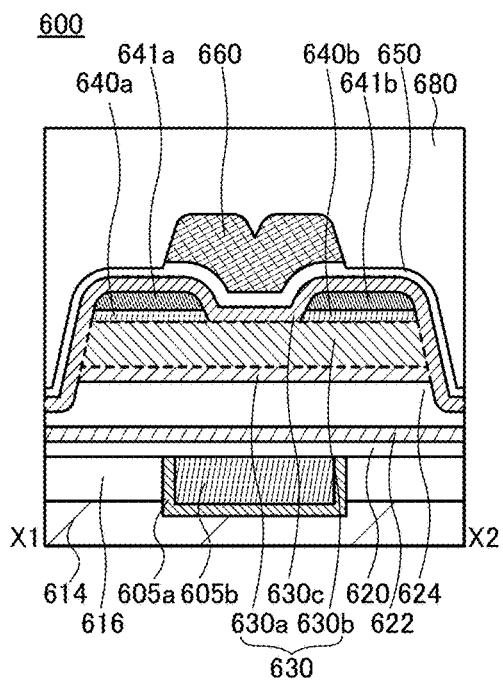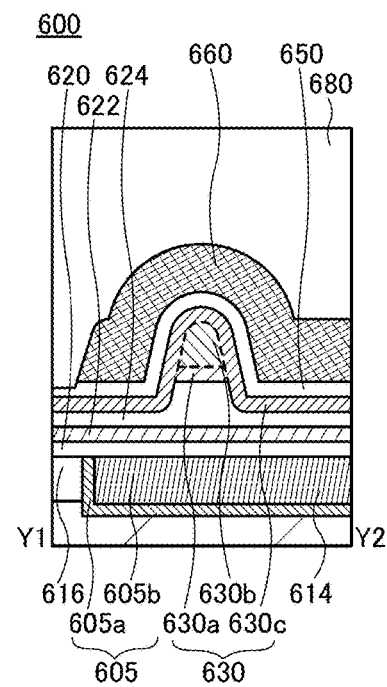

SEMICONDUCTOR DEVICE, DRIVER IC, COMPUTER AND ELECTRONIC DEVICE

BACKGROUND OF THE INVENTION

1. Field of the Invention

One embodiment of the present invention relates to a semiconductor device, a driver IC, a computer, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Furthermore, one embodiment of the present invention relates to a semiconductor device, a display device, a light-emitting device, a power storage device, a memory device, an imaging device, a method for driving them, or a method for manufacturing them.

2. Description of the Related Art

A dynamic random access memory (DRAM) stores data by supply of electric charge to a capacitor. The off-state current of a transistor for controlling the supply of electric charge to the capacitor is preferably small. This is because a small off-state current can ensure a long retention period, and the frequency of refresh operation can be reduced.

Patent Document 1 describes a use of a transistor having an oxide semiconductor with extremely low off-state current enabling a semiconductor device that can retain data for a long period.

REFERENCE

[Patent Document 1] Japanese Published Patent Application No. 2011-151383

SUMMARY OF THE INVENTION

An object of one embodiment of the present invention is to provide a novel semiconductor device or a novel memory device. Another object of one embodiment of the present invention is to provide a semiconductor device or a memory device that is capable of high-speed operation. Another object of one embodiment of the present invention is to provide a semiconductor device or a memory device with a low power consumption. Another object of one embodiment of the present invention is to provide a minute semiconductor device or a minute memory device.

One embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

The semiconductor device according to one embodiment of the present invention includes a memory portion, a control circuit, and a plurality of wirings. The memory portion includes a plurality of memory circuits. The memory circuit includes a memory cell. The memory cell is electrically connected to a wiring. A first signal that indicates the amount of data that are written to or read from the memory portion is supplied to the control circuit. The control circuit has a function of controlling the number of wirings to which a second signal for selecting the memory cell is simultaneously supplied, on the basis of the first signal.

The semiconductor device according to one embodiment of the present invention includes a memory portion, a control circuit, a plurality of first wirings, and a plurality of second wirings. The memory portion includes a plurality of memory circuits. The memory circuit includes a memory cell and an amplifier circuit. The memory cell is electrically connected to the first wiring. The amplifier circuit is electrically connected to the second wiring. A first signal that indicates the amount of data that are written to or read from the memory portion is supplied to the control circuit. The control circuit has a function of controlling the number of wirings to which a second signal for selecting the memory cell is simultaneously supplied, on the basis of the first signal. The control circuit has a function of controlling the number of the second wirings to which a third signal for driving the amplifier circuit is simultaneously supplied on the basis of the first signal.

In addition, the amplifier circuit of the semiconductor device of one embodiment of the present invention may have a function of temporarily retaining data that have been read from the memory cell.

In the semiconductor device according to one embodiment of the present invention, the memory cell includes a transistor, and the transistor includes an oxide semiconductor in the channel formation region, and the memory cell is stacked over the amplifier circuit.

In the semiconductor device according to one embodiment of the present invention, the control circuit is supplied with an address signal and the second signal is generated on the basis of the first signal and the address signal.

A driver IC of according to one embodiment of the present invention includes a frame memory including the semiconductor device described above, a controller, and a source driver.

A computer according to one embodiment of the present invention includes the semiconductor device described above, an input device, an output device, and a CPU.

In addition, an electronic device according to one embodiment of the present invention includes the semiconductor device or the computer described above, and at least one of a display portion, a microphone, a speaker, and a control key.

According to one embodiment of the present invention, a novel semiconductor device or a novel memory device can be provided. According to another embodiment of the present invention, a semiconductor device or a memory device that is capable of high-speed operation can be provided. According to another embodiment of the present invention, a semiconductor device or a memory device with a low power consumption can be provided. According to another embodiment of the present invention, a minute semiconductor device or a minute memory device can be provided.

The descriptions of these effects do not disturb the existence of other effects, and one embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 23A to 23C each illustrate a structure example of a transistor.

FIGS. 24A to 24C each illustrate a structure example of a transistor.

DETAILED DESCRIPTION OF THE INVENTION

Figure 1A:
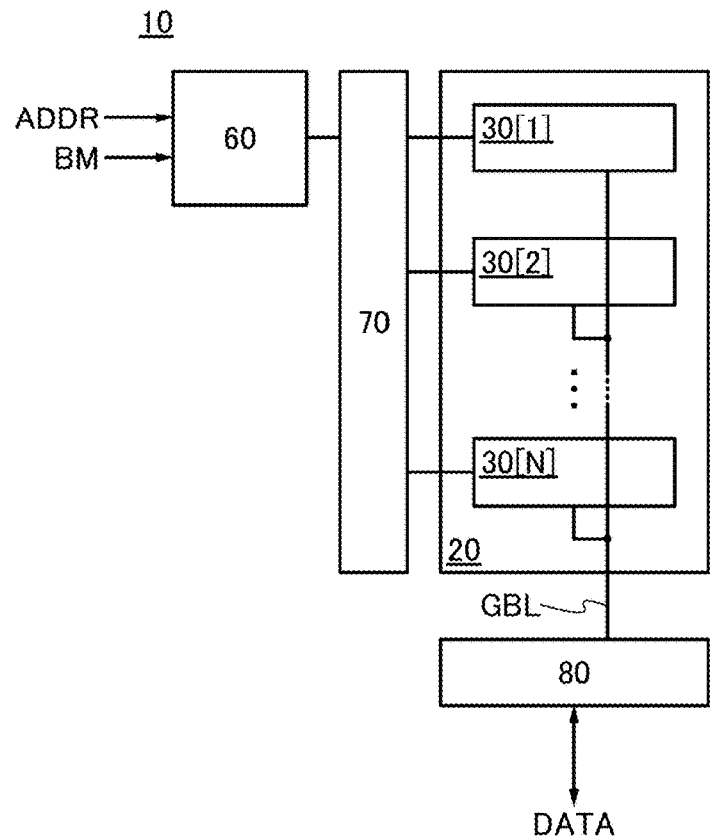
FIGS. 1A and 1B illustrate a configuration example of a semiconductor device.

Embodiments of the present invention are described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as a semiconductor device, a computer, an electronic device, a memory device, a display device, an imaging device, and a radio frequency (RF) tag. The display devices include, in its category, liquid crystal display devices, light-emitting devices having pixels each provided with a light-emitting element typified by an organic light-emitting element (OLED), electronic paper, digital micromirror devices (DMDs), plasma display panels (PDPs), field emission displays (FEDs), and the like.

In this specification and the like, when it is explicitly described that X and Y are connected, the case where X and Y are electrically connected, the case where X and Y are functionally connected, and the case where X and Y are directly connected are included therein. Accordingly, without limitation to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

In the description of modes of the invention with reference to the drawings, the same components in different diagrams are commonly denoted by the same reference numeral.

Even when independent components are electrically connected to each other in the drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

(Embodiment 1)

In this embodiment, a semiconductor device of one embodiment of the present invention is described.

<Configuration Example 1>

FIG. 1A illustrates a configuration example of a semiconductor device 10. The semiconductor device 10 includes a memory portion 20, a control circuit 60, a driver circuit 70, and a driver circuit 80.

The memory portion 20 has a function of storing data. Specifically, the memory portion 20 includes a plurality of memory circuits 30 each having a function of storing data. FIG. 1A illustrates a configuration example in which the memory portion 20 includes N (N is an integer larger than or equal to 2) memory circuits 30 (memory circuits 30[1] to 30[N]). The memory circuits 30[1] to 30[N] are connected to the driver circuit 80 through a wiring GBL. An inclusion of the memory circuit 30 into the semiconductor device 10 enables the semiconductor device 10 to be used as a memory device.

Figure 1B:
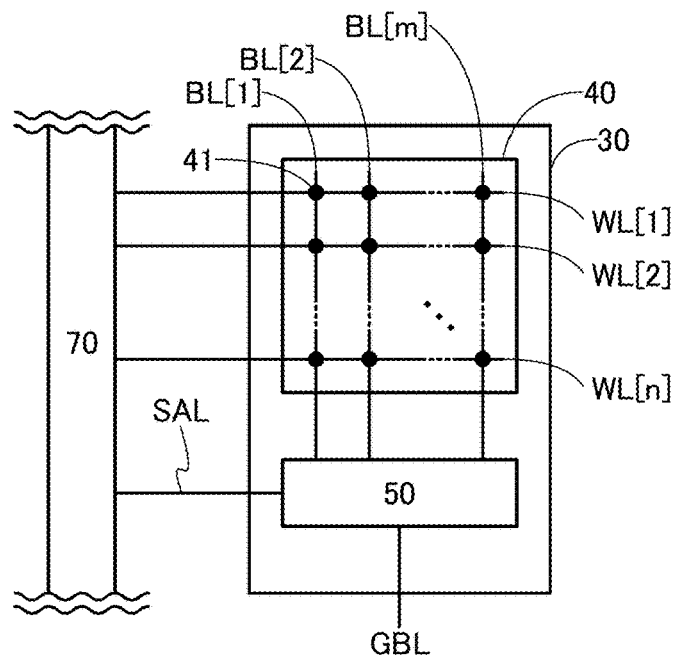

FIG. 1B illustrates a configuration example of the memory circuit 30. The memory circuit 30 includes a cell array 40 and an amplifier circuit 50. The cell array 40 is connected to n (n is an integer greater than or equal to 1) rows of wirings WL (wirings WL[1] to WL[n]) and m (m is an integer greater than or equal to 1) columns of wirings BL (wirings BL[1] to BL[m]). In addition, the cell array 40 includes memory cells 41 arranged in n rows and m columns that are connected to the wirings WL and BL. The memory cells 41 are illustrated as black circular dots in FIG. 1B.

The wiring WL has a function of delivering a signal (henceforth referred to as a selection signal) for selecting a memory cell 41 on a specific row. The wiring BL has a function of delivering a potential that corresponds to data to be written to the memory cell 41 (henceforth referred to as a write potential) or a potential that corresponds to data stored in the memory cell 41 (henceforth referred to as a read potential). The wiring WL is connected to the driver circuit 70, and the wiring BL is connected to the amplifier circuit 50.

The amplifier circuit 50 has a function of amplifying a signal input thereto and outputting the amplified signal. Specifically, the amplifier circuit 50 has a function of amplifying a potential of the wiring GBL, and supplying the amplified potential to the wiring BL as the write potential. In addition, the amplifier circuit 50 has a function of amplifying the read potential that is supplied to the wiring BL and supplying the amplified potential to the wiring GBL. Owing to these functions of the amplifier circuit 50, accurate reading and writing of data are performed. Note that the amplifier circuit 50 may have a function of temporarily retaining data input from the driver circuit 80 and data read from the memory cell 41.

The amplifier circuit 50 is connected to the driver circuit 70 through a wiring SAL. Signals supplied from the driver circuit 70 to the wiring SAL control the operation of the amplifier circuit 50. Note that the wiring SAL may be made up of a single wiring or a plurality of wirings.

The control circuit 60 has a function of selecting the memory circuit 30 to and from which data are written and read. Specifically, the control circuit 60 has a function of selecting the memory cell 41 to and from which data are written and read, in accordance with a signal ADDR that corresponds to an address signal.

In addition, in one embodiment of the present invention, a signal BM is input to the control circuit 60. The signal BM is a signal that indicates the amount of data to be written to or read from the memory portion 20. Here, the "amount of data" corresponds to, for example, the number of bits in data. When the signal BM is input to the control circuit 60, the control circuit 60 determines the number of the memory circuits 30 that are to be selected, in accordance with the signal BM, and outputs a predetermined signal to the driver circuit 70. Then, the driver circuit 70 selects the memory circuits 30, the number of which is determined in accordance with the amount of data. In this manner, the semiconductor device 10 can control the number of the memory circuits 30 that are simultaneously driven, in accordance with the amount of data that are written or read.

Figure 2A:
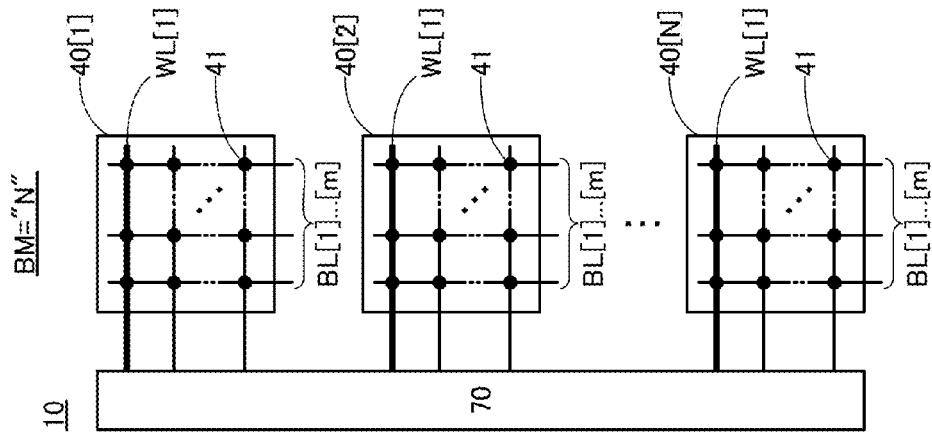
FIGS. 2A to 2C each illustrates an operation example of a semiconductor device.
Figure 2B:
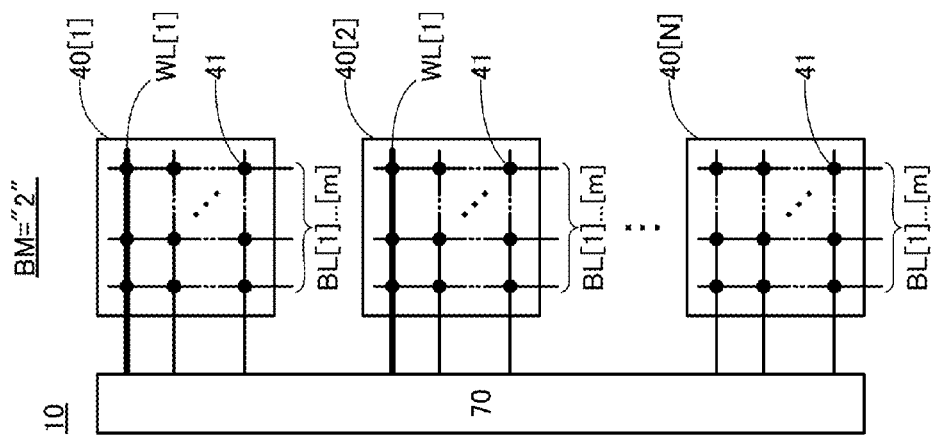
Figure 2C:
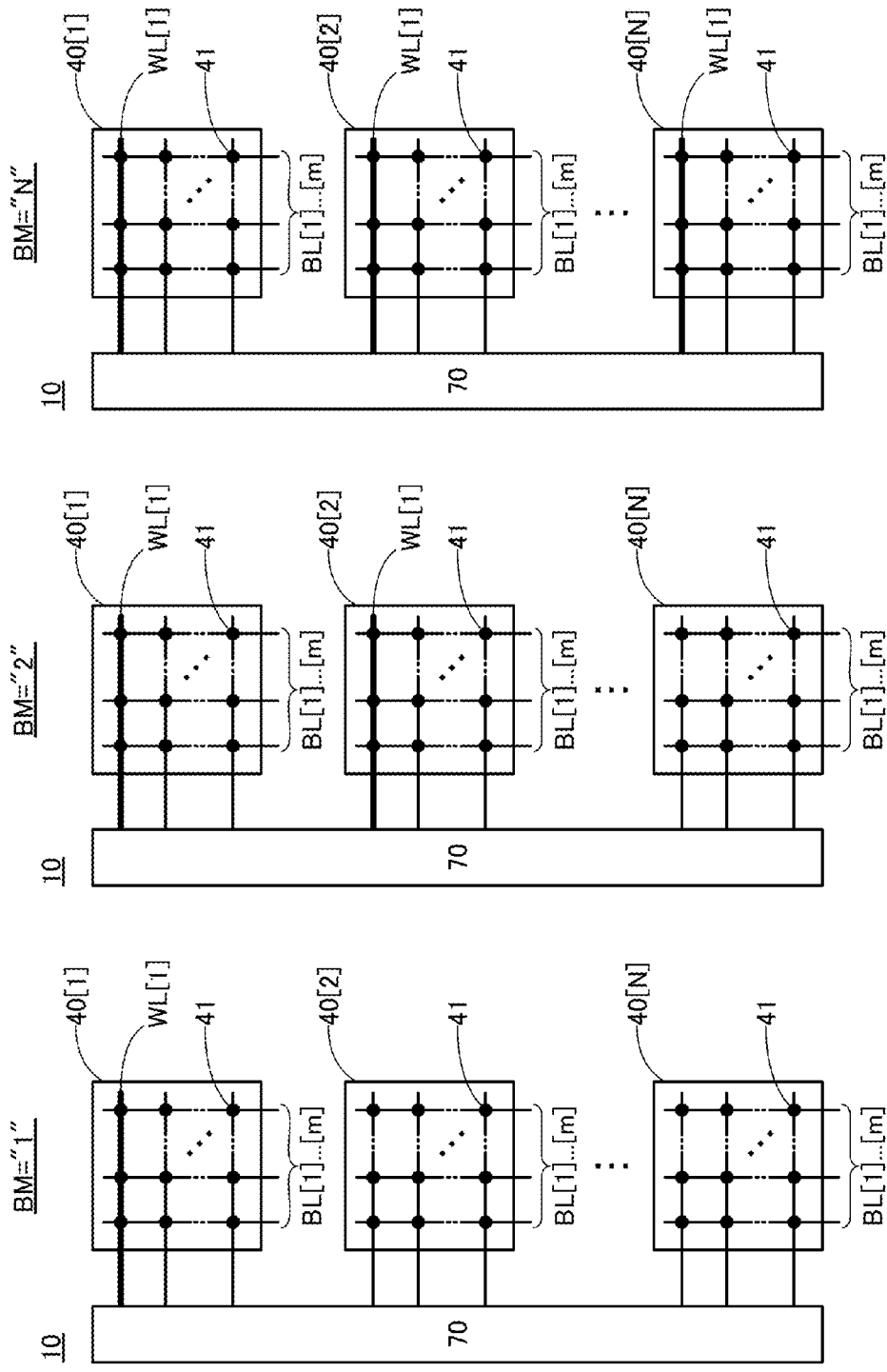

FIGS. 2A to 2C each illustrate a specific example of an embodiment in which the number of the memory circuits 30 that are simultaneously driven is controlled depending on the amount of data. FIGS. 2A to 2C each illustrates a plurality of the cell arrays 40 (cell arrays [1] to [N]) and a driver circuit 70. Note that the cell array 40 that is included in a memory circuit 30[k] (k is an integer greater than or equal to 1 and less than or equal to N) is designated as a cell array 40[k]. Additionally, m memory cells 41 are assumed to be connected to one wiring WL in this example. Note that the bold lines in the figures denote the wirings WL that is supplied with a selection signal.

First, an operation in which data of m bits are written or read is illustrated in FIG. 2A. When the data of m bits are written or read, "1" is input to the control circuit 60 (not illustrated) as the signal BM, and the control circuit 60 outputs a control signal, corresponding to the signal BM="1", to the driver circuit 70.

The driver circuit 70, in accordance with the control signal that is input from the control circuit 60, supplies the selection signal to a wiring WL of a specific row (the wiring WL[1] in this example) selected from the wirings WL that are connected to a specific cell array 40 (the cell array 40[1] in this example). In this manner, when "1" is input as the signal BM, one wiring WL is selected in the semiconductor device 10. Then, the data of m bits are written or read using m memory cells 41 that are connected to the selected wiring WL[1].

Next, an operation in which data of m×2 bits are written or read is illustrated in FIG. 2B. When the data of m×2 bits are written or read, "2" is input to the control circuit 60 as the signal BM, and the control circuit 60 outputs a control signal, corresponding to the signal BM="2", to the driver circuit 70.

The driver circuit 70, in accordance with the control signal that is input from the control circuit 60, simultaneously supplies the selection signal to wirings WL in specific rows (two wirings WL[1] in this example) from the wirings WL that are connected to two specific cell arrays 40 (the cell arrays 40[1] and 40[2] in this example). In this manner, when "2" is input as the signal BM, two wirings WL are selected simultaneously in the semiconductor device 10. Then, the data of m×2 bits are written or read using m×2 memory cells 41 that are connected to the two selected wirings WL[1].

Next, an operation in which data of m×N bits are written or read is illustrated in FIG. 2C. When the data of m×N bits are written or read, "N" is input to the control circuit 60 as the signal BM, and the control circuit 60 outputs a control signal, corresponding to the signal BM="N" to the driver circuit 70.

The driver circuit 70, in accordance with the control signal that is input from the control circuit 60, simultaneously supplies the selection signal to wirings WL in specific rows (N wirings WL[1] in this example) from the wirings WL that are connected to the cell arrays 40[1] to 40[N]. In this case, when "N" is input as the signal BM, N wirings WL are selected simultaneously in the semiconductor device 10. Then, the data of m×N bits are written or read using m×N memory cells 41 that are connected to the N selected wirings WL[1].

As described above, one embodiment of the present invention can control the number of the wirings WL that are simultaneously selected, in accordance with the amount of data that are written or read. This enables an improvement of data read/write speeds, and a provision of a semiconductor device that is capable of high-speed operation. Note that FIGS. 2A to 2C illustrate cases where the number of simultaneously-selected wirings WL is 1, 2, and N; however, the number of the wirings WL that are simultaneously selected in accordance with the signal BM is not limited thereto, and can be any given number.

The driver circuit 70 has a function of selecting the memory circuit 30. Specifically, the driver circuit 70 has a function of supplying the selection signal to the wiring WL in accordance with the signal input from the control circuit 60 and a function of supplying a signal to the wiring SAL to drive a specific amplifier circuit 50.

The driver circuit 80 has a function of controlling the writing of data to, and the reading of data from, the memory circuit 30. Specifically, the driver circuit 80 has a function of supplying a potential that corresponds to data to be written to the memory circuit 30 to the wiring GBL and a function of outputting to the outside a potential that corresponds to data stored in the memory circuit 30.

Note that the number of the wirings GBL can be any given number greater than or equal to 1 and less than or equal to m (the number of wirings BL). When the number of the wirings GBL is smaller than that of the wirings BL, the amplifier circuit 50 selects the wiring BL that supplies a potential to the wiring GBL through the amplifier circuit 50, or the wiring BL that is supplied with a potential from the wiring GBL through the amplifier circuit 50. Specific examples of the configuration and operation of the amplifier circuit 50 is described in detail in Embodiment 2.

<Configuration Example 2>

Next, a more specific configuration example of the semiconductor device 10 is described.

Figure 3:
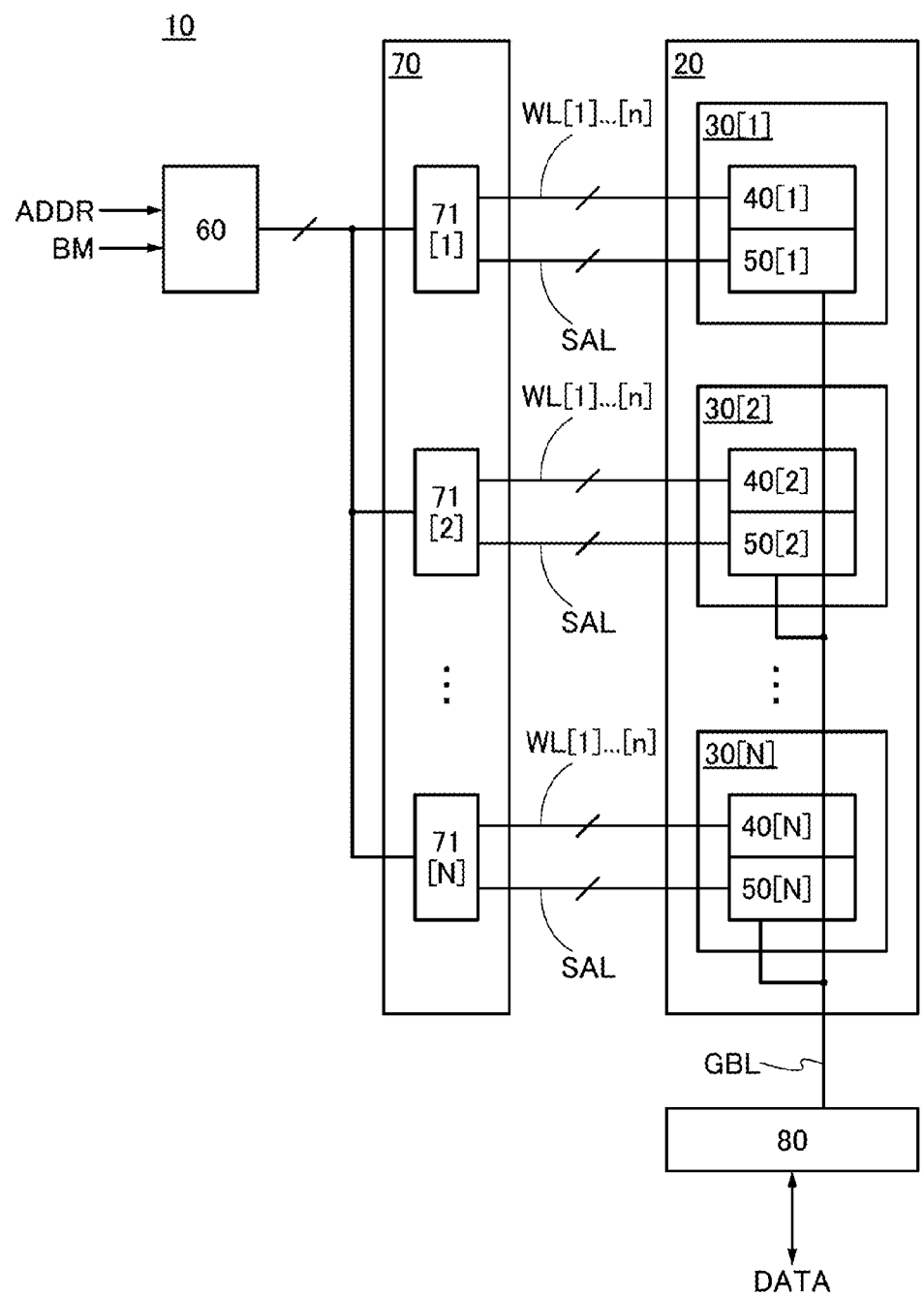
FIG. 3 illustrates a configuration example of a semiconductor device.

FIG. 3 illustrates a configuration example of the semiconductor device 10. In FIG. 3, the driver circuit 70 includes a plurality of selection circuits 71 (selection circuits 71[1] to 71[N]). In addition, each of the memory circuits 30[1] to 30[N] includes the cell array 40 and the amplifier circuit 50.

Note that the amplifier circuit 50 included in the memory circuit 30[k] is designated as an amplifier circuit 50[k].

The signals ADDR and BM are input to the control circuit 60. The control circuit 60 has a function of generating a signal for selecting the wiring WL and a signal for driving the amplifier circuit 50 in accordance with the signals ADDR and BM, and outputting the signals to the selection circuits 71[1] to 71 [N].

The selection circuits 71[1] to 71[N] are connected to the wirings WL[1] to WL[N], respectively, and the wirings SAL. The selection circuit 71 has a function of selecting the wiring WL and driving the amplifier circuit 50. Specifically, the selection circuit 71 has a function of supplying predetermined potentials to the wirings WL[1] to WL[N] and the wirings SAL, in accordance with the signal input from the control circuit 60.

Figure 4:
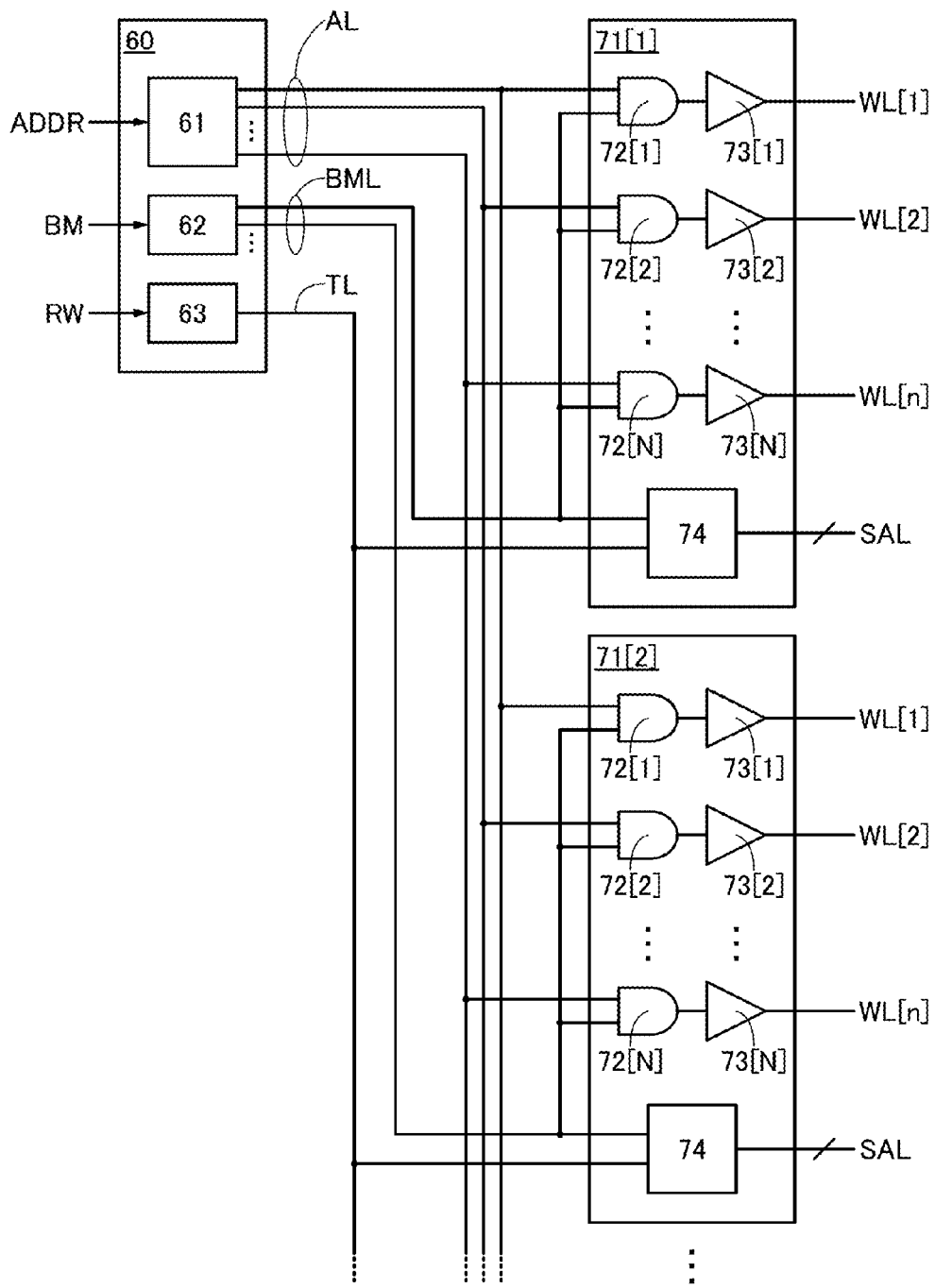
FIG. 4 illustrates a configuration example of a semiconductor device.

FIG. 4 illustrates a specific configuration example of the control circuit 60 and the selection circuit 71. The control circuit 60 includes a decoder 61, a decoder 62, and a controller 63. The selection circuit 71 includes a plurality of ANDs 72 (ANDs 72[1] to 72[N]), a plurality of buffers 73 (buffers 73[1] to 73[N]), and a selection circuit 74.

The decoder 61 has a function of generating a signal for selecting a specific wiring WL, in accordance with the signal ADDR. Specifically, the decoder 61 has a function of controlling potentials that are supplied to the wirings WL[1] to WL[N], by supplying a predetermined potential to a plurality of wirings AL in accordance with the signal ADDR. For example, when the wiring WL[1] is selected, the decoder 61 supplies a high-level potential to the wiring AL that is connected to the AND 72[1], and a low-level potential to the other wirings AL.

The decoder 62 has a function of generating a signal for selecting a specific memory circuit 30, in accordance with the signal BM. Specifically, the decoder 62 has a function of controlling potentials that are supplied to the wirings WL[1] to WL[N] and the wirings SAL, by supplying a predetermined potential to a plurality of wirings BML, in accordance with the signal BM. For example, when the memory circuit 30[1] is selected, the decoder 62 supplies a high-level potential to the selection circuit 71[1] and a selected wiring BML, and a low-level potential to the other wirings BML.

A signal RW, which is a signal that indicates whether data are written or read, is input to the controller 63. The controller 63 has a function of controlling the operation of the amplifier circuit 50, which is connected to the wiring SAL, in accordance with the signal RW. Specifically, the controller 63 has a function of determining, in accordance with the signal RW, whether data are to be written or read, and supplying a wiring TL with a signal for the amplifier circuit 50 to perform a read operation or a signal for the amplifier circuit 50 to perform a write operation depending on the determination result.

The selection circuit 71 has a function of supplying predetermined potentials to the wirings WL[1] to WL[N] and the wiring SAL, in accordance with the signals input from the wiring AL, the wiring BML, and the wiring TL. A first input terminal of the AND 72 is connected to the wiring AL, a second input terminal of the AND 72 is connected to the wiring BML, and an output terminal of the AND 72 is connected to an input terminal of the buffer 73. An output terminal of the buffer 73 is connected to the wiring WL. A first input terminal of the selection circuit 74 is connected to the wiring BML, a second input terminal of the selection circuit 74 is connected to the wiring TL, and an output terminal of the selection circuit 74 is connected to the wiring SAL. The buffer 73 can be formed by, for example, connecting a plurality of inverters in series. In addition, the buffer 73 can be omitted in some cases.

When both of the wirings AL and BML that are connected to the AND 72 are selected (meaning that the potential across them becomes high), a high-level potential is output from the AND 72 to the wiring WL through the buffer 73. In the manner above, the wiring WL is supplied with the selection signal.

In addition, when the wiring BML that is connected to the selection circuit 74 is selected, the signal that is input from the controller 63 to the selection circuit 74 through the wiring TL is output to the amplifier circuit 50 through the wiring SAL. In this manner, the amplifier circuit 50 can read and write data.

As described above, the use of the control circuit 60 and the driver circuit 70 enables the selection of the wiring WL and the driving of the amplifier circuit 50, in accordance with the signals ADDR and BM. Here, specific operation examples in the cases where the signal BM="1", "2", and "N" are described below. Note that here, a case where the wiring WL[1] is selected with the signal ADDR is described as an example.

[Signal BM="1"]

When the signal ADDR is decoded in the decoder 61, the potential of the wiring AL that is connected to a first input terminal of the AND 72[1] becomes high, and the potentials of the other wirings AL become low. In addition, when the signal BM="1" is decoded in the decoder 62, the potential of the wiring BML that is connected to the selection circuit 71[1] becomes high, and the potentials of the other wirings BML become low.

Here, a high-level potential is supplied to both the first and second input terminals of the AND 72[1], which is included in the selection circuit 71[1]. Thus, a high-level potential is supplied to the wiring WL[1] that is connected to the selection circuit 71[1], and the potential of the other wirings WL becomes low. In addition, a high-level potential is supplied to the first input terminal of the selection circuit 74 that is included in the selection circuit 71[1]. This allows a signal for operating the amplifier circuit 50 (in read operation or write operation) to be supplied to the wiring SAL that is connected to the selection circuit 71[1], to drive the amplifier circuit 50[1]. Meanwhile, the other amplifier circuits 50 are not driven.

In this manner, when the signal BM="1", one wiring WL is selected in the semiconductor device 10, and one amplifier circuit 50 is driven. Then, the data of m bits are read or written using m memory cells 41 that are connected to the wiring WL that is selected.

[Signal BM="2"]

When the signal ADDR is decoded in the decoder 61, the potential of the wiring AL that is connected to a first input terminal of the AND 72[1] becomes high, and the potentials of the other wirings AL become low. In addition, when the signal BM="2" is decoded in the decoder 62, the potential of the wirings BML that are connected to the selection circuits 71[1] and 71[2] becomes high, and the potential of the other wirings BML becomes low.

At this time, a high-level potential is supplied to both first and second input terminals of the ANDs 72[1] included in the selection circuits 71[1] and 71[2]. Thus, a high-level potential is simultaneously supplied to the wiring WL[1] that is connected to the selection circuit 71[1] and the wiring WL[1] that is connected to the selection circuit 71[2], and the potential of the other wirings WL becomes low. In addition, a high-level potential is supplied to the first input terminal of each of the selection circuits 74 that is included in the selection circuits 71[1] and 71[2]. This allows the signal for operating the amplifier circuit 50 to be supplied simultaneously to the wiring SAL that is connected to the selection circuit 71[1] and to the wiring SAL that is connected to the selection circuit 71[2], to drive the amplifier circuits 50[1] and 50[2]. Meanwhile, the other amplifier circuits 50 are not driven.

In this manner, when the signal BM="2", two wirings WL are simultaneously selected in the semiconductor device 10, and two amplifier circuits 50 are driven simultaneously. Then, the data of m×2 bits are written or read using the m×2 memory cells 41 that are connected to the two selected wirings WL.

[Signal BM="N"]

When the signal ADDR is decoded in the decoder 61, the potential of the wiring AL that is connected to a first input terminal of the AND 72[1] becomes high, and the potentials of the other wirings AL become low. In addition, when the signal BM="N" is decoded in the decoder 62, the potential of all the wirings BML becomes high.

Here, a high-level potential is supplied to both first and second input terminals of all the ANDs 72[1]. Thus, a high-level potential is simultaneously supplied to all the wirings WL[1], and the potential of the other wirings WL becomes low. In addition, a high-level potential is supplied to the first input terminal of all the selection circuits 74. This allows the signal for operating the amplifier circuit 50 to be supplied simultaneously to all the wirings SAL, to drive the amplifier circuits 50[1] to 50[N].

In this manner, when the signal BM="N", N wirings WL are simultaneously selected in the semiconductor device 10, and N amplifier circuits 50 are driven simultaneously. Then, the data of m×N bits are written or read using m×N memory cells 41 that are connected to the N selected wirings WL[1].

As described above, the number of the wirings WL that are simultaneously selected and the number of the amplifier circuits 50 that are simultaneously operated can be controlled in accordance with the signal BM. Note that the supply of power to an unselected amplifier circuit 50 can be stopped, whereby the power consumption of the memory circuit 30 can be reduced.

<Operation Example>

Figure 5A:
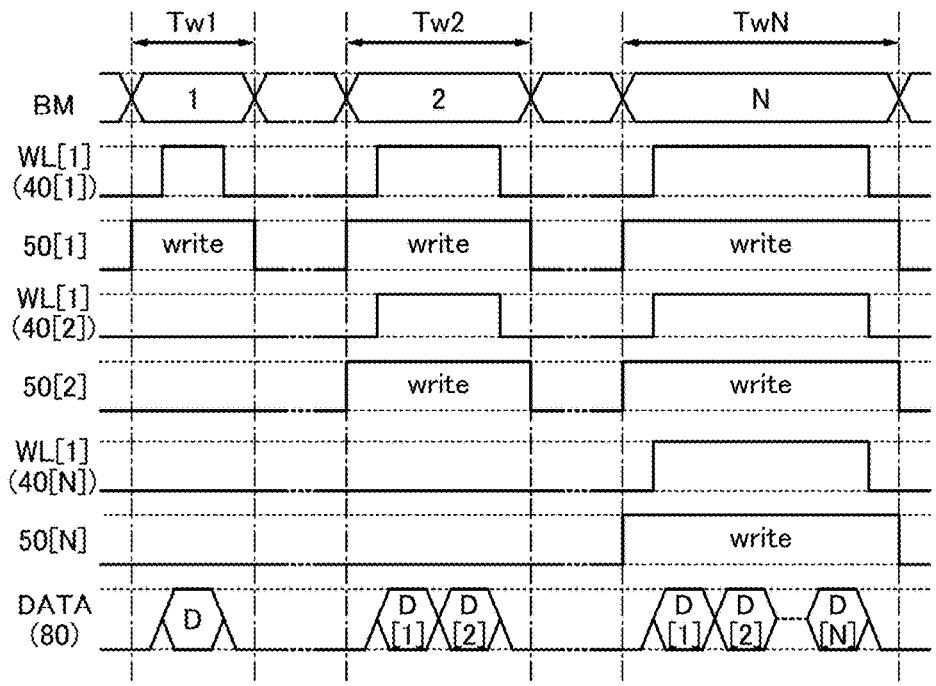
FIGS. 5A and 5B are a timing chart.
Figure 5B:
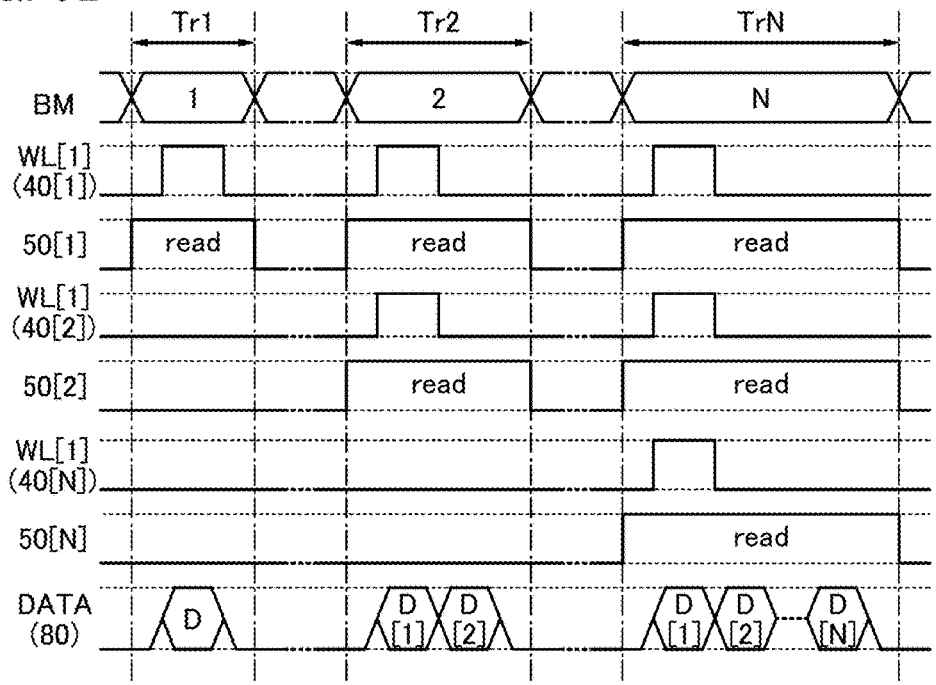

Next, a specific operation example of the semiconductor device 10 illustrated in FIGS. 1A and 1B, FIGS. 2A to 2C, FIG. 3, and FIG. 4 is described. FIGS. 5A and 5B are timing charts that illustrate the operation examples of the semiconductor device 10.

[Write Operation]

FIG. 5A illustrates an example of a write operation of the semiconductor device 10. Periods Tw1, Tw2, and TwN in FIG. 5A denote write periods in which the signal BM is "1", "2", and "N", respectively. In addition, "DATA" denotes data that are supplied from the driver circuit 80 to the memory cell 41 through the wiring GBL and the amplifier circuit 50. "DATA" corresponds to write data. Note that in the write period, a signal RW that indicates the write operation is supplied to the controller 63 (see FIG. 4).

First, during the period Tw1, the memory circuit 30[1] is selected in accordance with the signal BM="1". This puts the amplifier circuit 50[1] in a write-operation mode, and the other amplifier circuits 50 are not driven. In addition, the wiring WL[1] is selected in accordance with the signal ADDR. Thus, the potential of the wiring WL[1] that is connected to the cell array 40[1] becomes high, and the potential of the other wirings WL becomes low.

Then, data D of m bits are written to the memory portion 20. Specifically, the data D of m bits are input from the driver circuit 80 to the amplifier circuit 50 where they are amplified; the amplified data are supplied to m memory cells 41 that are connected to the wiring WL[1], during a period in which the potential of the wiring WL[1] that is connected to the cell array 40[1] is at a high level. Thus, the data D of m bits are written to the cell array 40[1]. Then, the potential of the wiring WL[1] becomes low, and the data D are retained in the cell array 40[1]. Through these operations, the data of m bits are written to the memory portion 20.

Next, during the period Tw2, the memory circuits 30[1] and 30[2] are selected in accordance with the signal BM="2". This puts the amplifier circuits 50[1] and 50[2] in a write-operation mode, and the other amplifier circuits 50 are not driven. In addition, the wiring WL[1] is selected in accordance with the signal ADDR. Thus, the potential of the two wirings WL[1] that are connected to the cell array 40[1] and 40[2] becomes high, and the potential of the other wirings WL becomes low.

Then, data D of m×2 bits are split into data of m bits, data D[1] and D[2], and are written into the memory portion 20. Specifically, during the period in which the potential of the two wirings WL[1] that are connected to the cell arrays 40[1] and 40[2] is high, an operation in which the data D[1] of m bits are written into the cell array 40[1] and an operation of the data D[2] of m bits are written into the cell array 40[2] are performed in a sequential manner; the write operations here are the same as that in the period Tw1. Then, the potential of the two wirings WL[1] becomes low, and the data D are retained in cell arrays 40[1] and 40[2]. Through these operations, the data of m × 2 bits are written to the memory portion 20.

Next, during the period TwN, the memory circuits 30[1] and 30[N] are selected in accordance with the signal BM="N". This puts the amplifier circuits 50[1] to [N] in the write-operation mode. In addition, the wiring WL[1] is selected in accordance with the signal ADDR. Thus, the potential of the N wirings WL[1] that are connected to the cell array 40[1] to 40[N] becomes high, and the potential of the other wirings WL becomes low.

Then, data D of m×N bits are split into data of m bits, data D[1] to D[N], and are written into the memory portion 20. Then, the potential of the N wirings WL[1] becomes low, and the data D are retained in cell arrays 40[1] to 40[N]. Through these operations, the data of m×N bits are written to the memory portion 20.

As described above, the semiconductor device 10 can control the number of the wirings WL that are simultaneously selected and that of the amplifier circuits 50 that are simultaneously driven, in accordance with the amount of data to be written. This enables fast data writing.

[Read Operation]

FIG. 5B illustrates an example of the read operation of the semiconductor device 10. In FIG. 5B, periods Tr1, Tr2, and TrN denote read periods in which the signal BM is "1", "2", and "N", respectively. In addition, "DATA" denotes data that are supplied from the memory cell 41 to the driver circuit 80 through the wiring GBL and the amplifier circuit 50, and corresponds to read data. Note that in the read period, a signal RW that indicates the read operation is input to the controller 63 (see FIG. 4).

First, during the period Tr1, the memory circuit 30[1] is selected in accordance with the signal BM="1". This puts the amplifier circuit 50[1] in a read-operation mode, and the other amplifier circuits 50 are not driven. In addition, the wiring WL[1] is selected in accordance with the signal ADDR. Thus, the potential of the wiring WL[1] that is connected to the cell array 40[1] becomes high, and the potential of the other wirings WL becomes low.

Then, data D of m bits are read from the memory portion 20. Specifically, during the period in which the potential of the wiring WL[1] that is connected to the cell array 40[1] is high, the data D of m bits are input from the m memory cells 41 that are connected to the wiring WL[1] to the amplifier circuit 50[1] where the data are amplified. Subsequently, the amplified data are supplied to the driver circuit 80. Thus, the data D of m bits that are stored in the cell array 40[1] are read. Note that the potential of the wiring WL[1] becomes low after the data D are input from the m memory cells 41 to the amplifier circuit 50[1]. Through these operations, the data of m bits that are stored in the memory portion 20 are read.

Next, during the period Tr2, the memory circuits 30[1] and 30[2] are selected in accordance with the signal BM="2". This puts the amplifier circuits 50[1] and 50[2] in the read-operation mode, and the other amplifier circuits 50 are not driven. In addition, the wiring WL[1] is selected in accordance with the signal ADDR. Thus, the potential of the two wirings WL[1] that are connected to the cell array 40[1] and 40[2] becomes high, and the potential of the other wirings WL becomes low.

Then, the data D of m×2 bits, which are stored after being split into data of m bits (the data D[1] and D[2]), are read from the memory portion 20. Specifically, during the period in which the potential of the two wirings WL[1] that are connected to the cell arrays 40[1] and 40[2] is high, an operation in which the data D[1] of m bits stored in the cell array 40[1] are read and an operation in which the data D[2] of m bits stored in the cell array 40[2] are read are performed in a sequential manner; the read operations here are the same as that in the period Tr1. Note that the potential of the two wirings WL[1] becomes low after data D[1] and D[2] are input to the amplifier circuits 50[1] and 50[2], respectively, from the m×2 memory cells 41. Subsequently, the data D[1] and D[2] are sequentially supplied from the amplifier circuits 50[1] and 50[2], respectively, to the driver circuit 80. Through these operations, the data of m×2 bits that are stored in the memory portion 20 are read.

Next, during the period TrN, the memory circuits 30[1] and 30[N] are selected in accordance with the signal BM="N". This puts the amplifier circuits 50[1] to 50[N] in the read-operation mode. In addition, the wiring WL[1] is selected in accordance with the signal ADDR. Thus, the potential of the N wirings WL[1] that are connected to the cell array 40[1] to 40[N] becomes high, and the potential of the other wirings WL becomes low.

Then, the data D of m×N bits, which are stored after being split into data of m bits (the data D[1] to D[N]), are read from the memory portion 20. Specifically, during the period in which the potential of the N wirings WL[1] that are connected to the cell arrays 40[1] and [N] is high, the data D[1] to D[N], each of which are data of m bits and are stored in the cell array 40[1] to 40[N], are read; the same read operation performed in the period Tw1 is used here. Note that the potential of the N wirings WL[1] becomes low after data D[1] and D[N] are input to the amplifier circuits 50[1] and 50[N], respectively, from the m×N memory cells 41. Subsequently, the data D[1] and D[N] are sequentially supplied from the amplifier circuits 50[1] and 50[N], respectively, to the driver circuit 80. Through these operations, the data of m×N bits that are stored in the memory portion 20 are read.

The amplifier circuit 50 described above has a function of temporarily retaining the data that are read from the memory cell 41. Thus, when data are read from two or more memory circuits 30, data are supplied to the amplifier circuits 50 from the memory cells 41 by setting the potential of the wirings WL high, the data are amplified in a plurality of memory circuits 30 simultaneously, and then the data are output sequentially from each amplifier circuit 50 to the driver circuit 80. In this case, a plurality of the wirings WL[1] are selected simultaneously (see the periods Tr2 and TrN in FIG. 5B). The above-described operation enables faster reading than when the output of data from the memory cell 41 to the amplifier circuit 50 and the output of data from the amplifier circuit 50 to the driver circuit 80 are performed asynchronously across the memory circuits 30.

As described above, the semiconductor device 10 can control the number of the wirings WL that are simultaneously selected and that of the amplifier circuits 50 that are simultaneously driven, in accordance with the amount of data to be read. This enables fast data reading.

<Memory Cell>

Next, a specific configuration example of the memory cell 41 is described.

Figure 6A:
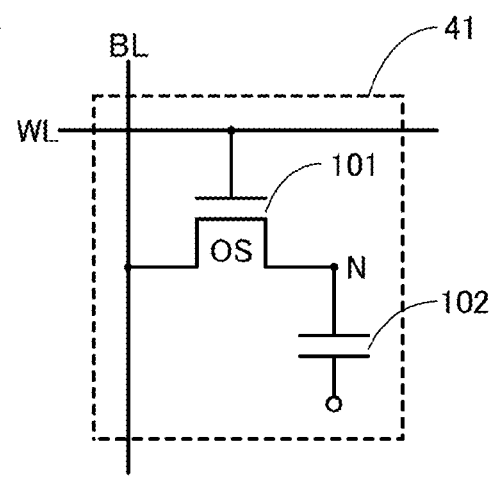
FIGS. 6A to 6C each illustrate a configuration example of a memory cell.

FIG. 6A illustrates a specific configuration example of the memory cell 41. The memory cell 41 includes a transistor 101 and a capacitor 102. The gate of the transistor 101 is connected to the wiring WL, one of a source and a drain of the transistor 101 is connected to one electrode of the capacitor 102, and the other of the source and the drain is connected to the wiring BL. The other electrode of the capacitor 102 is connected to a terminal that is supplied with a predetermined potential. The potential supplied to the terminal may be a constant potential (e.g. a ground potential) or a variable potential. A node that is connected to the one of the source and the drain of the transistor 101 and the one electrode of the capacitor 102 is designated as a node N. Note that the transistor 101 is an n-channel transistor in this example, but the transistor 101 may be a p-channel transistor.

When the potential of the wiring WL is set high and the transistor 101 is turned on, a predetermined potential (the write potential) is supplied from wiring BL to node N through the transistor 101. Subsequently, when the potential of the wiring WL is set low and the transistor 101 is turned off, the node N is brought into a floating state, thus retaining the potential at the node N. This enables storage of data in the memory cell 41.

Here, the transistor 101 is preferably a transistor containing an oxide semiconductor in a channel formation region (henceforth referred to as an OS transistor) FIG. 6A illustrates a configuration example in which the transistor 101 is an OS transistor. Note that transistors marked with "OS" in the figures are OS transistors.

An oxide semiconductor has a wider band gap and a lower carrier density than other semiconductors such as silicon, and thus the off-state current of an OS transistor is extremely low. Accordingly, the use of an OS transistor as the transistor 101 allows the potential retained at the node N to be retained over a long period. This can result in a reduction of the frequency of the operation to rewrite the data at predetermined intervals (refresh operation) to an extremely low frequency, such as once a second or less, preferably once a minute or less, further preferably once an hour or less, and still further preferably once a day or less, or eliminate the need for a refresh operation. Furthermore, the data can be retained in the memory cell 41 for a long period even when the supply of power to the memory cell 41 is stopped. Thus, power consumption of the semiconductor device 10 can be reduced. For example, in the semiconductor device 10 that is illustrated in FIGS. 1A, 1B, and the like, the power supply to an unselected memory cell 41 can be stopped over a certain period.

In addition, it is generally known that as the number of the memory cells 41 that are connected to one wiring WL increases, the power consumption in data write or read increases. Accordingly, a reduction of power consumption while maintaining the memory capacity of the memory portion 20 requires reducing the number of the memory cells 41 that are connected to one wiring WL (e.g. 256 or less) while increasing the number of the wirings WL. However, when the refresh operation is performed at a commonly used frequency (e.g. approximately once every 64 ms), providing a large number of the wirings WL elongate the time required for refresh operation; this hinders the data read/write, which can lower the operation speed of the memory portion 20 in some cases. In this manner, the power consumption and operation speed of the memory portion 20 can be in a trade-off relation in some cases.

When the OS transistor is used here as the transistor 101 as described above, the frequency of the refresh operation can be made extremely small, and the decrease of the operation speed due to the increase of the number of the wirings WL can be kept small. Thus, power consumption can be reduced while maintaining the operation speed at a certain level or higher.

Furthermore, one embodiment of the present invention can split the cell array to N cell arrays (the cell arrays 40[1] to 40[N]) as illustrated in FIG. 3, and simultaneously read data from and write data to different cell arrays simultaneously, as illustrated in FIGS. 5A and 5B. This prevents the operation speed from decreasing due to the increase in the number of the wirings WL, allowing the semiconductor device 10 to operate at high speed.

Figure 7:
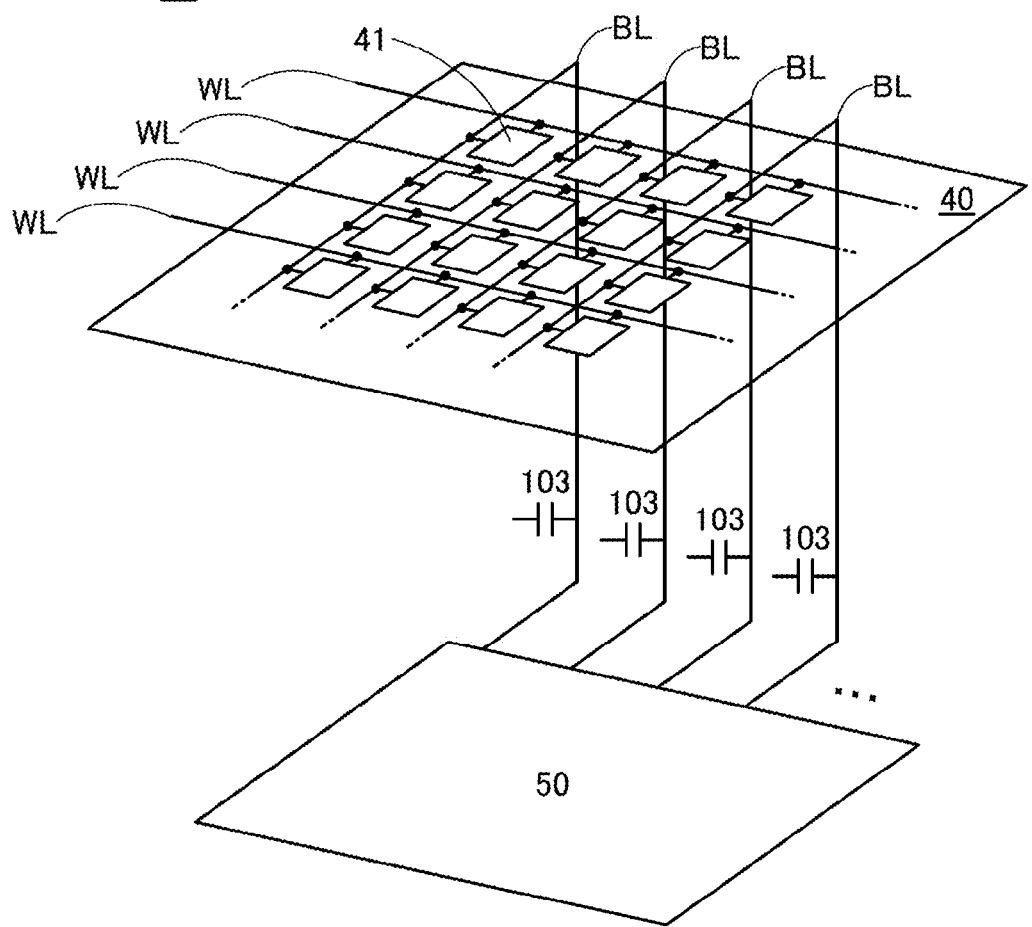
FIG. 7 illustrates a configuration example of a memory circuit.

Note that the amplifier circuit 50 needs to be provided for each cell array. When the cell array is split into N cell arrays, the number of the amplifier circuits 50 will be multiplied by N. Thus, when the cell array is split with the aim of high-speed operation as described above, the area of the semiconductor device 10 may increase due to the increase of the number of the amplifier circuits 50. However, as illustrated in FIG. 7, the memory cell 41 with the OS transistor can be stacked over the amplifier circuit 50. Accordingly, the area increase of the semiconductor device 10 can be reduced or eliminated even when the number of the amplifier circuits 50 is increased due to the splitting of the cell array.

Furthermore, as illustrated in FIG. 7, capacitances 103 are added to the wirings BL due to other wirings and electrodes. In other words, the capacitance 103 is a parasitic capacitance that is added to the wiring BL. Here, a ratio Cs/Cb, which is a ratio of the capacitance Cs of the capacitor 102 illustrated in FIGS. 6A to 6C to a capacitance Cb of the capacitance 103, is a value that is an index of the performance of the memory cell 41; a larger Cs/Cb value can improve the operational reliability of the memory cell 41. Thus, the value of Cb is preferably small.

To reduce Cb, the wiring BL is preferably shortened by providing fewer memory cells 41 that are connected to one wiring BL. The number of split cell arrays can be freely determined by using the OS transistor in the memory cell 41 and stacking the memory cell 41 over the amplifier circuit 50 as described above. Accordingly, the number of split cell arrays can be increased. By increasing the number of the split cell arrays, the number of the memory cells 41 that are connected to one wiring BL in each cell array can be reduced. This can result in a reduction of the capacitance Cb of the capacitances 103 that are added to the wirings BL. A reduction of Cb value in the manner described above allows a reduction of Cs value while maintaining the Cs/Cb value; this enables a low-power, high-speed writing in the memory cell 41. Note that in the configuration described above, the number of the memory cells 41 that are connected to one wiring BL can be, for example, 64 or less, preferably 32 or less, more preferably 16 or less, further preferably 8 or less. Note that the number of the memory cells 41 included in the cell array 40 can be freely determined; for example, it can be determined to be 512 or less.

As described above, a use of the OS transistor in one embodiment of the present invention enables an excellent semiconductor device that achieves low power consumption, high-speed operation, and area reduction.

Note that a case in which the OS transistor is used as the transistor 101 is described here, but the structure of the transistor 101 is not particularly limited. For example, the transistor 101 may be a transistor with a channel formation region formed in a part of a substrate that contains a single-crystal semiconductor other than an oxide semiconductor. Examples of this kind of substrate include a single-crystal silicon substrate and a single-crystal germanium substrate. In addition, the transistor 101 may be a transistor with a channel formation region formed in a film that contains a semiconductor material other than an oxide semiconductor. Examples of the semiconductor material that can be used in this transistor include amorphous silicon, microcrystalline silicon, polycrystalline silicon, single-crystal silicon, amorphous germanium, microcrystalline germanium, polycrystalline germanium, and single-crystal germanium.

Figure 6B:
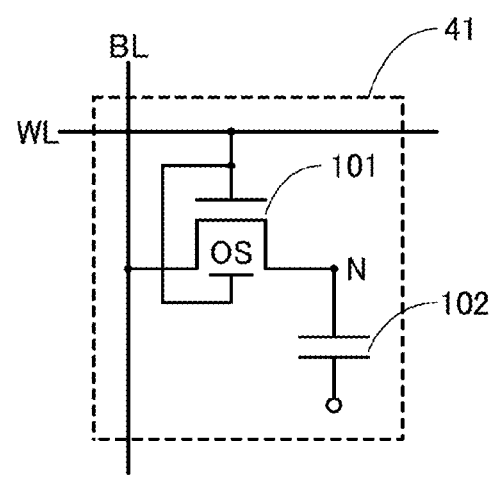
Figure 6C:
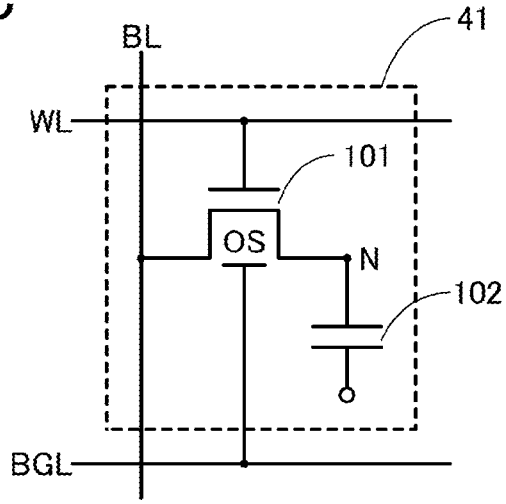

In addition, the transistor 101 may include a pair of gates. FIGS. 6B and 6C each illustrate a configuration in which the transistor 101 includes a pair of gate electrodes. Note that when a transistor includes a pair of gates, one of the pair of gates in the transistor is referred to as a first gate, a front gate, or simply a gate in some cases, and the other thereof is referred to as a second gate or a back gate in some cases.

The transistor 101 illustrated in FIG. 6B includes a back gate, and the back gate is connected to a front gate. In this case, the potential of the front gate and the potential of the back gate are equal.

The back gate of the transistor 101 illustrated in FIG. 6C is connected to a wiring BGL. The wiring BGL has a function of supplying a predetermined potential to the back gate. The threshold voltage of the transistor 101 can be controlled by controlling the potential of the wiring BGL. For example, the potential of the wiring BGL can be changed between a period in which the transistor 101 is turned on and a period in which the transistor 101 is turned off, thereby changing the threshold voltage of the transistor 101. Note that the wiring BGL can be connected to the driver circuit 70, and the potential of the wiring BGL can be controlled by the driver circuit 70. In addition, the wiring BGL can be shared among all the memory cells 41, or the memory cells 41 that are on the same row/column.

As described above, one embodiment of the present invention can change the number of the memory circuits 30 to be selected depending on the amount of data to be written to or read from the memory portion 20. This enables an improvement of data read/write speeds, and a provision of a semiconductor device that is capable of high-speed operation. In addition, a use of the OS transistor in the memory cell 41 enables one embodiment of the present invention to provide a low-power semiconductor device with a small area.

This embodiment can be combined with any of the other embodiments as appropriate.

(Embodiment 2)

In this embodiment, a specific example of the semiconductor device described in the above embodiment is described.

<Configuration Example of Semiconductor Device>

Figure 8:
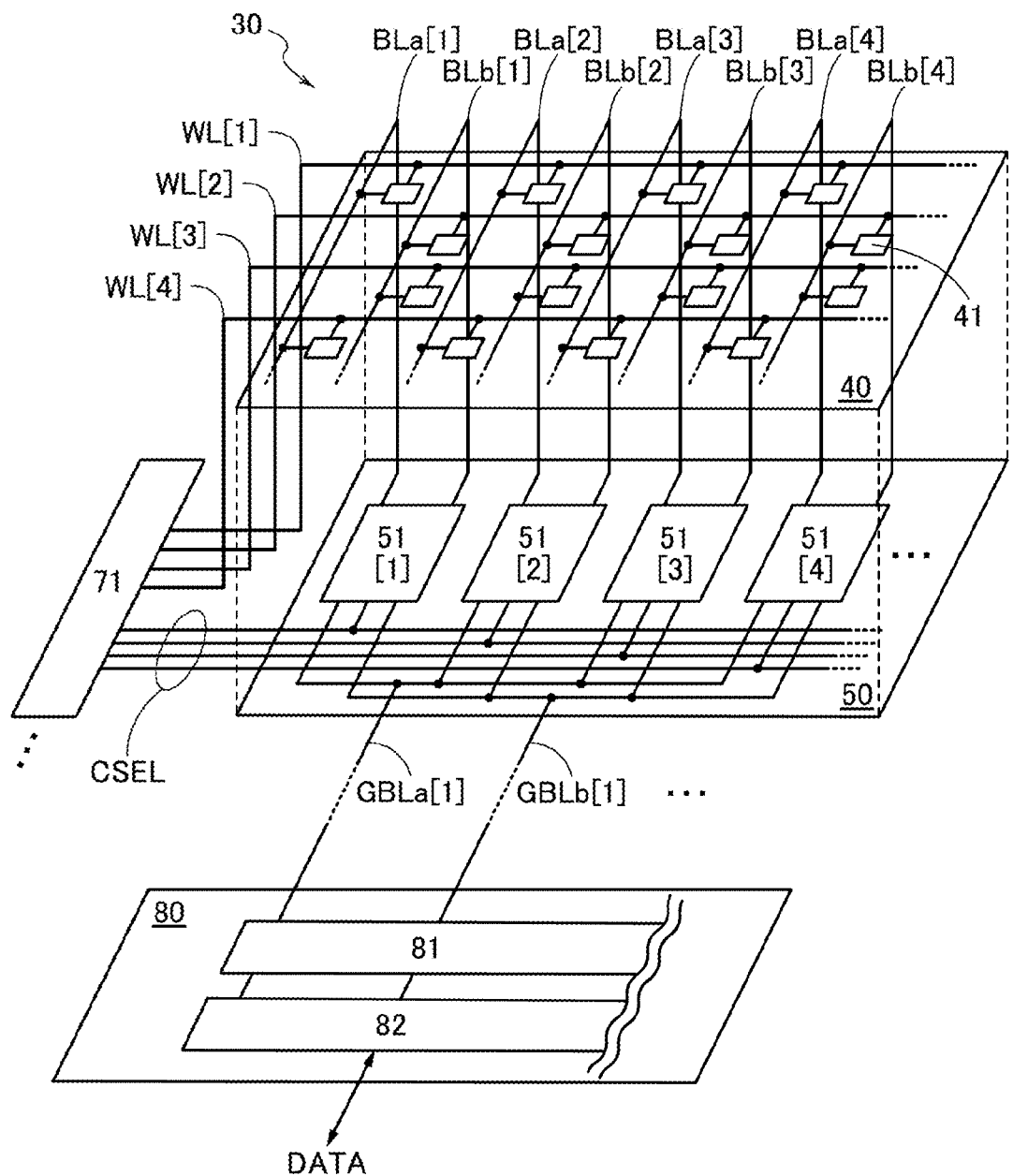
FIG. 8 illustrates a configuration example of a semiconductor device.

The semiconductor device 10 illustrated in FIG. 8 employs a configuration in which the cell array 40 is stacked over the amplifier circuit 50. In addition, the amplifier circuit 50 includes a plurality of sense amplifiers 51 (sense amplifiers 51[1] to 51[M], M is an integer greater than or equal to 1 and less than or equal to m). Furthermore, the wiring BL is made up of a wiring BLa and a wiring BLb, and the wiring GBL is made up of a wiring GBLa and a wiring GBLb. The data of m bits can be written and read in the cell array 40 by using m wirings BLa (wirings BLa[1] to BLa[m]) and m wirings BLb (wirings BLb[1] to BLb[m]).

In the description below, four wirings WL (the wirings WL[1] to WL[4]), four pairs of the wirings BL (the wirings BLa[1] to BLa[4] and the wirings BLb[1] to BLb[4]), 16 memory cells 41, four sense amplifiers 51 (the sense amplifiers 51[1] to 51[4]), and one pair of the wirings GBL (wirings GBLa[1] and GBLb[1]), all of which are illustrated as typical examples in FIG. 8, are mainly described. However, other wirings, circuits, or the like can take a similar configuration.

The sense amplifier 51 has a function of amplifying the potential of the wiring BL. Specifically, the sense amplifier 51 has a function of amplifying a difference between a potential of a specific wiring BL and a reference potential and retaining the amplified potential difference. For example, in FIG. 8, one sense amplifier 51 has a pair of the wirings BL (the wirings BLa and BLb) connected thereto; when the potential of the wiring BLa[1] is to be amplified, the sense amplifier 51[1] can amplify the potential difference between the wirings BLa[1] and BLb[1] taking the potential of the wiring BLb[1] as a reference potential, and retain the amplified potential difference.

In addition, each of the plurality of the sense amplifiers 51 is connected to the wiring GBLa and the wiring GBLb. Here, the selection circuit 71 has a function of selecting a sense amplifier 51 that supplies a potential to the wiring GBL from the plurality of the sense amplifiers 51. In FIG. 8, the sense amplifiers 51[1] to 51[4] are each connected to the wiring GBLa[1] and the wiring GBLb[1], and the selection circuit 71 is connected to the sense amplifiers 51[1] to 51[4] through the wirings CSEL. Then, the selection circuit 71 can select the sense amplifier 51 that supplies the potential to the wiring GBLa[1] and the wiring GBLb[1] by controlling a potential of the wiring CSEL. The number of the wirings GBL can be reduced when the plurality of the sense amplifiers 51 share the wiring GBL in this manner. When the number of the wirings GBL is reduced, the spacing therebetween can be wide. This can prevent the attenuation or the delay of a signal due to parasitic capacitance, thereby reducing the power consumption or expanding possibilities for circuit layout.

In addition, as illustrated in FIG. 8, the wiring CSEL is preferably positioned so as to overlap the cell array 40. This positioning allows a function of selecting the sense amplifier 51 with the selection circuit 71 to be implemented in the memory circuit 30, while preventing an area increase of the memory circuit 30.

Note that the numbers of the wirings GBL and the sense amplifiers 51 that are connected to the wirings GBL is not limited, and they can be any given number. In addition, the wirings CSEL correspond to the wirings SAL in FIG. 1B, FIG. 3, and FIG. 4.

The driver circuit 80 includes a main amplifier 81 and an input/output circuit 82. The main amplifier 81 has a function of amplifying a signal input thereto. Specifically, the main amplifier 81 has a function of amplifying the potential of the wiring GBL and outputting the amplified potential to the input/output circuit 82. In addition, the main amplifier 81 has a function of amplifying a potential that is input from the input/output circuit 82 and outputting the amplified potential to the wiring GBL.

As described above, the number of the signals to be amplified in the main amplifier 81 can be reduced by reducing the number of the wirings GBL. This can reduce the power consumption of the semiconductor device 10. In addition, the main amplifier 81 can be omitted in some cases.

The input/output circuit 82 has a function of controlling the output of a potential output from the main amplifier 81 to the outside, and a function of controlling the output of a potential input from the outside to the main amplifier 81.

<Configuration Example of Memory Circuit>

Figure 9A:
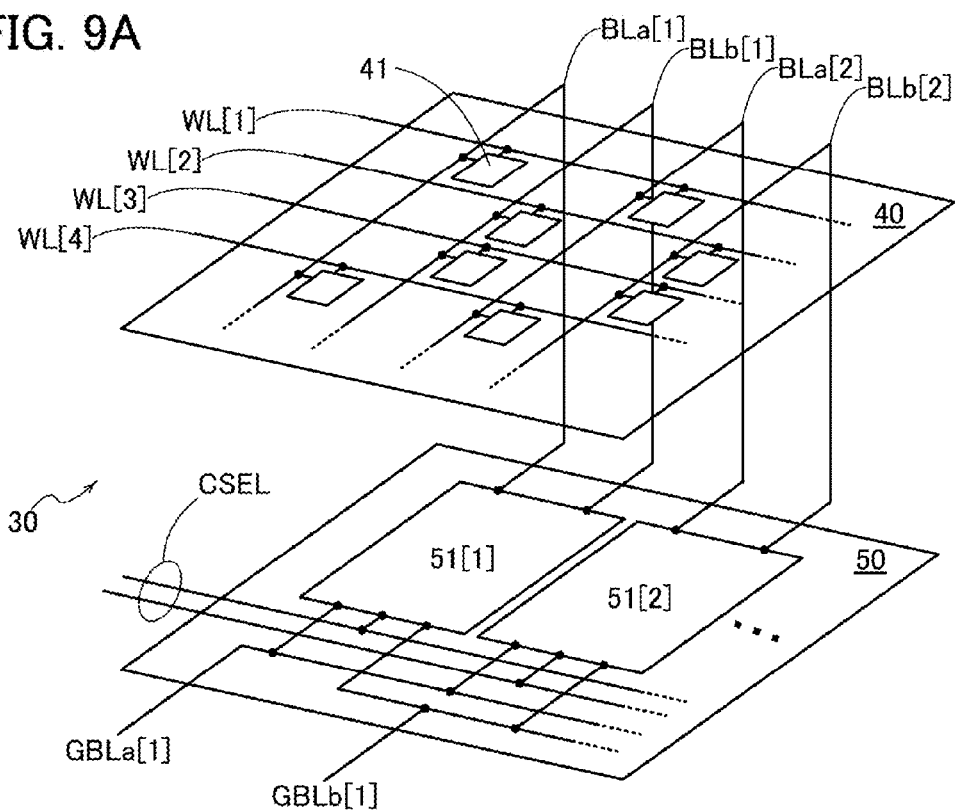
FIGS. 9A and 9B illustrate a configuration example of a memory circuit.
Figure 9B:
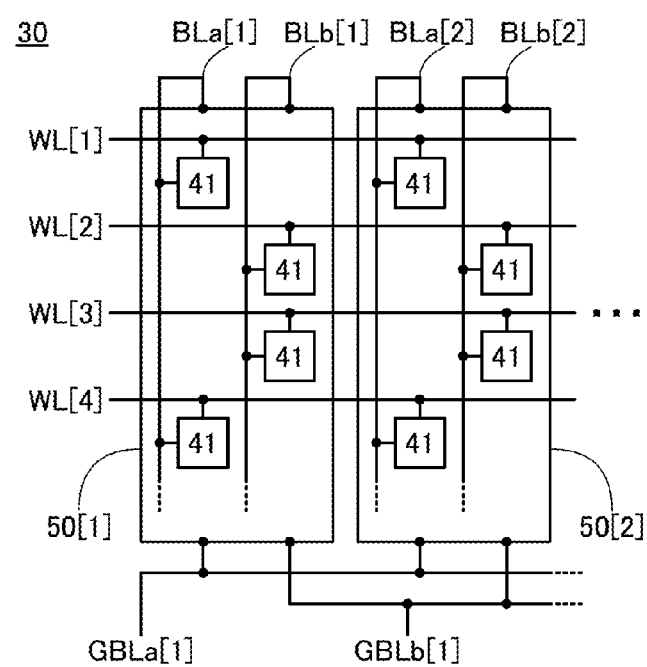

FIG. 9A illustrates a configuration example of the memory circuit 30. The memory circuit 30 includes a plurality of the memory cells 41 that are provided in the cell array 40, and a plurality of the sense amplifiers 51 that are provided in the amplifier circuit 50. Furthermore, FIG. 9B is a top view of the memory circuit 30 illustrated in FIG. 9A.

The memory circuit 30 has a configuration in which the sense amplifiers 51 are located on a first layer, and the memory cells 41 are located on a second layer provided over the first layer. In addition, at least one of the memory cells 41 are positioned to overlap the sense amplifier 51. This allows the area of the memory circuit 30 to be smaller than that when the memory cells 41 and the sense amplifiers 51 are provided in the same layer. Thus, the memory capacity per unit area of the memory circuit 30 can be increased. Note that the area of the memory circuit 30 can be further reduced by arranging all the memory cells 41 to overlap the sense amplifier 51. In addition, the memory cell 41 may be positioned to overlap one sense amplifier 51, or a plurality of different sense amplifiers 51.

In addition, the wiring CSEL is preferably positioned so as to overlap the memory cell 41. This can prevent area increase of the memory circuit 30 due to the provision of the wiring CSEL.

Employing a structure in which the memory cells 41 are stacked over the sense amplifiers 51 allows the reduction of the parasitic capacitance of the wiring BL, as described above. Thus, the memory cell 41 can operate with low power and at high speeds, or the capacitor provided in the memory cell 41 can be made small. For example, the capacitance of the capacitor 102 illustrated in FIGS. 6A to 6C can be less than or equal to 3.9 fF, the read/write time of the memory cell 41 can be 10 ns or less, preferably 5 ns or less, further preferably 3 ns or less, and energy required for writing can be less than or equal to 2 fJ.

<Configuration Example of Sense Amplifier>

Next, a specific configuration example of the sense amplifier 51 of one embodiment of the present invention is described.

Figure 10:
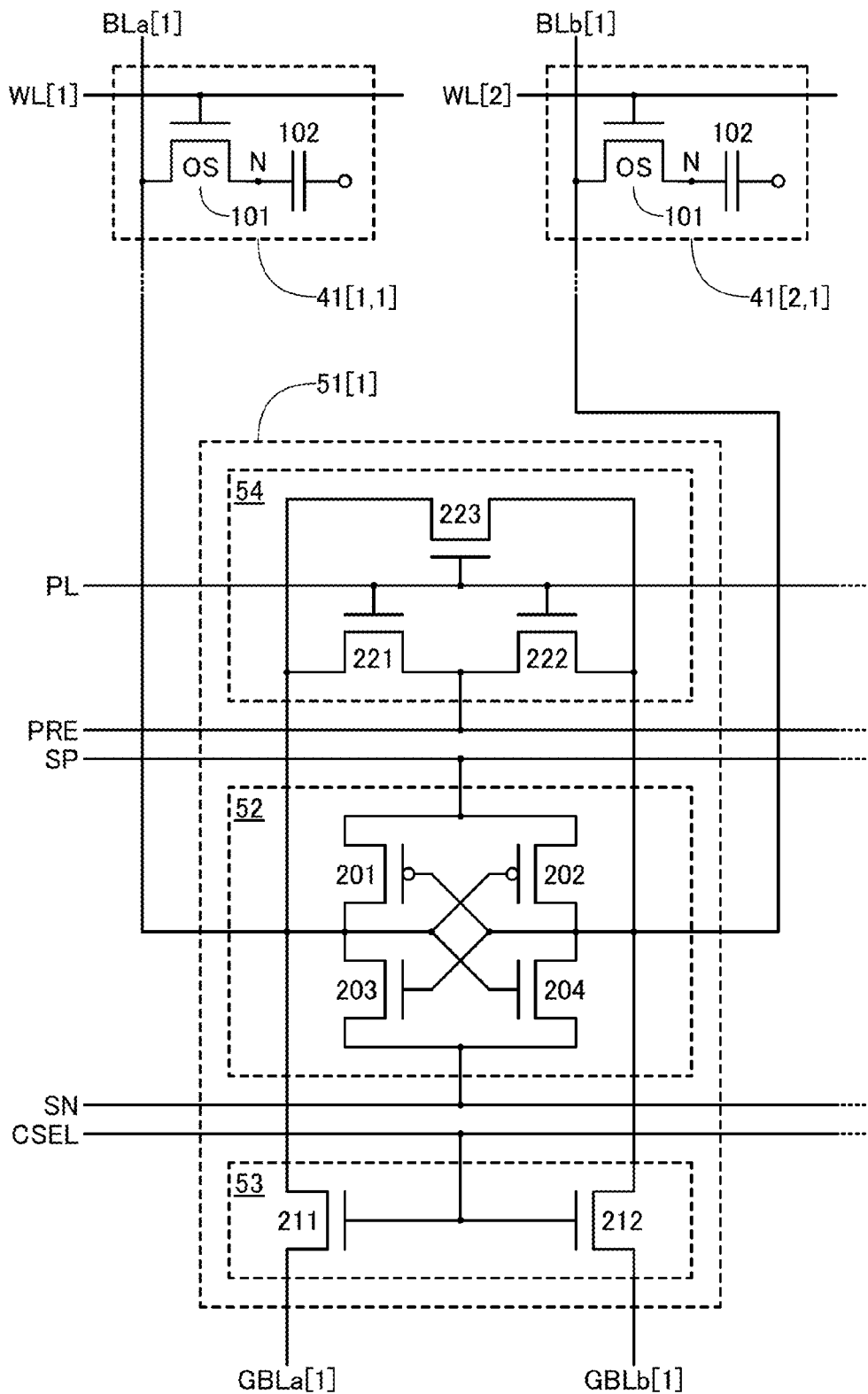
FIG. 10 illustrates a configuration example of a sense amplifier.

FIG. 10 illustrates an example of the circuit configuration of the sense amplifier 51. In FIG. 10, the memory cell 41[1, 1] that is connected to the wiring WL[1] and the wiring BLa[1], the memory cell 41[2, 1] that is connected to the wiring WL[2] and the wiring BLb[1], and the sense amplifier 51[1] that is connected to the memory cells 41[1, 1] and 41[2, 1] are illustrated. However, other sense amplifiers 51 and memory cells 41 can take a similar configuration. The sense amplifier 51[1] includes an amplifier circuit 52, a switch circuit 53, and a precharge circuit 54.

The amplifier circuit 52 includes p-channel transistors 201 and 202, and n-channel transistors 203 and 204. One of a source and a drain of the transistor 201 is connected to a wiring SP, and the other of the source and the drain of the transistor 201 is connected to a gate of the transistor 202, a gate of the transistor 204, and the wiring BLa[1]. One of a source and a drain of the transistor 203 is connected to the gate of the transistor 202, the gate of the transistor 204, and the wiring BLa[1]. The other of the source and the drain of the transistor 203 is connected to a wiring SN. One of a source and a drain of the transistor 202 is connected to the wiring SP, and the other of the source and the drain of the transistor 202 is connected to a gate of the transistor 201, a gate of the transistor 203, and the wiring BLb[1]. One of a source and a drain of the transistor 204 is connected to the gate of the transistor 201, the gate of the transistor 203, and the wiring BLb[1], and the other of the source and the drain of the transistor 204 is connected to the wiring SN. The amplifier circuit 52 has a function of amplifying a potential of the wiring BLa[1] or the wiring BLb[1]. Note that the sense amplifier 51[1] that includes the amplifier circuit 52 functions as a latch-type sense amplifier.

The switch circuit 53 includes n-channel transistors 211 and 212. Note that the transistors 211 and 212 may be p-channel transistors. One of a source and a drain of the transistor 211 is connected to the wiring BLa[1], and the other of the source and the drain of the transistor 211 is connected to the wiring GBLa[1]. One of a source and a drain of the transistor 212 is connected to the wiring BLb[1], and the other of the source and the drain is connected to the wiring GBLb[1]. Gates of the transistors 211 and 212 are connected to the wiring CSEL. The switch circuit 53 has a function of controlling the conduction states of the wirings BLa[1], GBLa[1], BLb[1], and GBLb[1] in accordance with a potential supplied to the wiring CSEL.

The precharge circuit 54 includes n-channel transistors 221 to 223. Note that the transistors 221 to 223 may be p-channel transistors. One of a source and a drain of the transistor 221 is connected to the wiring BLa[1], and the other of the source and the drain of the transistor 221 is connected to a wiring PRE. One of a source and a drain of the transistor 221 is connected to the wiring BLa[1], and the other of the source and the drain of the transistor 221 is connected to a wiring PRE. One of a source and a drain of the transistor 223 is connected to the wiring BLa[1], and the other of the source and the drain of the transistor 223 is connected to the wiring BLb[1]. Gates of the transistors 221, 222, and 223 are connected to a wiring PL. The precharge circuit 54 has a function of initializing the potential of the wiring BLa[1] or the wiring BLb[1].

Note that the wirings SP, SN, CSEL, PRE, and PL correspond to the wirings SAL illustrated in FIG. 1B, FIG. 3, and FIG. 4. At least one of those wirings preferably overlap the memory cell 41. In addition, at least one circuit from the amplifier circuit 52, the switch circuit 53, and the precharge circuit 54 preferably overlap the memory cell 41.

<Operation Example of Sense Amplifier>

Next, an example of the operation of the sense amplifier 51[1] when data are read from the memory cell 41[1, 1] is described with reference to the timing chart illustrated in FIG. 11.

First, during a period T1, the precharge circuit 54 is driven, and the potentials of the wirings BLa[1] and BLb[1]

are initialized. Specifically, a potential of the wiring PL is set high (VH_PL) to turn on the transistors 221 to 223. This results in a potential Vpre of the wiring PRE being supplied to the wirings BLa[1] and BLb[1]. For example, the potential Vpre can be set as (VH_SP+VL_SN)/2. Subsequently, the potential of the wiring PL is set low (VL_PL) to turn off the transistors 221 to 223.

Note that during the period T1, the potential of the wiring CSEL is low (VL_CSEL), and the transistors 211 and 212 in the switch circuit 53 are off. In addition, the potential of the wiring WL[1] is low (VL_WL), and the transistor 101 included in the memory cell 41[1, 1] is off. Similarly, though not illustrated in FIG. 11, a potential of the wiring WL[2] is low (VL_WL), and the transistor 101 included in the memory cell 41[2, 1] is off. In addition, the potential of the wiring SP and the wiring SN is the potential Vpre, and the sense amplifier 51 is not driven.

Next, the wiring WL[1] is selected during a period T2. Specifically, the potential of the wiring WL[1] is set high (VH_WL) to turn on the transistor 101 included in the memory cell 41[1, 1]. This results in the wiring BLa[1] and the capacitor 102 being electrically connected through the transistor 101 in the memory cell 41[1, 1]. The potential of the wiring BLa[1] changes in accordance with the amount of charge that is retained at the capacitor 102.

Figure 11:
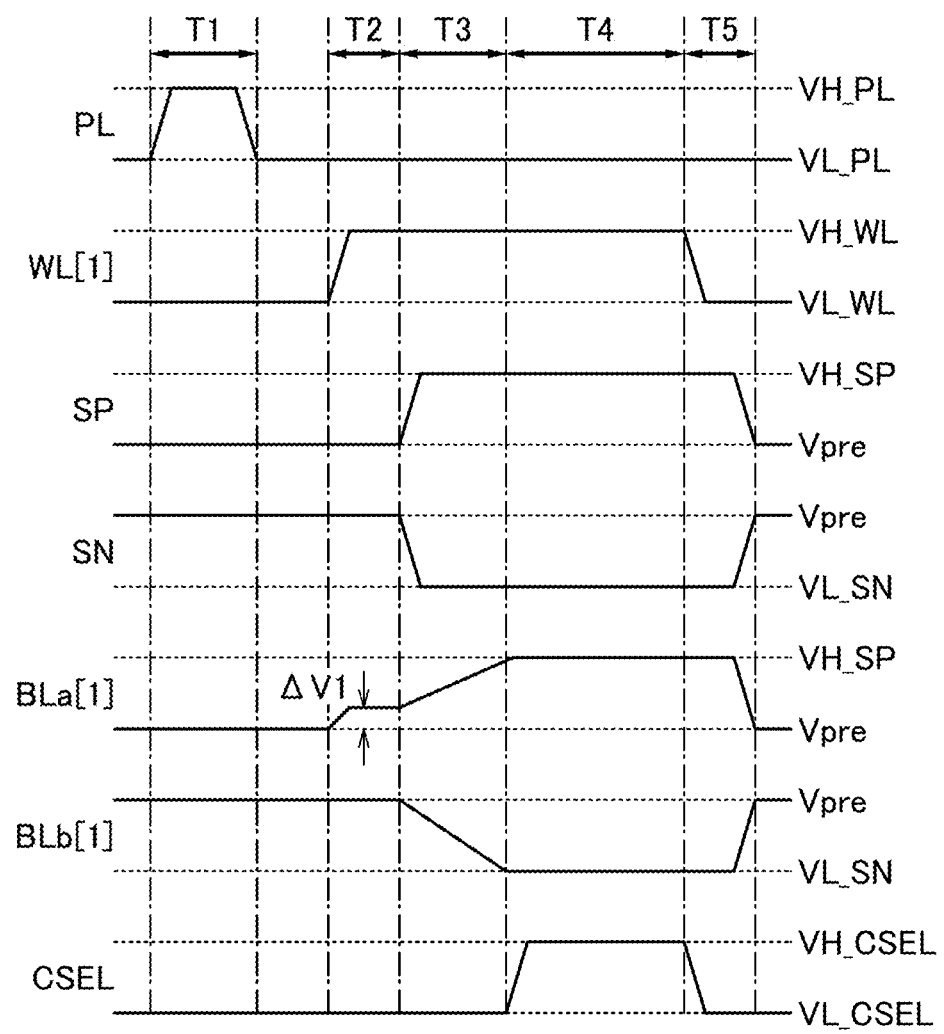
FIG. 11 is a timing chart.

FIG. 11 illustrates a case in which the amount of charge accumulated in the capacitor 102 included in the memory cell 41[1, 1] is large. Specifically, when the amount of charge accumulated in the capacitor 102 is large, the release of the charge from the capacitor 102 to the wiring BLa[1] increases the potential of the wiring BLa[1] by ΔV1 from the potential Vpre. On the other hand, when the amount of charge accumulated in the capacitor 102 is small, charge flows from the wiring BLa[1] to the capacitor 102, decreasing the potential of the wiring BLa[1] by ΔV2.

Note that during the period T2, the potential of the wiring CSEL is low (VL_CSEL), and the transistors 211 and 212 in the switch circuit 53 are off. In addition, the potential of the wirings SP and SN is the potential Vpre, and the sense amplifier 51 is still not driven.

Then, during a period T3, the potential of the wiring SP is set high (VH_SP), and the potential of the wiring SN is set low (VL_SN), to drive the amplifier circuit 52. The amplifier circuit 52 has a function of amplifying the potential difference (ΔV1 in FIG. 11) between the wirings BLa[1] and BLb[1]. Thus, driving the amplifier circuit 52 changes the potential of the wiring BLa[1] from Vpre+ΔV1 to a potential that is close to that of the wiring SP (VH_SP). In addition, the potential of the wiring BLb[1] is changed from Vpre to a potential that is close to that of the wiring SN (VL_SN).

Note that when the potential of the wiring BLa[1] is Vpre−ΔV2 and the amplifier circuit 52 is driven in the initial stage of the period T3, the potential of the wiring BLa[1] changes from Vpre−ΔV2 to a potential close to that of the wiring SN (VL_SN). In addition, the potential of the wiring BLb[1] changes from the potential Vpre to a potential that is close to that of the potential of the wiring SP (VH_SP).

In addition, the potential of the wiring PL is low (VL_PL) during the period T3, and the transistors 221 to 223 in the precharge circuit 54 are off. Furthermore, the potential of the wiring CSEL is low (VL_CSEL), and the transistors 211 and 212 in the switch circuit 53 are off. Furthermore, the potential of the wiring WL[1] is high (VH_WL), and the transistor 101 included in the memory cell 41[1, 1] is on. Thus, in the memory cell 41[1, 1], charge with an amount that depends on the potential of the wiring BL[1] (VH_SP) is accumulated in the capacitor 102.

Next, during a period T4, the potential of the wiring CSEL is controlled to turn on the switch circuit 53. Specifically, setting the potential of the wiring CSEL (VH_CSEL) high turns on the transistors 211 and 212. This results in the potential of the wiring BLa[1] being supplied to the wiring GBLa[1] and the potential of the wiring BLb[1] to the wiring GBLb[1].

Note that the potential of the wiring PL is low (VL_PL) during the period T4, and the transistors 221 to 223 in the precharge circuit 54 are off. Furthermore, the potential of the wiring WL[1] is high (VH_WL), and the transistor 101 included in the memory cell 41[1, 1] is on. In addition, the potential of the wiring SP is high (VH_SP), the potential of the wiring SN is low (VL_SN), and the amplifier circuit 52 is being driven. Thus, in the memory cell 41[1, 1], charge with an amount that depends on the potential of the wiring BL[1] (VH_SP) is accumulated in the capacitor 102.

Next, during a period T5, the potential of the wiring CSEL is controlled to turn off the switch circuit 53. Specifically, the potential of the wiring CSEL is set low (VL_CSEL) to turn off the transistors 211 and 212.

In addition, the wiring WL[1] is unselected during the period T5. Specifically, the potential of the wiring WL[1] is set low (VL_WL) to turn off the transistor 101 included in the memory cell 41[1, 1]. Thus, the charge with an amount that depends on the potential of the wiring BLa[1] (VH_SP) is retained in the capacitor 102 included in the memory cell 41[1, 1]. Accordingly, data are retained in the memory cell 41[1, 1] even after data are read.

Note that during the period T5, even if the switch circuit 53 is turned off, the potential difference between the wiring BLa[1] and the wiring BLb[1] is retained by the amplifier circuit 52 as long as the sense amplifier 51 is being driven. Therefore, the sense amplifier 51 has a function of temporarily retaining data that have been read from the memory cell 41[1, 1]. As shown in the periods Tr2 and TrN in FIG. 5B, data can be read from the memory cell 41 to the sense amplifier 51 in a plurality of the memory circuits 30 simultaneously, and then the data that are read can be sequentially output from each of the sense amplifier 51 to the driver circuit 80.

Through the operation described above, data are read from the memory cell 41[1, 1]. Note that reading of data from the memory cell 41[2, 1] can be performed in a similar manner.

The writing of data to the memory cell 41 can be performed with the same principles as those described above. Specifically, first, the transistors 221 to 223 included in the precharge circuit 54 are temporarily turned on to initialize the potentials of the wirings BLa[1] and BLb[1], in a manner similar to the case where data are read.

Next, the wiring WL[1] that is connected to the memory cell 41[1, 1] to which data are to be written is selected, and the transistor 101 that is included in the memory cell 41[1, 1] is turned on. This results in the wiring BLa[1] and the capacitor 102 being electrically connected through the transistor 101, in the memory cell 41[1, 1].

Then, the potential of the wiring SP is set high (VH_SP), and the potential of the wiring SN is set low (VL_SN) to drive the amplifier circuit 52.

Then, the potential of the wiring CSEL is controlled to turn on the switch circuit 53. This results in electrical connections of wirings BLa[1] and GBLa[1], and the wirings BLb[1] and GBLb[1]. Then, the write potential is supplied to the wiring GBLa[1], whereby the write potential is supplied to the wiring BLa[1] through the switch circuit 53. Through these operations, charge is accumulated in the capacitor 102 that is included in the memory cell 41[1, 1] depending on the potential of the wiring BLa[1], and data are written to the memory cell 41[1, 1].

Note that after the potential of the wiring GBLa[1] is supplied to the wiring BLa[1], the potential difference between the wiring BLa[1] and the wiring BLb[1] is retained by the amplifier circuit 52 as long as the sense amplifier 51 is being driven, even when the transistors 211 and 212 are turned off in the switch circuit 53. Thus, the timing of switching the transistors 211 and 212 from an on state to an off state can be before or after the wiring WL[1] is selected.

<Modification Example of Memory Circuit>

FIG. 8 and FIGS. 9A and 9B illustrate memory circuit 30 with a folded-type cell array 40; however, the cell array 40 can employ an open type configuration. In the following description, a memory circuit 30 with an open-type cell array 40 is described.

Figure 12:
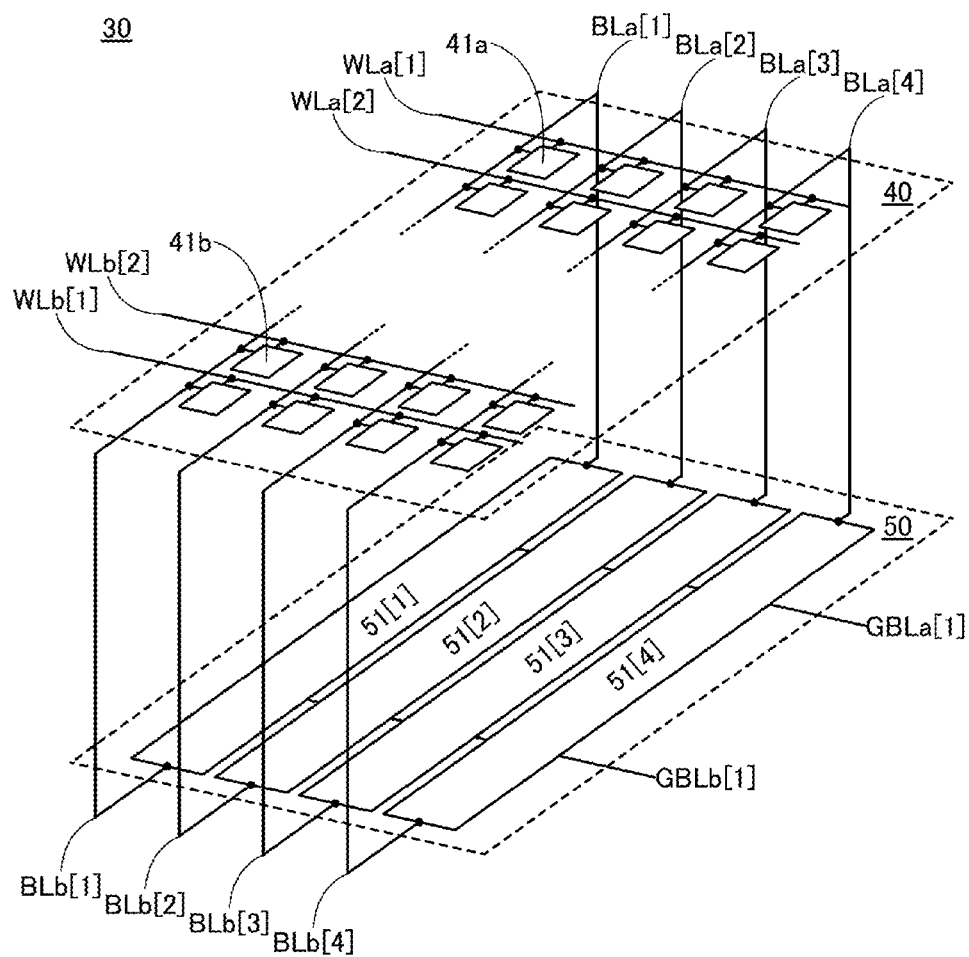
FIG. 12 illustrates a configuration example of a memory circuit.
Figure 13:
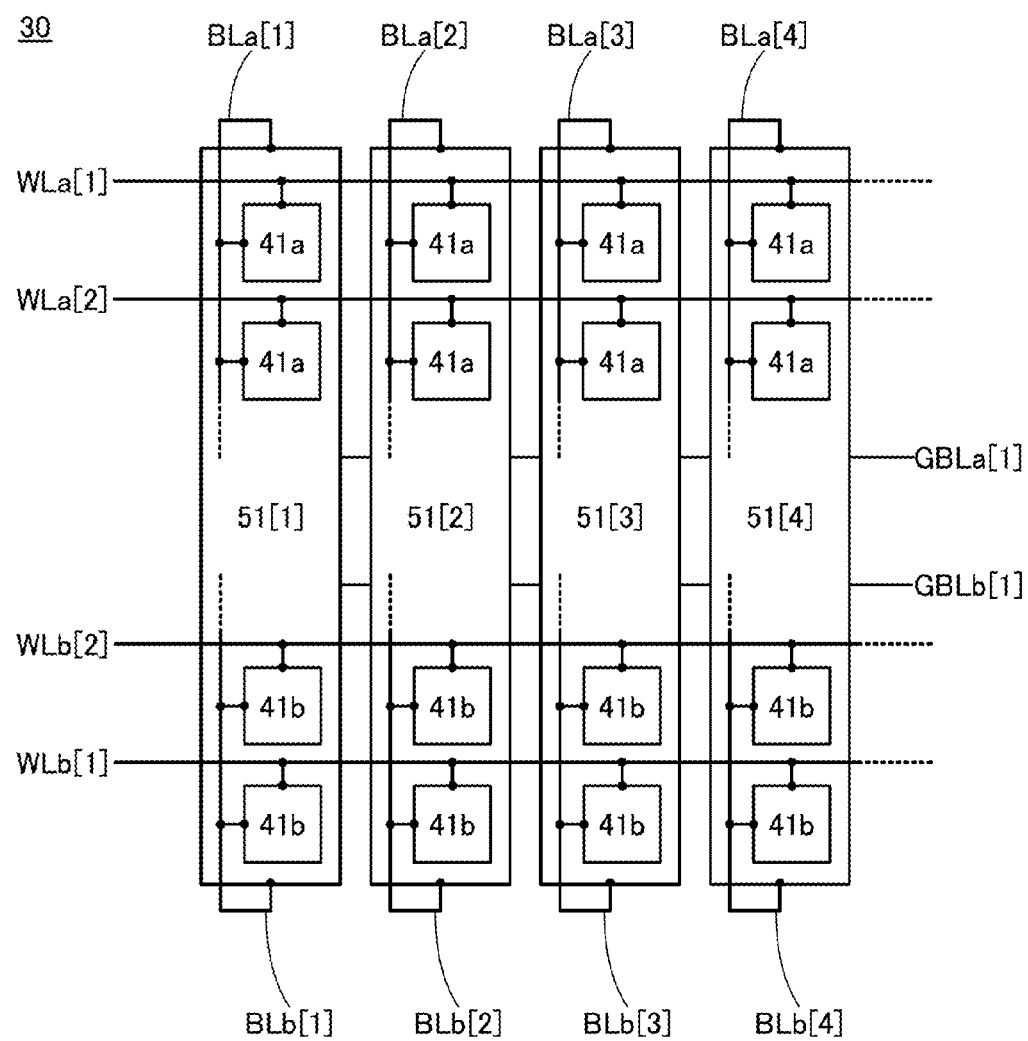
FIG. 13 illustrates a configuration example of a memory circuit.

FIG. 12 illustrates a configuration example of the memory circuit 30. In addition, FIG. 13 illustrates a top view of the memory circuit 30 illustrated in FIG. 12. The memory circuit 30 illustrated in FIGS. 12 and 13 illustrate a configuration in the memory cells 41 are stacked over the sense amplifiers 51 in a similar manner to the memory circuit 30 illustrated in FIG. 8. The memory circuit 30 includes the open-type cell array 40.

The sense amplifier 51 is connected to the wirings BLa and BLb. A plurality of memory cells 41a are connected to the wiring BLa, and a plurality of memory cells 41b are connected to the wiring BLb. In addition, the plurality of the memory cells 41a are connected to a wiring WLa, and the plurality of the memory cells 41b are connected to a wiring WLb. Note that the wiring BLa does not intersect with the wiring WLb, and the wiring BLb does not intersect with the wiring WLa. Furthermore, each of the sense amplifiers 51 is connected to the wirings GBL[1] and GBL[2].

As illustrated in FIG. 13, the memory cells 41a and 41b that are connected to a specific sense amplifier 51 in the memory circuit 30 are positioned to overlap the sense amplifier 51. Such a configuration can reduce the area of the memory circuit 30.

This embodiment can be combined with any of the other embodiments as appropriate.

(Embodiment 3)

In this embodiment, a configuration example in which the transistor provided in the memory cell includes a back gate is described.

In the case where the memory cell 41 includes the transistor 101 whose back gate is connected to the wiring BGL, a circuit 300 that is connected to the wiring BGL can be provided. A configuration example of the circuit 300 is illustrated in FIGS. 14A, 14B, 14C, and 14D. The circuit 300 includes a voltage generation circuit 310 and a voltage retention circuit 320.

The circuit 300 has a function of controlling the potential of the back gate of the transistor 101 by controlling the potential of the wiring BGL. Specifically, the circuit 300 has a function of supplying a negative potential to the back gate of the transistor 101 and retaining the negative potential. Thus, the threshold voltage of the transistor 101 can be kept high, and the transistor 101 can be prevented from being normally on. Accordingly, the power consumption of the memory cell 41 can be reduced.

A signal CLK and at least one of a potential VDD and a potential VSS are input to the voltage generation circuit 310. The potentials VDD and VSS are a high supply potential and a low supply potential, respectively. The signal CLK is a clock signal and is used to drive the voltage generation circuit 310. The voltage generation circuit 310 has a function of generating a potential VBG from a potential GND or the potential VDD, and outputting the potential VBG to the voltage retention circuit 320 through a wiring VL.

Figure 14A:
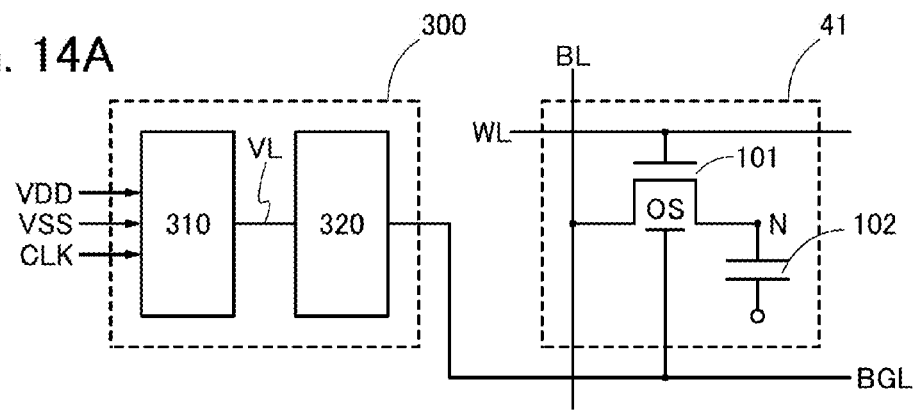
FIGS. 14A to 14D illustrates a configuration example of a circuit.
Figure 14B:
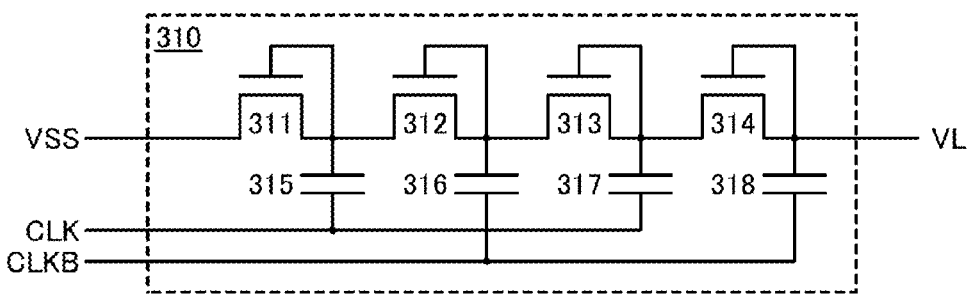

FIG. 14B illustrates a configuration example of the voltage generation circuit 310. The voltage generation circuit 310 illustrated in FIG. 14B is a step-down charge pump circuit. The potential VSS is input to the voltage generation circuit 310 as an input signal, and the potential VBG that is a negative potential is output to the wiring VL as an output signal. In other words, the voltage generation circuit 310 has a function of generating a potential VBG that is a negative potential by stepping down the potential VSS. Note that a charge pump circuit with four stages of basic circuits is illustrated here as an example; however, the number of basic circuits is not limited thereto, and any given number of basic circuits can be used.

The voltage generation circuit 310 includes transistors 311 to 314 connected in series and capacitors 315 to 318. Note that a case in which the transistors 311 to 314 are n-channel transistors is described.

In each of the transistors 311 to 314, a gate and one of a source and a drain are connected. Thus, the transistors 311 to 314 function as diodes. In addition, the gates of the transistors 311 to 314 are connected to corresponding one electrodes of the capacitors 315 to 318. The other electrodes of the capacitors 315 and 317 in odd-numbered stages are connected to a wiring that is supplied with the signal CLK, and the other electrodes of the capacitors 316 and 318 in even-numbered stages are connected to the wiring that is supplied with a signal CLKB. The signal CLKB is an inverted clock signal, and there is a phase difference of 180 degrees between the signals CLK and CLKB.

Figure 14C:
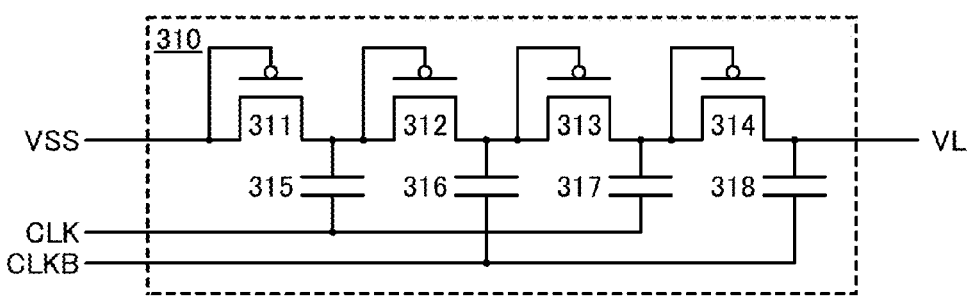

As described above, the voltage generation circuit 310 can generate a negative potential on the basis of the potential VSS and the signals CLK and CLKB. Note that the voltage generation circuit 310 can also be made with p-channel transistors. A configuration example of the voltage generation circuit 310 that includes p-channel transistors as the transistors 311 to 314 is illustrated in FIG. 14C.

The voltage retention circuit 320 has a function of applying the potential VBG input from the voltage generation circuit 310 to the back gate of the transistor 101, and a function of retaining the potential of the wiring BGL.

Figure 14D:
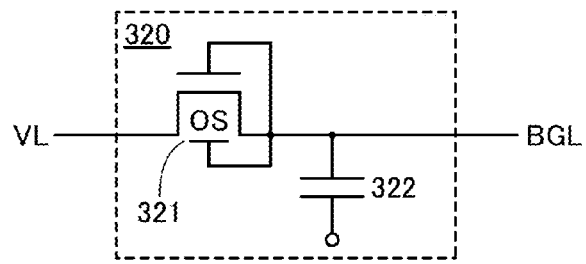

A configuration example of the voltage retention circuit 320 is illustrated in FIG. 14D. The voltage retention circuit 320 illustrated in FIG. 14D includes a transistor 321 and a capacitor 322. One of a source and a drain of the transistor 321 is connected to the front gate and the back gate of the transistor 321, one electrode of the capacitor 322, and the wiring BGL. The other electrode of the capacitor 322 is connected to a terminal that is supplied with a predetermined potential such as a ground potential. The other of the source and the drain of the transistor 321 is connected to the wiring VL. The wiring VL is supplied with the potential VBG from the voltage generation circuit 310.

The transistor 321 functions as a diode. The transistor 321 has a function of supplying a predetermined potential to the wiring BGL and retaining the potential.

When a negative potential is supplied to the wiring VL, the transistor 321 is turned on, and a negative potential is also supplied to the wiring BGL. Then, setting the potential of the wiring VL as GND sets the gate voltage of the transistor 321 at 0 V, which turns off the transistor 321. As a result, the potential of the wiring BGL (negative potential) is retained, and the transistor 101 can be kept in a normally-off state. To set the potential of the wiring VL as GND, the supply of the signal CLK to the voltage generation circuit 310 may be stopped, for example.

Note that the transistor 321 is preferably an OS transistor. This enables a long retention of the potential of the wiring BGL during a period in which the transistor 321 is turned off.

Figure 15:
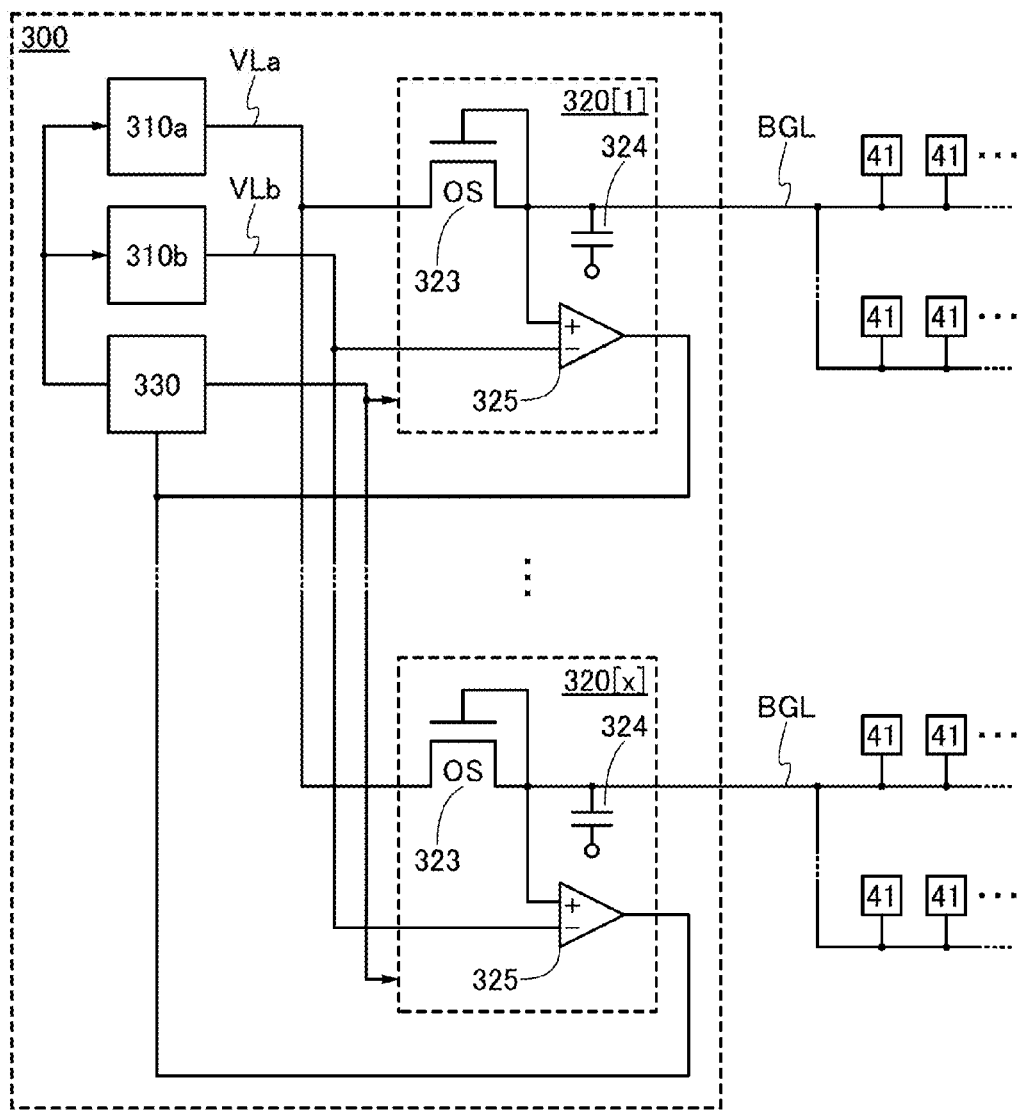
FIG. 15 illustrates a configuration example of a circuit.

Furthermore, the circuit 300 can take a configuration illustrated in FIG. 15. The circuit 300 illustrated in FIG. 15 includes voltage generation circuits 310*a* and 310*b*, a control circuit 330, and a plurality of the voltage retention circuits 320 (voltage retention circuits 320[1] to 320[*x*], *x* is an integer greater than or equal to 2). The voltage generation circuit 310*a* has a function of generating the potential VBG and supplying the potential VBG to a wiring VLa. The voltage generation circuit 310*b* has a function of generating a reference potential Vref and supplying the reference potential Vref to a wiring VLb. The control circuit 330 has a function of controlling the potential VBG and the reference potential Vref by outputting a predetermined control signal to the voltage generation circuits 310*a* and 310*b*.

The voltage retention circuit 320 includes a transistor 323, a capacitor 324, and a comparator 325. The transistor 323 and the capacitor 324 correspond to the transistor 321 and the capacitor 322 illustrated in FIG. 14D, respectively. The comparator 325 has a function of comparing the potential of the wiring BGL and the potential of the wiring VLb (reference potential Vref) and outputting the comparison result to the control circuit 330. The control circuit 330 has a function of controlling the potentials that are generated by the voltage generation circuits 310*a* and 310*b* on the basis of the signal input from the comparator 325. For example, when the potential of the wiring BGL is smaller than the reference potential Vref, by stopping the supply of the signal CLK from the control circuit 330 to the voltage generation circuit 310*a*, the potential of the wiring VLa is set at GND and thus the transistor 323 is turned off, whereby the potential of the wiring BGL can be maintained. When the potential of the wiring BGL is larger than the reference potential Vref, by supplying the signal CLK from the control circuit 330 to the voltage generation circuit 310*a*, the potential of the wiring VLa is set at a negative potential and thus the transistor 323 is turned on, whereby the potential of the wiring BGL can be decreased. The potential of the wiring BGL can thus be maintained at an appropriate value by comparing the potential of the wiring BGL and the reference potential Vref.

In addition, each of the voltage retention circuits 320[1] to 320[*x*] is connected to a plurality of the memory cells 41. With a configuration in which a plurality of the voltage retention circuits 320 are used to control the potential of the wiring BGL, when the transistor 323 connected to a certain wiring BGL has off-state leakage, off-state leakage from the transistors 323 that are connected to other wirings BGL can be prevented. Note that the number of memory cells 41 that are connected to one voltage retention circuit 320 through the wiring BGL can be set without limitation. For example, a 1-Mbit memory circuit can be achieved by providing one voltage retention circuit 320 for each 16-kbit cell array, and providing 64 voltage retention circuits 320.

Note that the control circuit 330 may have a function of controlling the operation of each of the voltage retention circuits 320[1] to 320[*x*] by supplying the control signal to the voltage retention circuits 320[1] to 320[*x*]. For example, whether the voltage retention circuit 320 compares potentials can be controlled by supplying an enable signal from the control circuit 330 to the comparator 325.

This embodiment can be combined with any of the other embodiments as appropriate.

(Embodiment 4)

In this embodiment, a configuration example of a computer of one embodiment of the present invention is described.

Figure 16:
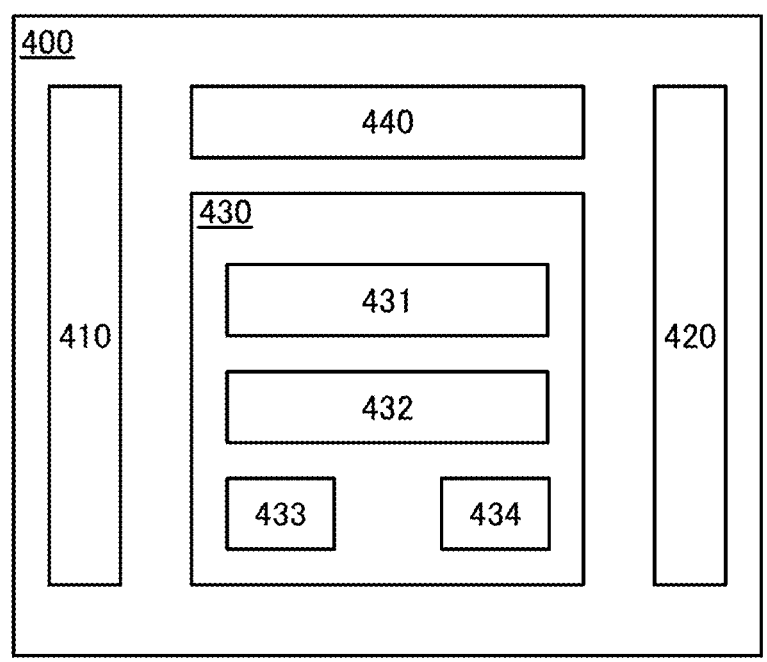
FIG. 16 illustrates a configuration example of a computer.

FIG. 16 is a block diagram illustrating a configuration example of the computer including the semiconductor device. A computer 400 includes an input device 410, an output device 420, a CPU 430, and a main memory device 440.

The input device 410 has a function of receiving data input from the outside of the computer 400. The output device 420 has a function of outputting data to the outside of the computer 400. The CPU 430 includes a control device 431, an arithmetic device 432, a memory device 433, and a memory device 434. The control device 431 has a function of outputting control signals to the input device 410, the output device 420, and the main memory device 440 for controlling these devices. The arithmetic device 432 has a function of performing a computation using input data. The memory device 433 has a function of holding data that the arithmetic device 432 uses for a computation. The memory device 433 has a function of a register. The memory device 434 has a function of a cache memory The memory device 440 has a function of a main memory device.

The memory device 434 is capable of higher-speed access than the memory device 440. Thus, providing the memory device 434 can increase the processing speed of the CPU 430.

The semiconductor device 10 that is described in the above embodiments can be used as the memory device 434 or the memory device 440. In other words, the semiconductor device 10 can be used as a cache memory or a main memory device.

This embodiment can be combined with any of the other embodiments as appropriate.

(Embodiment 5)

In this embodiment, a structure example of the semiconductor device described in the above embodiments that includes the OS transistor is described.

Figure 17:
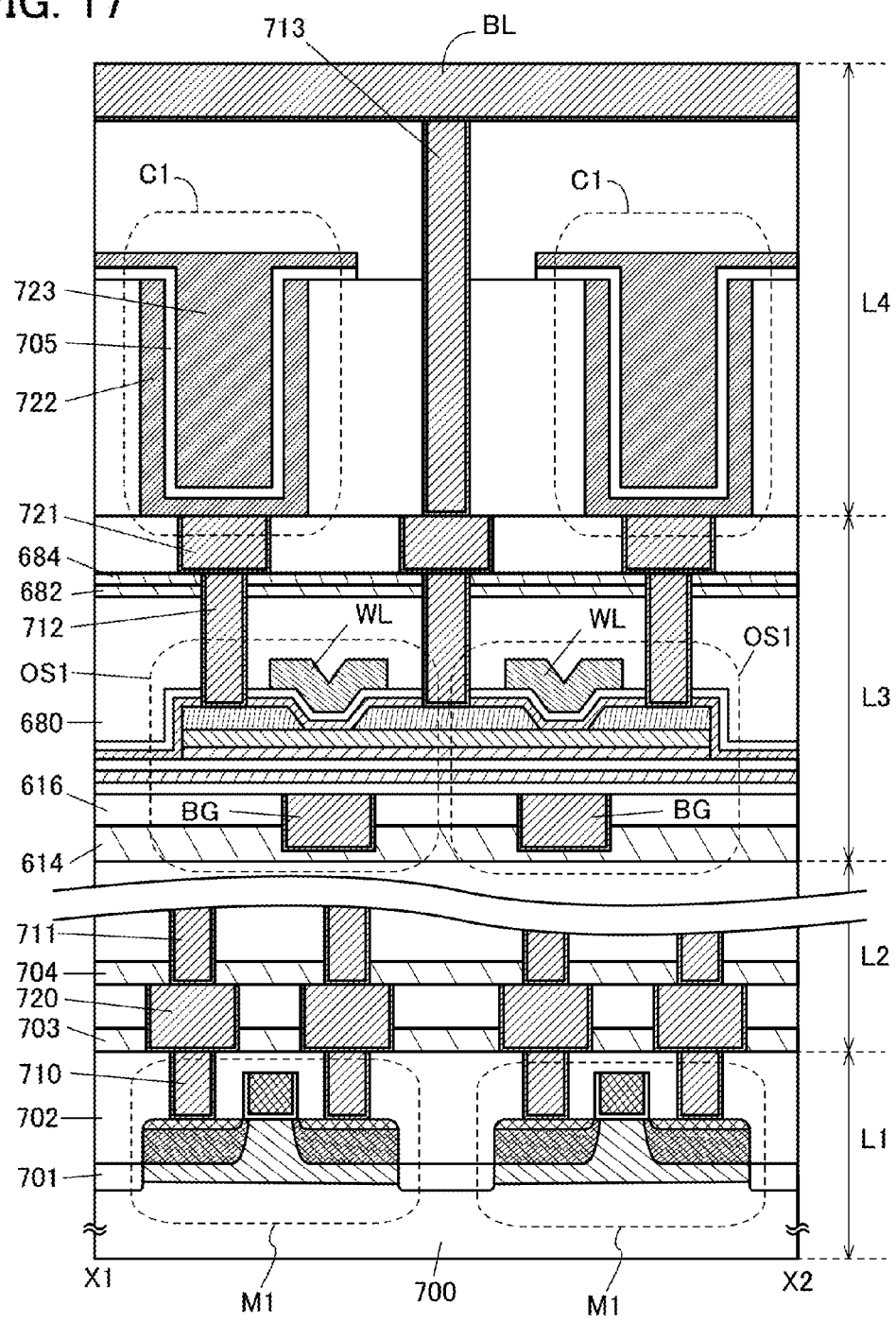
FIG. 17 is a cross-sectional view illustrating a structure example of a semiconductor device.

FIG. 17 illustrates an example of a cross section of the semiconductor device. FIG. 17 illustrates a transistor M1, the transistor OS1, and the capacitor C1. The transistor OS1 and the capacitor C1 can be used as the transistor 101 and the capacitor 102 illustrated in FIGS. 6A, 6B, and 6C, for example. The transistor M1 can be used as a transistor included in the amplifier circuit 50, the control circuit 60, the driver circuit 70, or the driver circuit 80 illustrated in FIGS. 1A and 1B, for example. When the transistor M1 is used as a transistor included in the amplifier circuit 50 (see FIG. 10), the cell array 40 can be stacked over the amplifier circuit 50, as illustrated in FIG. 7, FIG. 8, FIGS. 9A and 9B, FIG. 12, and FIG. 13. In addition, a structure example in which two transistors OS1 share one wiring BL is illustrated here.

The semiconductor device illustrated in FIG. 17 includes a layer L1, a layer L2, a layer L3, and a layer L4, which are stacked in this order from the bottom. The layer L1 includes the transistor M1, a substrate 700, an element isolation layer 701, an insulator 702, a plug 710, and the like. The layer L2 includes an insulator 702, a wiring 720, an insulator 704, a plug 711, and the like. The layer L3 includes an insulator 614, an insulator 616, the transistor OS1, a plug 712, an insulator 682, an insulator 684, a wiring 721, and the like. The first gate of the transistor OS1 functions as the wiring WL, and the second gate of the transistor OS1 functions as the wiring BG. The layer L4 includes the capacitor C1, a plug 713, the wiring BL, and the like. The capacitor C1 includes a conductor 722, a conductor 723, and an insulator 705.

Figure 19A:
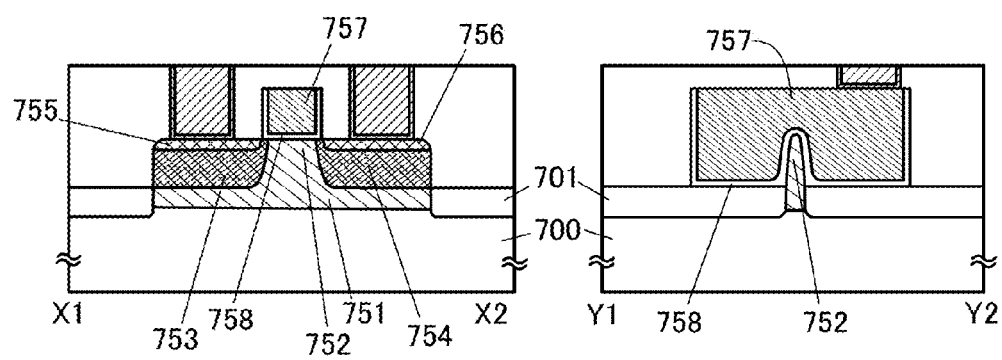
FIGS. 19A and 19B each illustrate a structure example of a transistor.
Figure 19B:
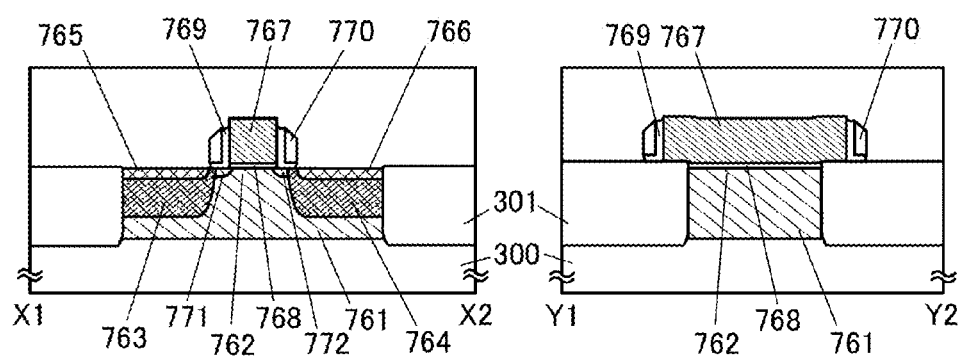

FIGS. 19A and 19B illustrate structure examples of the transistor M1. A cross section of the transistor M1 in the channel length direction is illustrated on the left drawing of FIG. 19A, and a cross section of the transistor M1 in the channel width direction is illustrated on the right drawing of FIG. 19A.

The transistor M1 is provided on the substrate 700 and isolated from another adjacent transistor by the element isolation layer 701. For the element isolation layer 701, silicon oxide, silicon oxynitride, silicon nitride oxide, silicon nitride, or the like can be used. Note that in this specification, an oxynitride refers to a substance that contains more oxygen than nitrogen, and a nitride oxide refers to a substance that contains more nitrogen than oxygen.

As the substrate 700, a single crystal semiconductor substrate or a polycrystalline semiconductor substrate of silicon or silicon carbide, a compound semiconductor substrate of silicon germanium, a silicon-on-insulator (SOI) substrate, or the like can be used. For example, a glass substrate, a quartz substrate, a plastic substrate, a metal substrate, an attachment film, paper including a fibrous material, or a base film may be used as the substrate 700. Alternatively, a semiconductor element may be formed using one substrate and then transferred to another substrate.

Alternatively, a flexible substrate may be used as the substrate 700. As a method of providing a transistor over a flexible substrate, there is a method in which a transistor is formed over a non-flexible substrate, and then separated from the non-flexible substrate and transferred to the flexible substrate 700. In that case, a separation layer is preferably provided between the non-flexible substrate and the transistor. As the substrate 700, a sheet, a film, or a foil containing a fiber may be used. The substrate 700 may have elasticity. The substrate 700 may have a property of returning to its original shape when bending or pulling is stopped. Alternatively, the substrate 700 may have a property of not returning to its original shape. The thickness of the substrate 700 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 700 has a small thickness, the weight of the semiconductor device can be reduced. When the substrate 700 has a small thickness, even in the case of using glass or the like, the substrate 700 may have elasticity or a property of returning to its original shape when bending or pulling is stopped. Therefore, an impact applied to the semiconductor device over the substrate 700, which is caused by dropping or the like, can be reduced. That is, a durable semiconductor device can be provided. For the substrate 700 which is a flexible substrate, metal, an alloy, resin, glass, or fiber thereof can be used, for example. The flexible substrate 700 preferably has a lower coefficient of linear expansion because deformation due to an environment is suppressed. The flexible substrate 700 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 700 because of its low coefficient of linear expansion.

This embodiment shows an example where a single crystal silicon wafer is used as the substrate 700.

The transistor M1 includes a channel formation region 752 and impurity regions 753 and 754 provided in a well 751, conductive regions 755 and 756 in contact with the impurity regions 753 and 754, a gate insulator 758 over the channel formation region 752, and a gate electrode 757 over the gate insulator 758. Note that the conductive regions 755 and 756 may be formed using a metal silicide or the like.

In the transistor M1 in FIG. 19A, the channel formation region 752 has a projecting portion, and the gate insulator 758 and the gate electrode 757 are provided along side and top surfaces of the projecting portion. The transistor with such a shape is referred to as a FIN-type transistor. Although the projecting portion is formed by processing part of the semiconductor substrate in this embodiment, a semiconductor layer with a projecting portion may be formed by processing a silicon-on-insulator (SOI) substrate.

In this embodiment, an example in which a transistor containing silicon in a channel formation region (henceforth referred to as a Si transistor) is used as the transistor M1 is described. The transistor M1 may be either an n-channel transistor or a p-channel transistor; an appropriate transistor is used depending on a circuit.

Note that the transistor M1 may be a planar transistor. FIG. 19B shows an example of that case. A cross section of the transistor M1 in the channel length direction is illustrated on the left drawing of FIG. 19B, and a cross section of the transistor M1 in the channel width direction is illustrated on the right drawing of FIG. 19B.

The transistor M1 illustrated in FIG. 19B includes a channel formation region 762, low-concentration impurity regions 771 and 772, and high-concentration impurity regions 763 and 764 provided in a well 761; conductive regions 765 and 766 in contact with the high-concentration impurity regions 763 and 764; a gate insulator 768 over the channel formation region 762; a gate electrode 767 over the gate insulator 768; and sidewall insulating layers 769 and 770 provided on sidewalls of the gate electrode 767. Note that the conductive regions 765 and 766 may be formed using a metal silicide or the like.

In FIG. 17, the insulator 302 serves as an interlayer insulator. In the case where a Si transistor is used as the transistor M1, the insulator 702 preferably contains hydrogen. When the insulator 702 contains hydrogen, dangling bonds of silicon can be terminated and thus the reliability of the transistor M1 can be improved. For the insulator 702, silicon oxide, silicon oxynitride, silicon nitride oxide, silicon nitride, or the like is preferably used.

The insulator 303 is preferably formed using, for example, a barrier film that prevents hydrogen or impurities from diffusing from the substrate 700, the transistor M1, or the like into a region where the transistor OS1 is formed. For example, silicon nitride formed by a CVD method can be used. Diffusion of hydrogen into an oxide semiconductor contained in the transistor OS1 degrades the characteristics of the oxide semiconductor in some cases. Therefore, a film that prevents hydrogen diffusion is preferably provided between the transistor M1 and the transistor OS1.

The film that prevents hydrogen diffusion means a film from which hydrogen is unlikely to be released. The amount of released hydrogen can be measured by thermal desorption spectroscopy (TDS), for example. The amount of hydrogen released from the insulator 703 that is converted into hydrogen atoms per area of the insulator 703 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

For the insulator 704 and the insulator 614, an insulator that inhibits copper diffusion or an insulator with barrier properties against oxygen and hydrogen is preferably used. For a film that suppresses diffusion of copper, silicon nitride can be used, for example. Thus, the insulator 704 and the insulator 614 can be formed using a material similar to that used for the insulator 703.

For example, a silicon oxide film or a silicon oxynitride film can be used as the insulator 616.

Details on an insulator 680, the insulator 682, the insulator 684 and the transistor OS1 are described later.

The insulator 705 may be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

Alternatively, the insulator 705 may have a stacked-layer structure using any of the above insulators. For example, the insulator 705 may have a stacked-layer structure using a material with high dielectric strength (e.g., silicon oxynitride) and a high dielectric (high-k) material (e.g., aluminum oxide). With this structure, the capacitor C1 can have a sufficient capacitance, and dielectric breakdown can be prevented.

The conductors, wirings, and plugs illustrated in FIG. 17 each preferably have a single-layer structure or a stacked-layer structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper.

Figure 18:
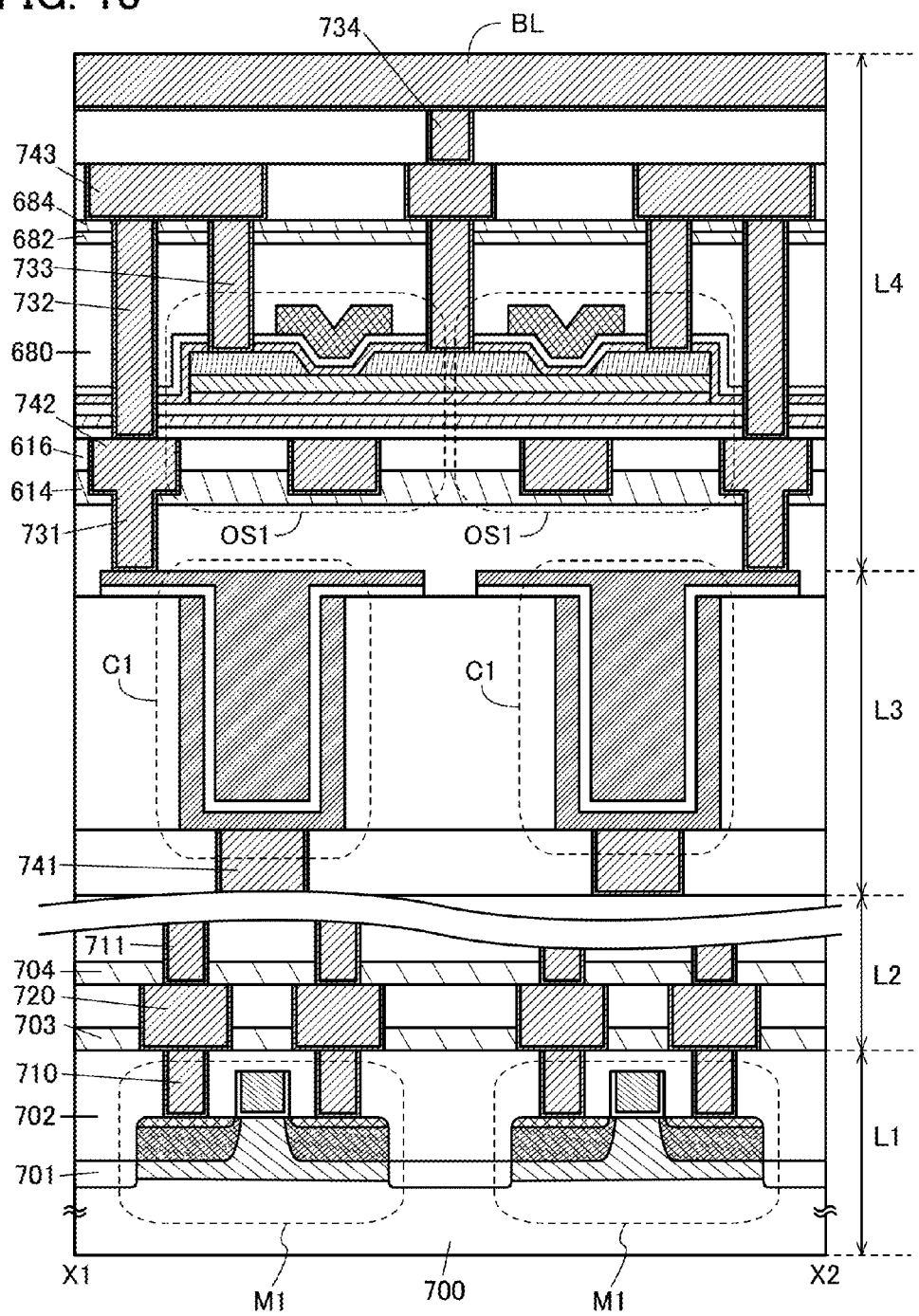
FIG. 18 is a cross-sectional view illustrating a structure example of a semiconductor device.

In the semiconductor device illustrated in FIG. 17, the transistor OS1 may be formed over the capacitor C1. The cross-sectional view of this case is illustrated in FIG. 18. The cross-sectional view in FIG. 18 is different from that in FIG. 17 in the layer L3 and the layer L4.

In FIG. 18, the layer L3 includes a wiring 741 and the capacitor C1.

In FIG. 18, the layer L4 includes a plug 731, a plug 732, a plug 733, a plug 734, a wiring 742, a wiring 743, the wiring BL, the insulator 614, the insulator 616, the insulator 680, the insulator 682, the insulator 684, and the transistor OS1.

Providing the capacitor C1 below the transistor OS1 can prevent the transistor OS1 from being affected by hydrogen or process damage caused during formation of the capacitor C1.

In FIGS. 17 and 18, regions without reference numerals and hatch patterns represent regions formed of an insulator. As the insulator, an insulator containing at least one material selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

This embodiment can be combined with any of the other embodiments as appropriate.

(Embodiment 6)

In this embodiment, structure examples of the OS transistors used in any of the above embodiments are described.

<Oxide Semiconductor>

First, an oxide semiconductor used for the OS transistor is described.

The oxide semiconductor preferably contains at least indium or zinc. In particular, indium and zinc are preferably contained. Here, the case where an oxide semiconductor contains indium, an element M, and zinc is considered.

The element M is preferably gallium (Ga), for example. Other elements that can be used as the element M are aluminum (Al), boron (B), silicon (Si), titanium (Ti), zirconium (Zr), lanthanum (La), cerium (Ce), yttrium (Y), hafnium (Hf), tantalum (Ta), niobium (Nb), scandium (Sc), and the like.

First, preferred ranges of atomic ratios of indium to the element M and zinc in the oxide semiconductor according to the present invention is described with reference to FIGS. 20A to 20C. Note that the proportion of oxygen atoms is not illustrated in FIGS. 20A to 20C. The terms of the atomic ratio of indium to the element M and zinc in the oxide semiconductor are denoted by [In], [M], and [Zn], respectively.

Figure 20A:
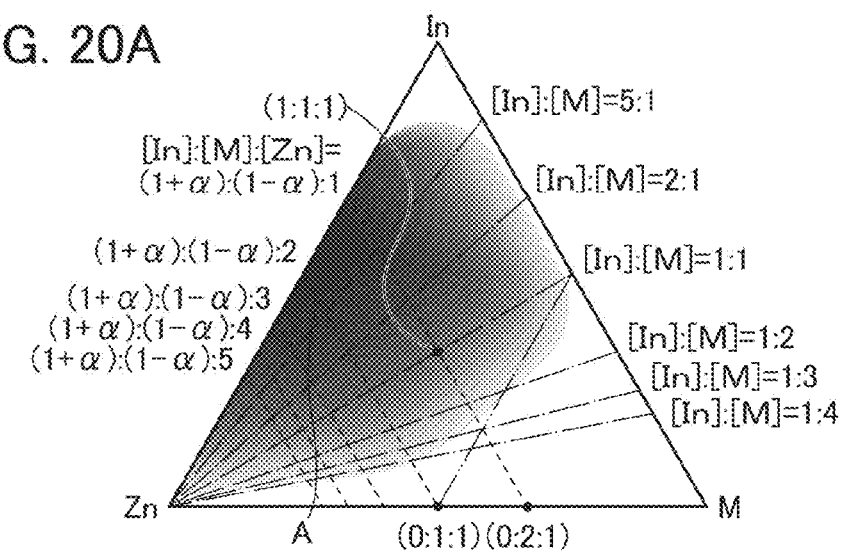
FIGS. 20A to 20C each describe a crystal of $InMZnO_4$.
Figure 20B:
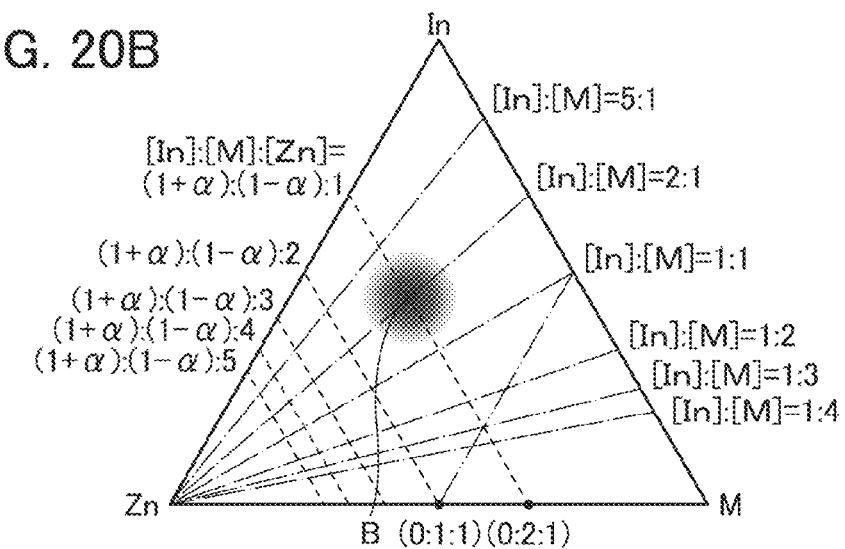
Figure 20C:
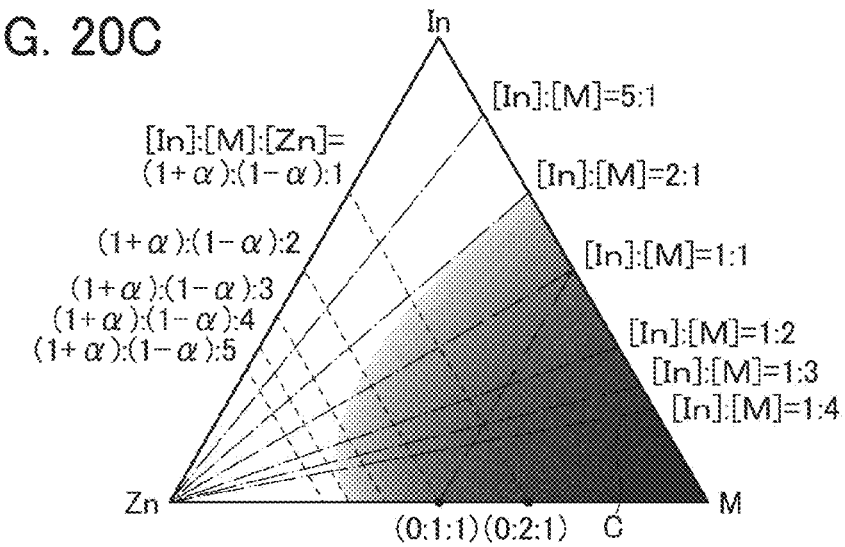

In FIGS. 20A to 20C, broken lines indicate a line where the atomic ratio [In]:[M]:[Zn] is $(1+\alpha):(1-\alpha):1$ where $\alpha$ is a real number greater than or equal to 1 and less than or equal to 1, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$ (where $-1 \leq g \leq 1$). An oxide semiconductor having the atomic ratio of [In]:[M]:[Zn]=0:2:1 or a neighborhood thereof in FIGS. 20A to 20C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap.

A region A in FIG. 20A represents a region where an oxide semiconductor has high carrier mobility and is likely to have a layered structure with few grain boundaries.

A region B in FIG. 20B represents atomic ratios from [In]:[M]:[Zn]=4:2:3 to [In]:[M]:[Zn]=4:2:4.1 and neighborhoods thereof. The vicinity includes an atomic ratio of [In]:[M]:[Zn]=5:3:4. n oxide semiconductor with an atomic ratio represented by the region B is an excellent oxide semiconductor that has particularly high crystallinity and high carrier mobility.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 20C), insulation performance becomes better.

<Structural Example 1 of Transistor>

Figure 21A:
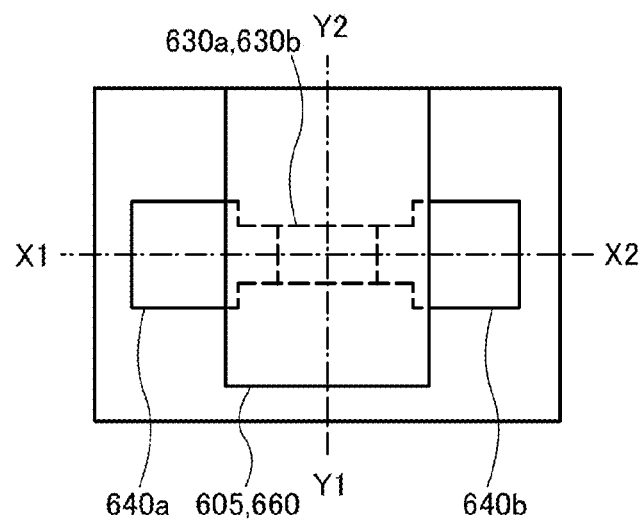
FIGS. 21A to 21C each illustrate a structure example of a transistor.
Figure 21B:
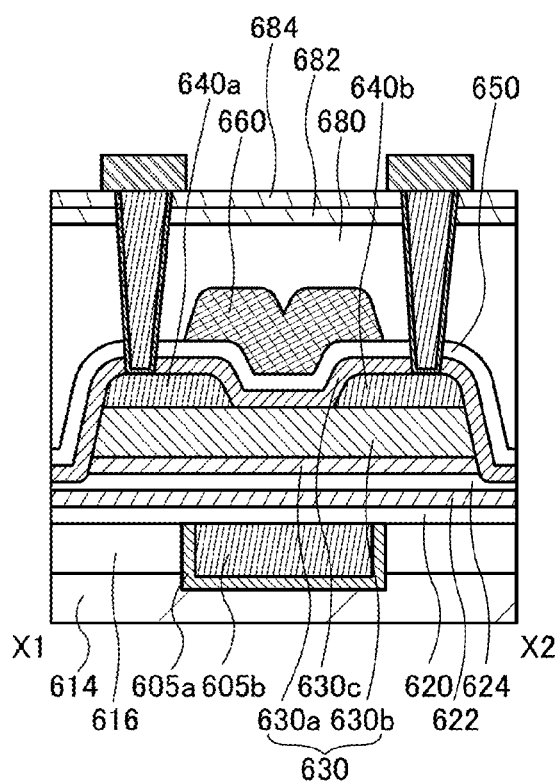
Figure 21C:
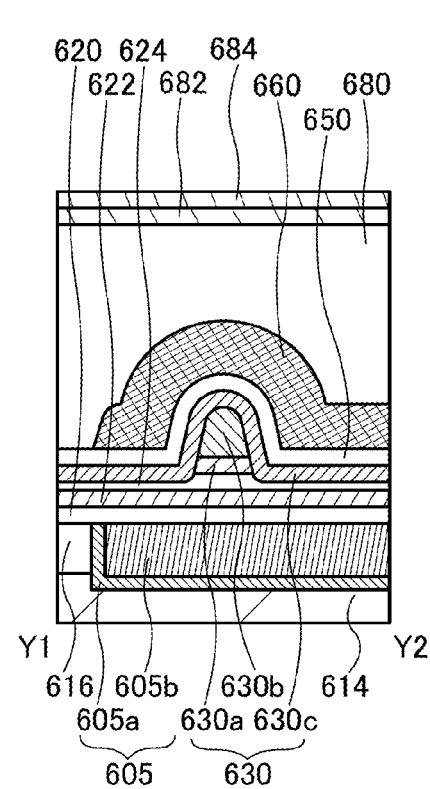

FIGS. 21A to 21C are a top view and cross-sectional views of a transistor 600. FIG. 21A is a top view. FIG. 21B is a cross-sectional view taken along dashed-dotted line X1-X2 in FIG. 21A. FIG. 21C is a cross-sectional view taken along dashed-dotted line Y1-Y2 in FIG. 21A. Note that for simplification of the drawing, some components in the top view in FIG. 21A are not illustrated.

FIGS. 21B and 21C illustrate an example in which the transistor 600 is provided over the insulator 614 and the insulator 616.

The transistor 600 includes a conductor 605 (conductors 605a and 605b) and a conductor 660 that function as gate electrodes, insulators 620, 622, 624, and 650 that function as gate insulating layers, an oxide semiconductor 630 (oxide semiconductors 630a, 630b, and 630c), a conductor 640a that functions as one of a source and a drain, a conductor 640b that functions as the other of the source and the drain, and an insulator 680 that contains excess oxygen (contains oxygen in excess of that in the stoichiometric composition).

In the transistor 600, the conductor 660 is referred to as a top gate and the conductor 605 is referred to as a bottom gate in some cases. Alternatively, the conductor 660 is referred to as a front gate and the conductor 605 is referred to as a back gate in some cases.

In addition, the oxide semiconductor 630 includes the oxide semiconductor 630a, the oxide semiconductor 630b provided over the oxide semiconductor 630a, and the oxide semiconductor 630c provided over the oxide semiconductor 630b. When the transistor 600 is turned on, current flows mainly in the oxide semiconductor 630b. That is, the oxide semiconductor 630b functions as a channel formation region. Although current sometimes flows through a region in the vicinity of the interface (a mixed region in some cases) between the oxide semiconductor 630b and the oxide semiconductor 630a and the oxide semiconductor 630c, the oxide semiconductor 630a and the oxide semiconductor 630c function as insulators at the other region in some cases.

The conductor 605 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium oxide, indium zinc oxide, or indium tin oxide to which silicon oxide is added can also be used.

For example, a conductor having a barrier property with respect to hydrogen, e.g., tantalum nitride, may be used as the conductor 605a, and tungsten, which has high conductivity, may be stacked thereover as the conductor 605b. The use of the combination of the materials can suppress diffusion of hydrogen into the oxide semiconductor 630 while conductivity of a wiring is ensured. A two-layer structure of the conductor 605a and the conductor 605b is illustrated in FIGS. 21A to 21C, but the structure of the conductor 605 is not limited thereto, and a single-layer structure or a stacked-layer structure of three or more layers may be used.

The insulators 620 and 624 are preferably insulators containing oxygen, such as a silicon oxide film or a silicon oxynitride film. In particular, the insulator 624 is preferably an insulator containing excess oxygen. In the case where such an insulator containing excess oxygen is provided in contact with an oxide in the transistor 600, oxygen vacancies in the oxide can be compensated. Note that the insulators 622 and 624 are not necessarily formed of the same material.

The insulator 622 preferably has a single-layer structure or a layered structure formed using an insulator containing silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 622 may have a stacked-layer structure of two or more layers. In this case, the stacked layers are not necessarily formed of the same material but may be formed of different materials.

In the case where the insulator 622 including a high-k material is provided between the insulator 620 and the insulator 624, the insulator 622 can be negatively charged. That is, the insulator 622 can function as a charge accumulation layer.

For example, in the case where the insulator 620 and the insulator 624 are formed using silicon oxide and the insulator 622 is formed using a material having a lot of electron trap states such as hafnium oxide, aluminum oxide, or tantalum oxide, the state where the potential of the conductor 605 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 600 to the conductor 605. At this time, some of the moving electrons are trapped by the electron trap states of the insulator 622.

In the transistor in which a necessary amount of electrons is trapped by the electron trap states of the insulator 622, Vth is shifted in the positive direction. By controlling the voltage of the conductor 605, the amount of electrons to be trapped can be controlled, and thus Vth can be controlled.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

Furthermore, Vth can be controlled by appropriate adjustment of the thicknesses of the insulator 620, the insulator 622, and the insulator 624. Alternatively, transistor having a low leakage current in an off state can be provided. The insulator 620, the insulator 622, and the insulator 624 are preferably thin, in which case, Vth can be easily controlled by the conductor 605. For example, each of the insulator 620, the insulator 622, and the insulator 624 has a thickness of 50 nm or less, preferably 30 nm or less, further preferably 10 nm or less, furthermore preferably 5 nm or less.

The oxide semiconductor 630*a*, the oxide semiconductor 630*b*, and the oxide semiconductor 630*c* are formed using metal oxide such as In-M-Zn oxide (M is Al, Ga, Y, or Sn). Alternatively, an In—Ga oxide or an In—Zn oxide may be used for the oxide semiconductor 630.

The conduction band minimum of each of the oxide semiconductors 630*a* and 630*c* is closer to the vacuum level than that of the oxide semiconductor 630*b*. Typically, a difference between the conduction band minimum of the oxide semiconductor 630*b* and the conduction band minimum of each of the oxide semiconductors 630*a* is preferably greater than or equal to 0.15 eV or greater than or equal to 0.5 eV, and less than or equal to 2 eV or less than or equal to 1 eV. That is, a difference in the electron affinity between each of the oxide semiconductors 630*a* and 630*c* and the oxide semiconductor 630*b* is preferably greater than or equal to 0.15 eV or greater than or equal to 0.5 eV and less than or equal to 2 eV or less than or equal to 1 eV.

The energy gap of the oxide semiconductor 630*b* is preferably greater than or equal to 2 eV, further preferably greater than or equal to 2.5 eV and less than or equal to 3.0 eV. Furthermore, the energy gap of each of the oxide semiconductors 630*a* and 630*c* is preferably greater than or equal to 2 eV, further preferably greater than or equal to 2.5 eV, and still further preferably greater than or equal to 2.7 eV and less than or equal to 3.5 eV. The energy gap of each of the oxide semiconductors 630*a* and 630*c* is preferably greater than that of the oxide semiconductor 630*b*. For example, a difference in the energy gap between the oxide semiconductors 630*a* and 630*b* is preferably greater than or equal to 0.15 eV or greater than or equal to 0.5 eV or greater than or equal to 1.0 eV and less than or equal to 2 eV or less than or equal to 1 eV.

The thickness of each of the oxide semiconductors 630*a*, 630*b* and 630*c* is greater than or equal to 3 nm and less than or equal to 200 nm, preferably greater than or equal to 3 nm and less than or equal to 100 nm, further preferably greater than or equal to 3 nm and less than or equal to 60 nm.

A decrease in the carrier density of the oxide semiconductor film can inhibit the negative shift of the threshold voltage of the transistor or reduce the off-state current of the transistor, which is preferable.

Examples of a factor affecting the carrier density of an oxide semiconductor include oxygen vacancy (Vo) and impurities in the oxide semiconductor. As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A state with a low impurity concentration and a low density of defect states is referred to as a highly purified intrinsic or substantially highly purified intrinsic state. A highly purified intrinsic or substantially highly purified intrinsic oxide semiconductor has few carrier generation sources, and thus can have a low carrier density.

A highly purified intrinsic or substantially highly purified intrinsic oxide semiconductor is preferably used as the oxide semiconductors 630*a* and 630*c*. For example, the carrier density of each of the oxide semiconductors 630*a* and 630*c* is lower than $8\times10^{15}$ cm$^{-3}$, preferably lower than $1\times10^{11}$ cm$^{-3}$, and further preferably lower than $1\times10^{10}$ cm$^{-3}$, and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the ID-VG characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has a slightly n-type conductivity; thus, it can be referred to as a "slightly-n" oxide semiconductor.

The carrier density of the oxide semiconductor 630*b* is preferably higher than that of the oxide semiconductors 630*a* and 630*c*. The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm–3 and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The density of defect states in a mixed layer formed at an interface between the oxide semiconductors 630*a* and 630*b* or an interface between the oxide semiconductors 630*b* and 630*c* is preferably made low.

Specifically, when the oxide semiconductors 630*a* and 630*b* or the oxide semiconductors 630*b* and 630*c* contain the same element (as a main component) in addition to oxygen, a mixed layer with a low density of defect states can be formed. For example, in the case where the oxide semiconductor 630*b* is an In—Ga—Zn oxide semiconductor, it is preferable to use an In—Ga—Zn oxide semiconductor, a Ga—Zn oxide semiconductor, gallium oxide, or the like as each of the oxide semiconductors 630*a* and 630*c*.

At this time, the oxide semiconductor 630*b* serves as a main carrier path. Since the density of defect states at the interface between the oxide semiconductor 630*a* and the oxide semiconductor 630*b* and the interface between the oxide semiconductor 630*b* and the oxide semiconductor 630*c* can be made low, the influence of interface scattering on carrier conduction is small, and a high on-state current can be obtained.

When an electron is trapped in a trap state, the trapped electron behaves like fixed charge; thus, Vth of a transistor is shifted in the positive direction. The oxide semiconductors 630a and 630c can make the trap state apart from the oxide semiconductor S2. This structure can prevent the positive Vth shift of the transistor.

A material whose conductivity is sufficiently lower than that of the oxide semiconductor 630b is used for the oxide semiconductor 630a and 630c. In that case, the oxide semiconductor 630b, the interface between the oxide semiconductors 630b and 630a, and the interface between the oxide semiconductors 630b and 630c mainly function as a channel region. For example, an oxide semiconductor with high insulation performance and the atomic ratio represented by the region C in FIG. 20C can be used as the oxide semiconductors 630a and 630c. Note that the region C in FIG. 20C represents the atomic ratio of [In]:[M]:[Zn]=0:1:0 or the vicinity thereof.

In the case where an oxide semiconductor with any of the atomic ratios represented by the region A in FIG. 20A is used as the oxide semiconductor 630b, it is particularly preferable to use an oxide semiconductor with [M]/[In] of greater than or equal to 1 and preferably greater than or equal to 2 as each of the oxide semiconductors 630a and 630c. In addition, an oxide semiconductor with sufficiently high insulation performance and [M]/([Zn]+[In]) of greater than or equal to 1 is suitable as the oxide semiconductor 230c.

The oxide semiconductor 630c has lower crystallinity than the oxide semiconductor 630b in some cases. The oxide semiconductor 630b preferably includes a CAAC-OS which is described later. When the crystallinity of the oxide semiconductor 630c is reduced, the oxide semiconductor 630c has higher oxygen permeability; thus, oxygen is easily supplied from the insulator positioned above the oxide semiconductor 630c to the oxide semiconductor 630b in some cases. Here, the oxide semiconductor 630c may be an amorphous oxide semiconductor or an amorphous-like oxide semiconductor (a-like OS) which is described later.

The oxide semiconductor 630a may contain a CAAC-OS. Furthermore, the oxide semiconductor 630a preferably has higher crystallinity than the oxide semiconductor 630c.

The insulator 650 may have a single-layer structure or a layered structure formed using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

As the insulator 650, like the insulator 624, an oxide insulator that contains oxygen in excess of the stoichiometric composition is preferably used. When such an insulator containing excess oxygen is provided in contact with the oxide semiconductor 630, oxygen vacancies in the oxide semiconductor 630 can be reduced.

As the insulator 650, an insulating film formed of aluminum oxide, aluminum oxynitride, hafnium oxide, hafnium oxynitride, silicon nitride, or the like, which has barrier properties against oxygen and hydrogen, can be used. The insulator formed of such a material functions as a layer that prevents release of oxygen from the oxide semiconductor 630 or entry of impurities such as hydrogen from the outside.

Note that the insulator 650 may have a stacked-layer structure similar to that of the insulator 620, the insulator 622, and the insulator 624. When the insulator 650 includes an insulator in which a necessary amount of electrons is trapped by electron trap states, Vth of the transistor 600 can be shifted in the positive direction. The transistor 600 having the structure is a normally-off transistor that is in a non-conduction state (also referred to as an off state) even when the gate voltage is 0 V.

In addition to the insulator 650, a barrier film may be provided between the oxide semiconductor 630 and the conductor 660 in the semiconductor device illustrated in FIGS. 21A to 21C. Alternatively, the oxide semiconductor 630c may have a barrier property.

For example, an insulating film containing excess oxygen is provided in contact with the oxide semiconductor 630 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide semiconductor 630.

One of the conductor 640a and the conductor 640b functions as a source electrode and the other functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 640a, and 640b. Although a single-layer structure is illustrated in the drawings, a stacked-layer structure of two or more layers may be used.

For example, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

Conductors 660 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

A two-layer structure where a titanium film is stacked over an aluminum film may be employed, for example. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

The conductor 660 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 660 can have a stacked structure using the above light-transmitting conductive material and the above metal.

When a conductive material having a high work function is used for the conductor 660, $V_{th}$ of the transistor 600 can be increased and the cutoff current of the transistor 600 can be reduced. The work function of a conductive material used for the conductor 660 is preferably greater than or equal to 4.8 eV, further preferably greater than or equal to 5.0 eV, still further preferably greater than or equal to 5.2 eV, yet still further preferably greater than or equal to 5.4 eV, and yet still further preferably greater than or equal to 5.6 eV. Examples of a conductive material having a high work function include molybdenum, molybdenum oxide, platinum (Pt), platinum (Pt) silicide, nickel (Ni) silicide, indium tin oxide, and In—Ga—Zn oxide to which nitrogen is added.

The insulator 680 is provided over the transistor 600. The insulator 680 preferably contains excess oxygen. In particular, when an insulator containing excess oxygen is provided as an interlayer film or the like in the vicinity of the transistor 200, oxygen vacancies in the transistor 200 are reduced, whereby the reliability can be improved.

As the insulator containing excess oxygen, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^{-3}$, preferably greater than or equal to $3.0 \times 10^{20}$ atoms/cm$^{-3}$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 680 covering the transistor 600 may function as a planarization film that covers a roughness thereunder.

<Structural Example 2 of Transistor>

Figure 22A:
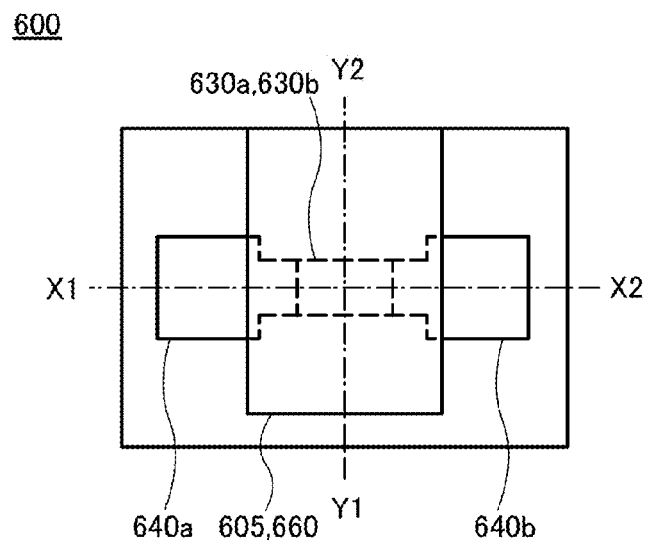
FIGS. 22A to 22C each illustrate a structure example of a transistor.
Figure 22B:
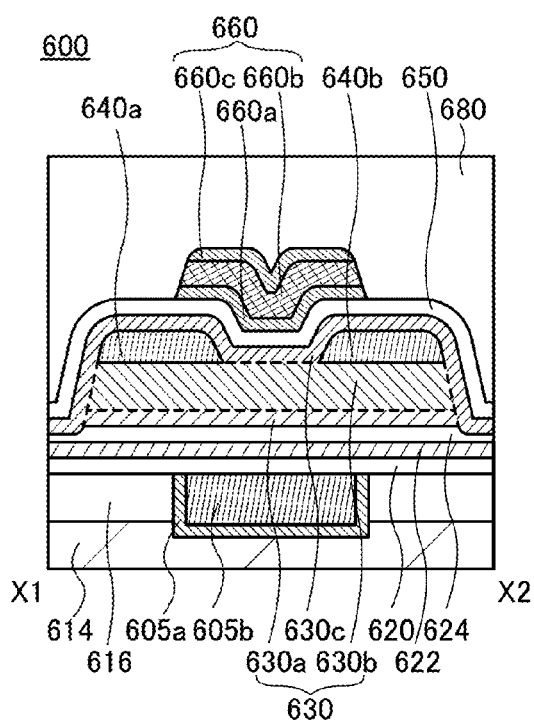
Figure 22C:
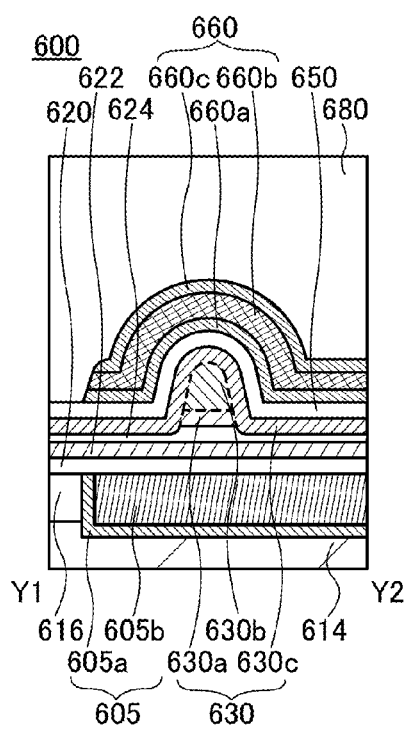

FIGS. 22A to 22C illustrate an example of a structure that can be used for the transistor 600. FIG. 22A illustrates a top surface of the transistor 600. Some films are omitted in FIG. 22A for simplification of the drawing. FIG. 22B is a cross-sectional view along the dashed-dotted line X1-X2 in FIG. 22A. FIG. 22C is a cross-sectional view along the dashed-dotted line Y1-Y2 in FIG. 22A.

Note that in the transistor 600 in each of FIGS. 22A to 22C, components having the same function as the components in the transistor 600 in FIGS. 21A to 21C are denoted by the same reference numerals.

In the structure illustrated in FIGS. 22A to 22C, the conductor 660 functioning as a gate electrode includes a conductor 660a, a conductor 660b, and a conductor 660c.

The conductor 660a is formed by a thermal CVD method, an MOCVD method, or an atomic layer deposition (ALD) method. In particular, the conductor 660a is preferably formed by atomic layer deposition (ALD). The use of an ALD method or the like can reduce plasma damage to the insulator 650. Furthermore, it is preferable to form the insulator 650 by an ALD method or the like, because coverage can be improved. Accordingly, a highly reliable transistor 600 can be provided.

The conductor 660b is formed using a material having high conductivity, such as tantalum, tungsten, copper, or aluminum. Furthermore, the conductor 660c formed over the conductor 660b is preferably formed using a conductor that is not easily oxidized, such as tungsten nitride. In the case where the insulator 680 is formed using an oxide material from which oxygen is released, the conductor 660 can be prevented from being oxidized by the released oxygen.

Thus, the oxidation of the conductor 660 can be prevented, and oxygen released from the insulator 680 can be supplied to the oxide semiconductor 630 efficiently.

A conductor that is not easily oxidized is used for the conductor 660c having a large contact area with the insulator 680 including excess oxygen, whereby excess oxygen in the insulator 680 can be prevented from being absorbed into the conductor 660. Furthermore, a conductor that has high conductivity is used for the conductor 660b, whereby the transistor 600 with low power consumption can be provided.

<Structural Example 3 of Transistor>

FIGS. 23A to 23C illustrate an example of a structure that can be used for the transistor 600. FIG. 23A illustrates a top surface of the transistor 600. Some films are omitted in FIG. 23A for simplification of the drawing. FIG. 23B is a cross-sectional view along the dashed-dotted line X1-X2 in FIG. 22A. FIG. 22C is a cross-sectional view along the dashed-dotted line Y1-Y2 in FIG. 22A.

Note that in the transistor 600 in each of FIGS. 23A to 23C, components having the same function as the components in the transistor 600 in FIGS. 21A to 21C are denoted by the same reference numerals.

In the structure illustrated in FIGS. 23A to 23C, the conductor 660 functioning as a gate has a stacked-layer structure of a conductor 660a and the conductor 660b. An insulator 670 is formed over the conductor 660 functioning as the gate electrode.

The conductor 660a is formed by a thermal CVD method, an MOCVD method, or an atomic layer deposition (ALD) method. In particular, the conductor 660a is preferably formed by an ALD method. The use of an ALD method or the like can reduce plasma damage to the insulator 650. Furthermore, it is preferable to form the insulator 650 by an ALD method or the like, because coverage can be improved. Accordingly, a highly reliable transistor 600 can be provided.

The conductor 660b is formed using a material having high conductivity, such as tantalum, tungsten, copper, or aluminum.

The insulator 670 is provided to cover the conductor 660. In the case where the insulator 680 is formed using an oxide material from which oxygen is released, the insulator 670 is formed using a substance with a barrier property against oxygen to prevent the conductor 660 from being oxidized by the released oxygen.

For example, the insulator 670 can be formed using metal oxide such as aluminum oxide. The insulator 670 is formed to a thickness with which the oxidation of the conductor 660 is prevented. For example, the thickness of the insulator 670 is set greater than or equal to 1 nm and less than or equal to 10 nm, preferably greater than or equal to 3 nm and less than or equal to 7 nm.

Thus, the oxidation of the conductor 660 can be prevented, and oxygen released from the insulator 680 can be supplied to the oxide semiconductor 630 efficiently.

<Structural Example 4 of Transistor>

FIGS. 24A to 24C illustrate an example of a structure that can be used for the transistor 600. FIG. 24A illustrates a top surface of a transistor 600. For simplification of the figure, some films are omitted in FIG. 24A. FIG. 24B is a cross-sectional view taken along a dashed-dotted line X1-X2 in FIG. 24A, and FIG. 24C is a cross-sectional view taken along a dashed-dotted line Y1-Y2 in FIG. 24A.

Note that in the transistor 600 in each of FIGS. 24A to 24C, components having the same function as the components in the transistor 600 in FIGS. 21A to 21C are denoted by the same reference numerals.

In the structure illustrated in FIGS. 24A to 24C, conductors serving as a source and a drain has a stacked structure. The conductors 640*a* and 640*b* are preferably formed using a conductor having high adhesion to the oxide semiconductor 630*b*, and conductors 641*a* and 641*b* are preferably formed using a material having high conductivity. The conductors 640*a* and 640*b* are preferably formed by an ALD method. When the conductors 640*a* and 640*b* are formed by an ALD method or the like, coverage can be improved.

For example, in the case where metal oxide containing indium is used for the oxide semiconductor 630*b*, titanium nitride or the like is used for the conductors 640*a* and 640*b*. Furthermore, the conductors 641*a* and 641*b* are formed using a material having high conductivity such as tantalum, tungsten, copper, or aluminum, so that the transistor 600 with high reliability and low power consumption can be provided.

As illustrated in FIG. 24C, the oxide semiconductor 630*b* is covered with the conductor 660 in the channel width direction of the transistor 600. By the existence of a projection of the insulator 624, the side surfaces of the oxide semiconductor 630*b* can be covered with the conductor 660. For example, it is preferable that at the side surfaces of the oxide semiconductor 630*b*, the bottom surface of the conductor 660 be positioned closer to a substrate than the bottom surface of the oxide semiconductor 630*b* by adjusting the shape of the projection of the insulator 624. That is, the transistor 600 has a structure in which the oxide semiconductor 630*b* can be electrically surrounded by an electric field of the conductors 605 and 660. As described above, a structure in which the oxide semiconductor 630*b* is electrically surrounded by an electric field of a conductor is referred to as a surrounded channel (s-channel) structure. In the s-channel structure of the transistor 600, a channel can be formed in the whole (bulk) of the oxide semiconductor 630*b*. In the s-channel structure, the drain current of the transistor is increased, so that a larger amount of on-state current (current which flows between the source and the drain when the transistor is on) can be obtained. Furthermore, the entire channel formation region of the oxide semiconductor 630*b* can be depleted by the electric field of the conductor 605 and the conductor 660. Accordingly, the off-state current of the s-channel transistor can be further reduced. When the channel width is shortened, the effects of the s-channel structure, such as an increase in on-state current and a reduction in off-state current, can be enhanced.

<Structural Example 5 of Transistor>

Figure 25A:
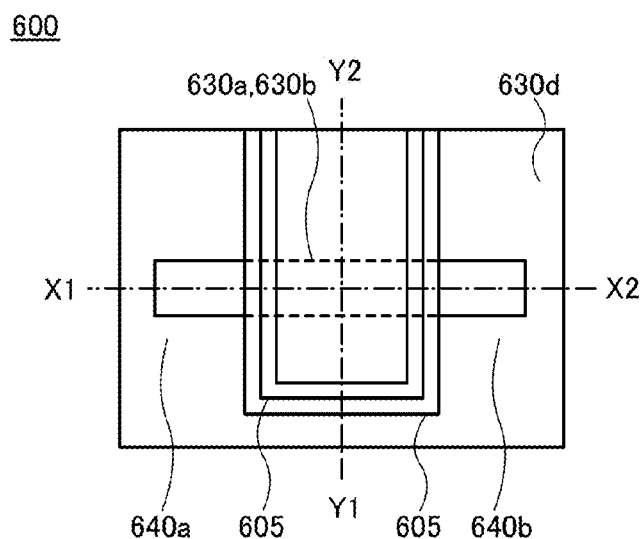
FIGS. 25A to 25C each illustrate a structure example of a transistor.
Figure 25B:
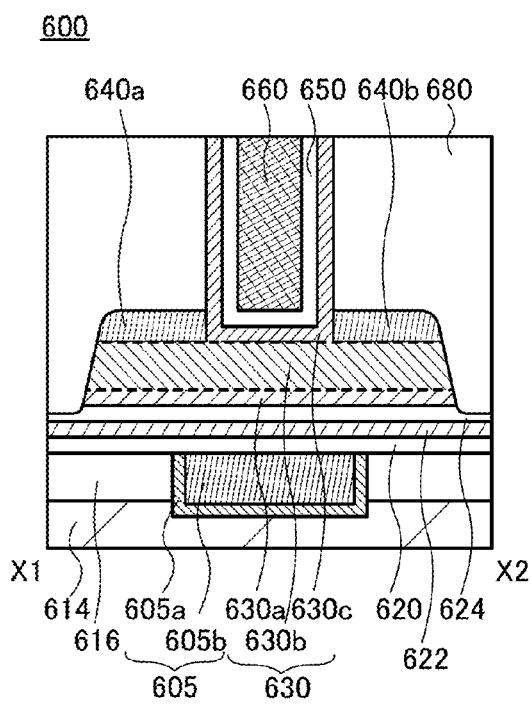
Figure 25C:
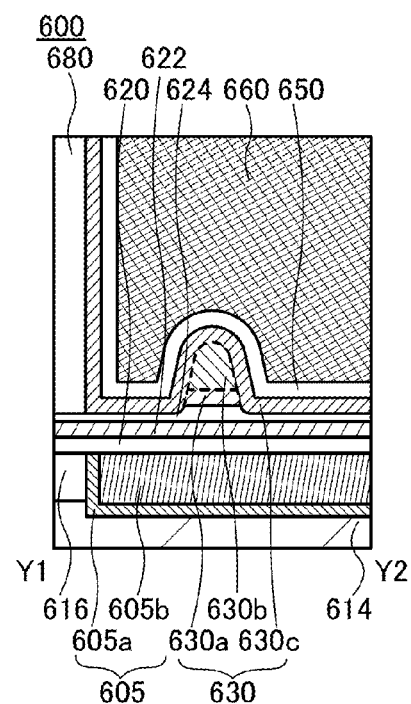

FIGS. 25A to 25C illustrate an example of a structure that can be used for the transistor 600. FIG. 25A illustrates a top surface of the transistor 600. For simplification of the drawing, some films are not illustrated in FIG. 25A. FIG. 25B is a cross-sectional view taken along a dashed-dotted line X1-X2 in FIG. 25A, and FIG. 25C is a cross-sectional view taken along a dashed-dotted line Y1-Y2.

Note that in the transistor 600 in each of FIGS. 25A to 25C, components having the same function as the components in the transistor 100 in FIGS. 21A to 21C are denoted by the same reference numerals.

In the structure illustrated in FIGS. 25A to 25C, the oxide semiconductor 630*c*, the insulator 650, and the conductor 660 are formed in an opening formed in the insulator 680.

Since the transistor 600 illustrated in FIGS. 25A to 25C has a structure in which the conductor 660 hardly overlaps the conductors 640*a* and 640*b*, the parasitic capacitance added to the conductor 660 can be reduced. Thus, the transistor 600 with a high operation frequency can be provided.

<Structural Example 6 of Transistor>

Figure 26A:
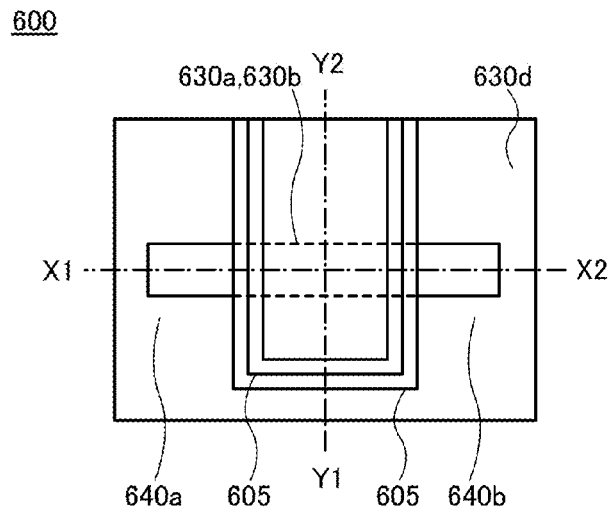
FIGS. 26A to 26C each illustrate a structure example of a transistor.
Figure 26B:
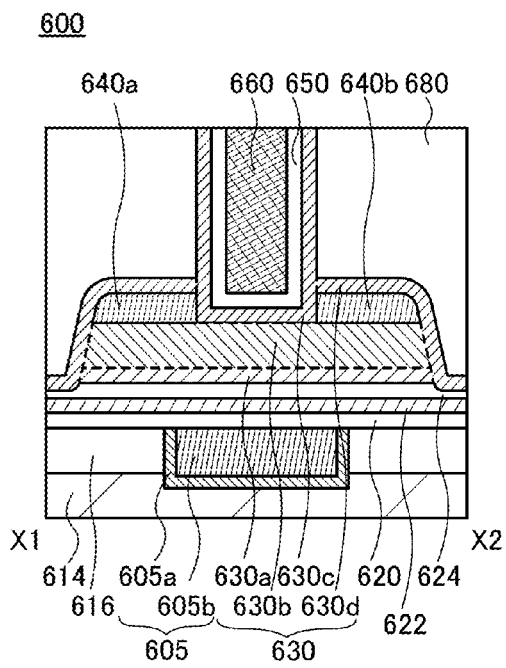
Figure 26C:
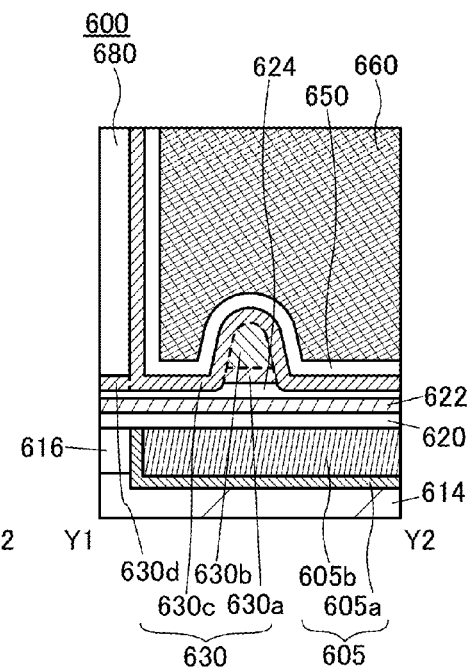

FIGS. 26A to 26C illustrate an example of a structure that can be used for the transistor 600. FIG. 26A illustrates a top surface of the transistor 600. For simplification of the drawing, some films are not illustrated in FIG. 26A. FIG. 26B is a cross-sectional view taken along a dashed-dotted line X1-X2 in FIG. 26A, and FIG. 26C is a cross-sectional view taken along a dashed-dotted line Y1-Y2.

Note that in the transistor 600 in each of FIGS. 26A to 26C, components having the same function as the components in the transistor 600 in FIGS. 21A to 21C are denoted by the same reference numerals.

Note that in the transistor 600 in FIGS. 26A to 26C, components having the same function as the components in the transistor 600 in FIGS. 26A to 26C are denoted by the same reference numerals.

Since the transistor 600 illustrated in FIGS. 26A to 26C has a structure in which the conductor 660 hardly overlaps the conductors 640*a* and 640*b*, the parasitic capacitance added to the conductor 660 can be reduced. Thus, the transistor 600 with a high operation frequency can be provided.

The oxide semiconductor 630*b* is in contact with the insulator 680 including excess oxygen with an oxide semiconductor 630*d* provided therebetween. Therefore, generation of a shallow level in the vicinity of the channel formed in the oxide semiconductor 630*b* is inhibited more than in the case where the oxide semiconductor 630*b* is directly in contact with the insulator 680 as in FIGS. 25A to 25C; thus, a semiconductor device with high reliability can be provided.

This embodiment can be combined with any of the other embodiments as appropriate.

(Embodiment 7)

In this embodiment, a structure of an oxide semiconductor that can be used for the OS transistor is described.

In the following description, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°. In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31°. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), a peak is not clearly observed. In contrast, in the case where single crystal $InGaZnO_4$ is subjected to φ scan with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern including a spot derived from the (009) plane of the $InGaZnO_4$ crystal appears. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. It is found that the a-axes and b-axes of the pellets included in the CAAC-OS do not have regular orientation.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

From the high-resolution TEM image, pellets in which metal atoms are arranged in a layered manner can be observed. The size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

The pellet having a hexagonal shape is observed. Note that the shape of the pellet is not always a regular hexagon but is a non-regular hexagon in many cases.

A clear crystal grain boundary cannot be observed in the CAAC-OS. In the CAAC-OS, a lattice arrangement is distorted so that formation of a crystal grain boundary is inhibited. This is probably because the CAAC-OS can tolerate distortion owing to a low density of arrangement of oxygen atoms in the a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has reduced impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) is observed. When an electron beam with a probe diameter of 1 nm is incident on the same sample, a plurality of spots are observed in the ring-shaped region. In other words, ordering in an nc-OS is not observed with an electron beam with a probe diameter of 50 nm but is observed with an electron beam with a probe diameter of 1 nm.

When an electron beam with a probe diameter of 1 nm is incident on a region with a thickness of less than 10 nm, an electron diffraction pattern in which spots are arranged in an approximately regular hexagonal shape is observed in some cases. This means that an nc-OS has a well-ordered region, i.e., a crystal, in the range of less than 10 nm in thickness. Note that an electron diffraction pattern having regularity is not observed in some regions because crystals are aligned in various directions.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

The a-like OS contains a void and thus has an unstable structure.

Growth of the crystal part in the a-like OS might be induced by electron irradiation, for example. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a specific composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

This embodiment can be combined with any of the other embodiments as appropriate.

(Embodiment 8)

In this embodiment, an example in which the semiconductor device described in the above embodiment is applied to a frame memory included in a driver IC (integrated circuit) is described with reference to FIG. 27.

Figure 27:
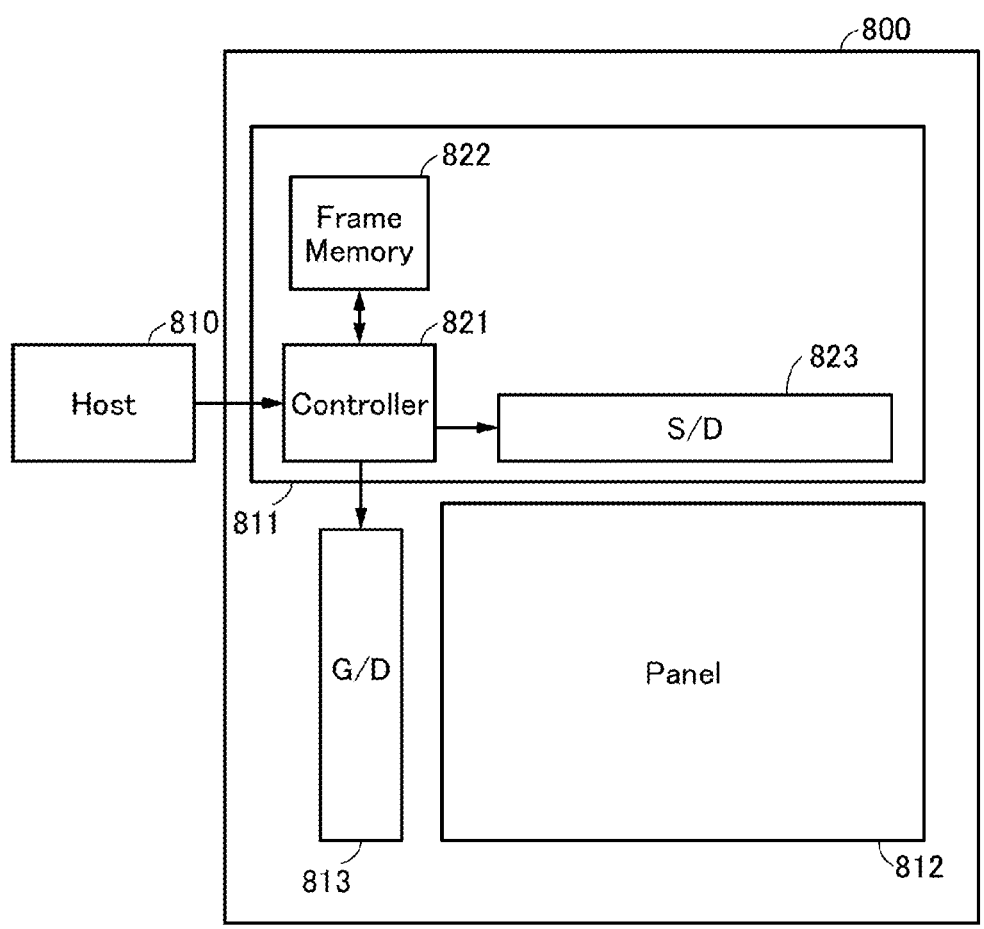
FIG. 27 is a block diagram of a display device.

FIG. 27 is a block diagram of a display device that includes a driver IC. A display device 800 includes a driver IC 811, a display panel 812, and a gate driver 813. The driver IC 811 includes a controller 821, a frame memory 822, and a source driver 823.

Image data are input from an external host controller 810 to the controller 821. The image data are stored in the frame memory 822. Since the IC 811 includes the frame memory 822, a control signal can be output to the source driver 823 and the gate driver 813 even when the exchange of image data between the host controller 810 and the controller 821 is stopped, whereby an image can be displayed on the display panel 812.

The semiconductor device described in the above embodiment and the like can be provided in the frame memory 822. A memory cell of the frame memory 822 can be constituted of one transistor and one capacitor (this structure is also known as a 1T1C structure), thus reducing area per memory cell.

This configuration is especially effective for a case where the image data to be retained in the frame memory 822 increases. Compared with the case where the memory cells in the frame memory are constituted of static RAM (SRAM), the 1T1C memory cell structure can prevent the increase of circuit area.

In addition, the OS transistor can be used as a transistor included in the memory cell of the frame memory 822. When the OS transistor is used in the memory cell, the memory cell can take a configuration in which a charge is retained at the gate terminal of a Si transistor by electrically connecting one of a source and a drain of the OS transistor to a gate terminal of the Si transistor. By using this configuration, a nonvolatile memory that is different from the 1T1C memory cell can be embedded in the frame memory 822, thus easily enabling decoding of the image data that are input from the host controller 810.

This configuration is especially effective for a case where the image data to be retained in the frame memory 822 increases. When the memory cell of the frame memory is constituted from dynamic RAM (DRAM), a nonvolatile memory needs to be embedded separately; however, this complicates the fabrication process and increases the manufacturing cost. By employing a configuration where a nonvolatile memory using an OS transistor is embedded in the frame memory 822, the image data can be compressed and decoded without increasing the manufacturing cost.

Note that the gate driver 813 is positioned outside the driver IC 811 in FIG. 27, but the position of the gate driver 813 is not limited thereto, and the gate driver 813 may be positioned inside the driver IC 811. Similarly, the source driver 823 is positioned to be outside of the driver IC 811 in FIG. 27, but the position of the source driver 823 is not limited thereto, and the source driver 823 may be positioned inside the driver IC 811.

This embodiment can be combined with any of the other embodiments as appropriate.

(Embodiment 9)

In this embodiment, application examples of the semiconductor device or memory device described in the foregoing embodiment to an electronic component and to an electronic device including the electronic component will be described with reference to FIGS. 28A and 28B, FIGS. 29A and 29B, FIGS. 30A, 30B, and 30C, and FIGS. 31A, 31B, 31C, 31D, and 31E.

<Wafer and Chips>

Figure 28A:
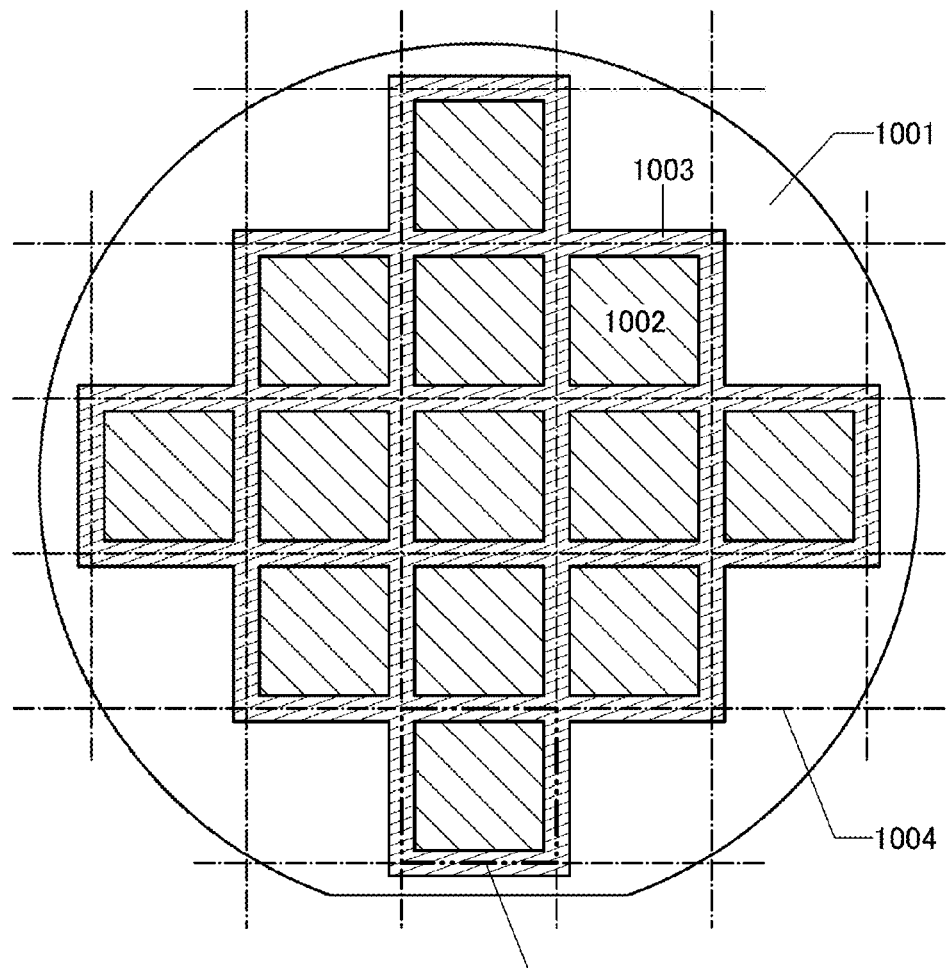
FIGS. 28A and 28B are top views of a semiconductor wafer.

FIG. 28A is a top view illustrating a substrate 1001 before dicing treatment. As the substrate 1001, a semiconductor substrate (also referred to as a "semiconductor wafer") can be used, for example. The substrate 1001 has a plurality of circuit regions 1002. The semiconductor device or the like described in any of the above embodiments can be provided in the circuit regions 1002.

Figure 28B:
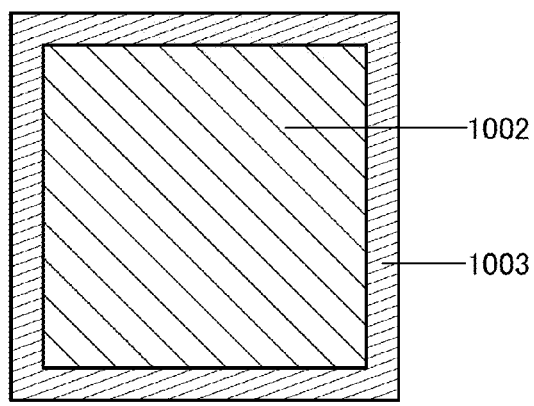

The plurality of circuit regions 1002 are each surrounded by a separation region 7104. Separation lines (also referred to as "dicing lines") 1004 are set at a position overlapping with the separation regions 1003. The substrate 1001 can be cut along the separation lines 1004 into chips 1005 including the circuit regions 1002. FIG. 28B is an enlarged view of the chip 1005.

A conductive layer or a semiconductor layer may be provided in the separation regions 1003. Providing a conductive layer or a semiconductor layer in the separation regions 1003 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 1003 allows a reduction in the usage of the pure water. Therefore, the cost of manufacturing semiconductor devices can be reduced. Thus, semiconductor devices can be manufactured with improved productivity.

For a semiconductor layer provided in the separation regions 1003, a material whose band gap is greater than or equal to 2.5 eV and less than or equal to 4.2 eV, preferably greater than or equal to 2.7 eV and less than or equal to 3.5 eV is preferably used. The use of such a material allows accumulated charge to be released slowly; thus, the rapid move of charge due to ESD can be suppressed and electrostatic breakdown is less likely to occur.

<Electronic Component>

Figure 29A:
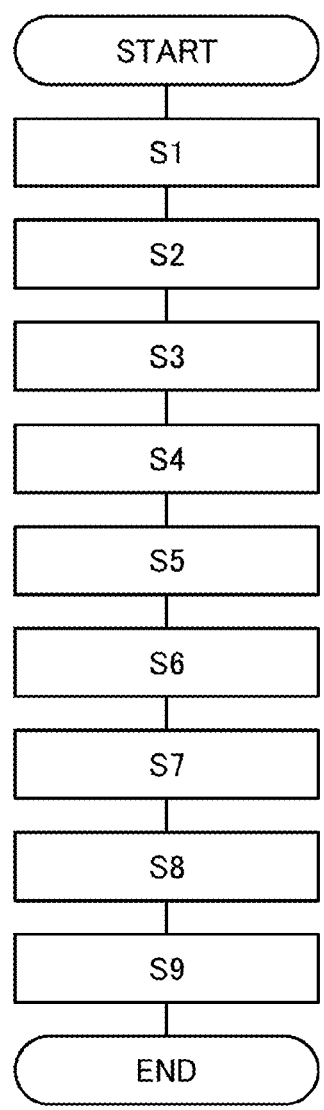
FIGS. 29A and 29B are a flow chart illustrating the fabrication process of an electronic component, and a perspective view of the electronic component.
Figure 29B:
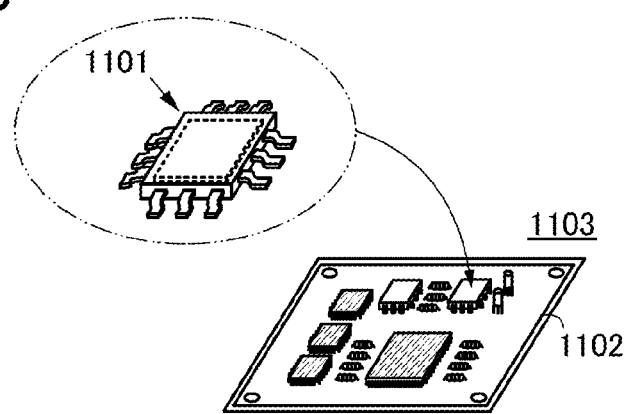

FIGS. 29A and 29B show an example where the chip 1005 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process will be described with reference to a flow chart in FIG. 29A. After an element substrate including the semiconductor device described in any of the above embodiments is completed in a pre-process, a back surface grinding step in which a back surface (a surface where a semiconductor device and the like are not formed) of the element substrate is ground is performed (Step S1). When the element substrate is thinned by grinding, warpage or the like of the element substrate is reduced, so that the size of the electronic component can be reduced.

Next, the element substrate is divided into a plurality of chips in a dicing step (Step S2). Then, the divided chips are separately picked up to be bonded to a lead frame in a die bonding step (Step S3). To bond a chip and a lead frame in the die bonding step, a method such as resin bonding or tape-automated bonding is selected as appropriate depending on products. Note that the chip may be bonded to an interposer instead of the lead frame.

Next, a wire bonding step for electrically connecting a lead of the lead frame and an electrode on the chip through a metal wire is performed (Step S4). A silver line or a gold line can be used as the metal wire. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, so that a circuit portion incorporated in the chip and wire for connecting the chip to the lead can be protected from external mechanical force, and deterioration of characteristics (decrease in reliability) due to moisture or dust can be reduced.

Subsequently, the lead of the lead frame is plated in a lead plating step (Step S6). This plating process prevents rust of the lead and facilitates soldering at the time of providing the chip on a printed circuit board in a later step. Then, the lead is cut and processed in a formation step (Step S7).

Next, a printing (marking) step is performed on a surface of the package (Step S8). After a testing step (Step S9) for checking whether an external shape is good and whether there is malfunction, for example, the electronic component is completed.

FIG. 29B is a schematic perspective diagram of a completed electronic component. FIG. 29B shows a schematic perspective diagram of a quad flat package (QFP) as an example of the electronic component. An electronic component 1101 in FIG. 29B includes a lead 655 and a semiconductor device 653. As the semiconductor device 653, the semiconductor device described in any of the above embodiments can be used.

The electronic component 1101 in FIG. 29B is, for example, mounted on a printed circuit board 1102. A plurality of electronic components 1101 are used in combination and electrically connected to each other over the printed circuit board 1102; thus, a substrate 1103 on which the electronic components are mounted is completed. The completed substrate 1103 is provided in an electronic device or the like.

<Electronic Device>

The substrate 1103 described above can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multi-function printers, automated teller machines (ATM), vending machines, and consumer electronics.

Configuration examples of an electronic device are described below with reference to FIGS. 30A, 30B, and 30C, and FIGS. 31A, 31B, 31C, 31D, and 31E. Note that a touch panel device including a touch sensor is preferably used for a display portion of each of the electronic devices. With the touch panel device, the display portion can also function as an input portion of the electronic device.

Figure 30A:
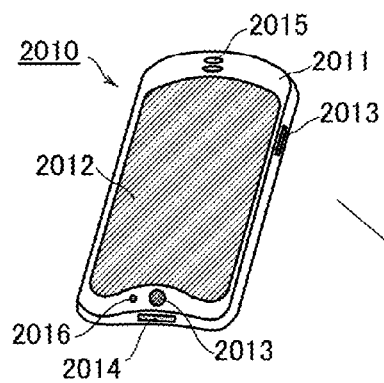
FIGS. 30A to 30C each illustrate a configuration example of an electronic device.

An information terminal 2010 illustrated in FIG. 30A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various kinds of operation such as making a call, inputting letters, and switching screen images on the display portion 2012 can be performed by touching the display portion 2012 with a finger or the like. The information terminal 2010 can be operated by inputting sound from the microphone 2016. Moreover, a variety of operations such as power on/off operation and screen switching of the display portion 2012 can be performed by pressing the operation button 2013.

Figure 30B:
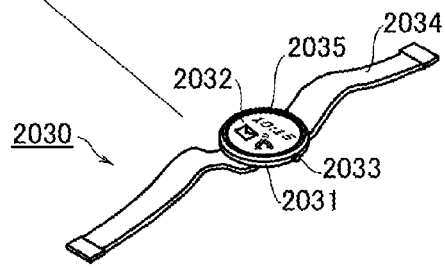

FIG. 30B illustrates an example of a watch-type information terminal. An information terminal 2030 includes a housing 2031, a display portion 2032, a winding crown 2033, a belt 2034, and a sensor portion 2035. The information terminal 2030 can be operated by rotating the winding crown 2033. The information terminal 2030 can be operated by touching the display portion 2032 with a finger.

The sensor portion 2035 has a function of obtaining information on usage environment and biological information, for example. The sensor portion 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a radio signal 2020. When the information terminal 2010 receives an incoming e-mail or call, for example, information notifying the incoming e-mail or call is displayed on the display portion 2032 of the information terminal 2030.

Figure 30C:
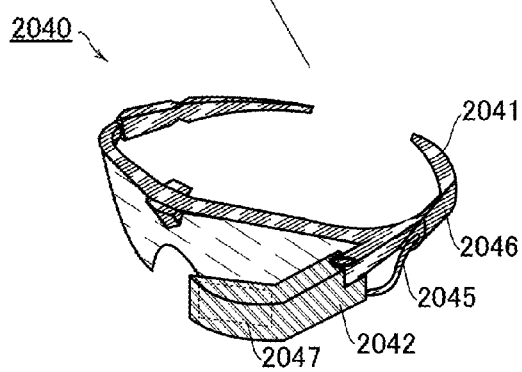

FIG. 30C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components. Power is supplied from the battery 2046 to the display portion 2047 and the electronic components in the housing 2042 through the cable 2045. A variety of information such as an image or the like transmitted wirelessly is displayed on the display portion 2047.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 31A:
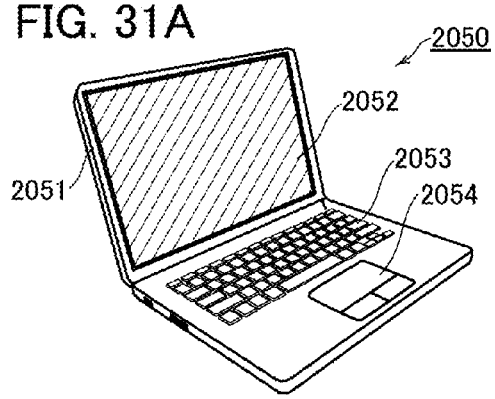
FIGS. 31A to 31E each illustrate a configuration example of an electronic device.

A notebook PC 2050 in FIG. 31A includes a housing 2051, a display portion 2052, a keyboard 2053, and a pointing device 2054. The notebook PC 2050 can be operated by touch operation on the display portion 2052.

Figure 31B:
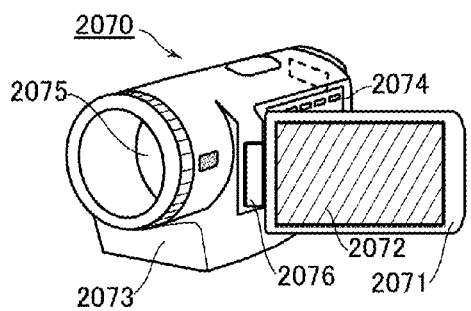

A video camera 2070 in FIG. 31B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. A variety of operations such as start and stop of recording, zoom adjustment, and change of shooting range can be executed by touch operation on the display portion 2072.

Figure 31C:
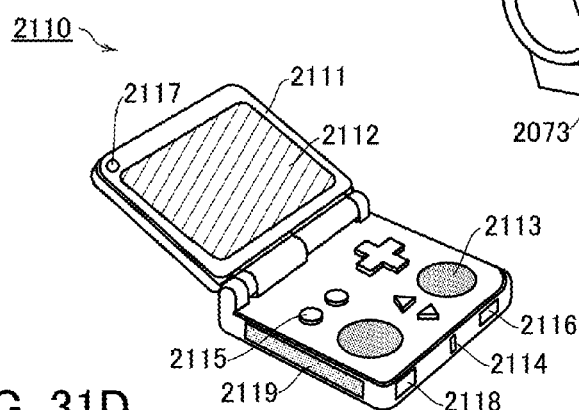

A portable game machine 2110 in FIG. 31C includes a housing 2111, a display portion 2112, speakers 2113, an LED lamp 2114, operation key buttons 2115, a connection terminal 2116, a camera 2117, a microphone 2118, and a recording medium read portion 2119.

Figure 31D:
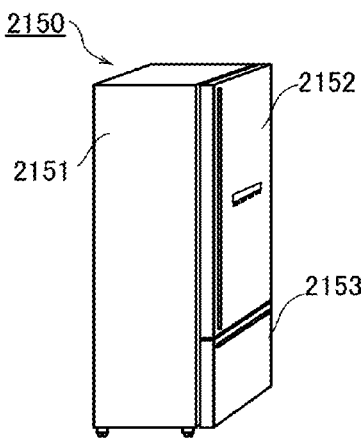

An electric refrigerator-freezer 2150 in FIG. 31D includes a housing 2151, a refrigerator door 2152, a freezer door 2153, and the like.

Figure 31E:
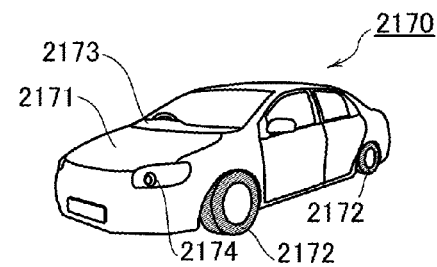

A motor vehicle 2170 in FIG. 31E includes a car body 2171, wheels 2172, a dashboard 2173, lights 2174, and the like. The processor in Embodiment 2 is used as each of processors in the motor vehicle 2170.

This embodiment can be combined with any of the other embodiments as appropriate.

This application is based on Japanese Patent Application serial No. 2016-055307 filed with Japan Patent Office on Mar. 18, 2016 and Japanese Patent Application serial No. 2016-062369, filed with Japan Patent Office on Mar. 25, 2016, the entire contents of which are hereby incorporated by reference.

What is claimed is:

1. A semiconductor device comprising:
a memory portion; and
a control circuit,
wherein the memory portion comprises a plurality of memory circuits,
wherein each of the plurality of memory circuits comprises a memory cell and a wiring,
wherein the memory cell is electrically connected to the wiring,
wherein the control circuit is supplied with a first signal that indicates the amount of data to be written to the memory portion or the amount of data to be read from the memory portion, and
wherein the control circuit is configured to control the number of the plurality of memory circuits to which a second signal for selecting the memory cell is simultaneously supplied on the basis of the first signal.

2. The semiconductor device according to claim 1, wherein the control circuit is supplied with an address signal, and
wherein the second signal is generated on the basis of the first signal and the address signal.

3. A driver IC comprising:
a frame memory comprising the semiconductor device according to claim 1;
a controller; and
a source driver.

4. A computer comprising:
the semiconductor device according to claim 1;
an input device;
an output device; and
a CPU.

5. An electronic device comprising:
the semiconductor device according to claim 1; and
at least one of a display portion, a microphone, a speaker, and a control key.

6. A semiconductor device comprising:
a memory portion; and
a control circuit,
wherein the memory portion comprises a plurality of memory circuits,
wherein each of the plurality of memory circuits comprises a memory cell, a first wiring, a second wiring and an amplifier circuit,
wherein the memory cell is electrically connected to the first wiring and the second wiring,
wherein the amplifier circuit is electrically connected to the second wiring,
wherein the control circuit is supplied with a first signal that indicates the amount of data to be written to the memory portion or the amount of data to be read from the memory portion,
wherein the control circuit is configured to control the number of the plurality of memory circuits to which a second signal for selecting the memory cell is simultaneously supplied on the basis of the first signal, and
wherein the control circuit is configured to control the number of the plurality of memory circuits to which a third signal for operating the amplifier circuit is simultaneously supplied on the basis of the first signal.

7. The semiconductor device according to claim 6,
wherein the amplifier circuit is configured to temporarily retain data that have been read from the memory cell.

8. The semiconductor device according to claim 6,
wherein the memory cell comprises a transistor,
wherein the transistor comprises an oxide semiconductor in a channel formation region, and
wherein the memory cell is stacked over the amplifier circuit.

9. The semiconductor device according to claim 6,
wherein the control circuit is supplied with an address signal, and
wherein the second signal is generated on the basis of the first signal and the address signal.

10. A driver IC comprising:
a frame memory comprising the semiconductor device according to claim 6;
a controller; and
a source driver.

11. A computer comprising:
the semiconductor device according to claim 6;
an input device;
an output device; and
a CPU.

12. An electronic device comprising:
the semiconductor device according to claim 6; and at least one of a display portion, a microphone, a speaker, and a control key.

13. A semiconductor device comprising:
a memory portion; and
a control circuit,
wherein the memory portion comprises a plurality of memory circuits,
wherein each of the plurality of memory circuits comprises a memory cell, a first wiring, a second wiring and an amplifier circuit,
wherein the memory cell is electrically connected to the first wiring and the second wiring,
wherein the amplifier circuit is electrically connected to the second wiring,
wherein the control circuit is supplied with a first signal that indicates the number of the plurality of memory circuits to be selected,
wherein the control circuit is configured to control the number of the plurality of memory circuits to which a second signal for selecting the memory cell is simultaneously supplied on the basis of the first signal, and
wherein the control circuit is configured to control the number of the plurality of memory circuits to which a third signal for operating the amplifier circuit is simultaneously supplied on the basis of the first signal.

14. The semiconductor device according to claim 13, wherein the amplifier circuit is configured to temporarily retain data that have been read from the memory cell.

15. The semiconductor device according to claim 13,
wherein the memory cell comprises a transistor,
wherein the transistor comprises an oxide semiconductor in a channel formation region, and
wherein the memory cell is stacked over the amplifier circuit.

16. The semiconductor device according to claim 13,
wherein the control circuit is supplied with an address signal, and
wherein the second signal is generated on the basis of the first signal and the address signal.

17. A driver IC comprising:
a frame memory comprising the semiconductor device according to claim 13;
a controller; and
a source driver.

18. A computer comprising:
the semiconductor device according to claim 13;
an input device;
an output device; and
a CPU.

19. An electronic device comprising:
the semiconductor device according to claim 13; and
at least one of a display portion, a microphone, a speaker, and a control key.

* * * * *